(12) United States Patent
Tobita

(10) Patent No.: US 7,436,923 B2
(45) Date of Patent: Oct. 14, 2008

(54) SHIFT REGISTER CIRCUIT AND IMAGE DISPLAY APPARATUS CONTAINING THE SAME

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/937,791

(22) Filed: Nov. 9, 2007

(65) Prior Publication Data

US 2008/0219401 A1 Sep. 11, 2008

(30) Foreign Application Priority Data

Mar. 5, 2007 (JP) ............................. 2007-053991

(51) Int. Cl.
*G11C 19/00* (2006.01)

(52) U.S. Cl. ......................................... 377/64; 377/79

(58) Field of Classification Search ........................ None
See application file for complete search history.

(56) References Cited

U.S. PATENT DOCUMENTS

| 3,573,490 | A |   | 4/1971 | Sevin, Jr. et al. |   |
|---|---|---|---|---|---|
| 4,063,119 | A |   | 12/1977 | Odell et al. |   |
| 5,434,899 | A | * | 7/1995 | Huq et al. | 377/78 |
| 5,859,630 | A | * | 1/1999 | Huq | 345/100 |
| 5,949,398 | A | * | 9/1999 | Kim | 345/100 |
| 6,064,713 | A |   | 5/2000 | Lebrun et al. |   |
| 7,120,221 | B2 | * | 10/2006 | Moon | 377/64 |
| 7,173,676 | B2 | * | 2/2007 | Jeon et al. | 349/48 |
| 7,289,096 | B2 | * | 10/2007 | Jeon et al. | 345/100 |
| 7,310,402 | B2 | * | 12/2007 | Wei et al. | 377/64 |
| 7,342,568 | B2 | * | 3/2008 | Wei et al. | 345/100 |
| 7,369,111 | B2 | * | 5/2008 | Jeon et al. | 345/100 |

(Continued)

FOREIGN PATENT DOCUMENTS

| JP | 2001-350438 | 12/2001 |
|---|---|---|
| JP | 2006-24350 | 1/2006 |

OTHER PUBLICATIONS

U.S. Appl. No. 11/831,131, filed Jul. 31, 2007, Tobita.
U.S. Appl. No. 11/838,416, filed Aug. 14, 2007, Tobita et al.
U.S. Appl. No. 11/856,264, filed Sep. 17, 2007, Tobita.
U.S. Appl. No. 11/937,791, filed Nov. 9, 2007, Tobita.

*Primary Examiner*—Cassandra Cox
(74) *Attorney, Agent, or Firm*—Oblon, Spivak, McClelland, Maier & Neustadt, P.C.

(57) ABSTRACT

Threshold voltage shifts of transistors which are constituents of a bidirectional shift register are reduced to prevent a malfunction in the shift register. A bidirectional unit shift register includes first and second pull-down circuits (41, 42) connected to the gate of a first transistor (Q1) that supplies a first clock signal (CLK) to an output terminal (OUT). The first pull-down circuit (41) includes a first inverter that uses the gate of the first transistor (Q1) as the input node and that is activated by the first clock signal (CLK), and a second transistor (Q5A) that discharges the gate of the first transistor (Q1) according to the output of the first inverter. The second pull-down circuit (42) includes a second inverter that uses the gate of the first transistor (Q1) as the input node and that is activated by a second clock signal (/CLK) having a different phase from the first clock signal (CLK), and a third transistor (Q5A) that discharges the gate of the first transistor according to the output of the second inverter.

42 Claims, 38 Drawing Sheets

U.S. PATENT DOCUMENTS

| | | |
|---|---|---|
| 2002/0003964 A1 | 1/2002 | Kanbara et al. |
| 2003/0231735 A1* | 12/2003 | Moon et al. .................. 377/64 |
| 2006/0001637 A1 | 1/2006 | Pak et al. |
| 2006/0061562 A1* | 3/2006 | Park et al. .................. 345/204 |
| 2007/0164973 A1 | 7/2007 | Tobita |
| 2007/0195053 A1 | 8/2007 | Tobita et al. |
| 2007/0195920 A1 | 8/2007 | Tobita |
| 2007/0217564 A1 | 9/2007 | Tobita |
| 2007/0248204 A1 | 10/2007 | Tobita |
| 2007/0274433 A1 | 11/2007 | Tobita |

* cited by examiner

F I G. 2
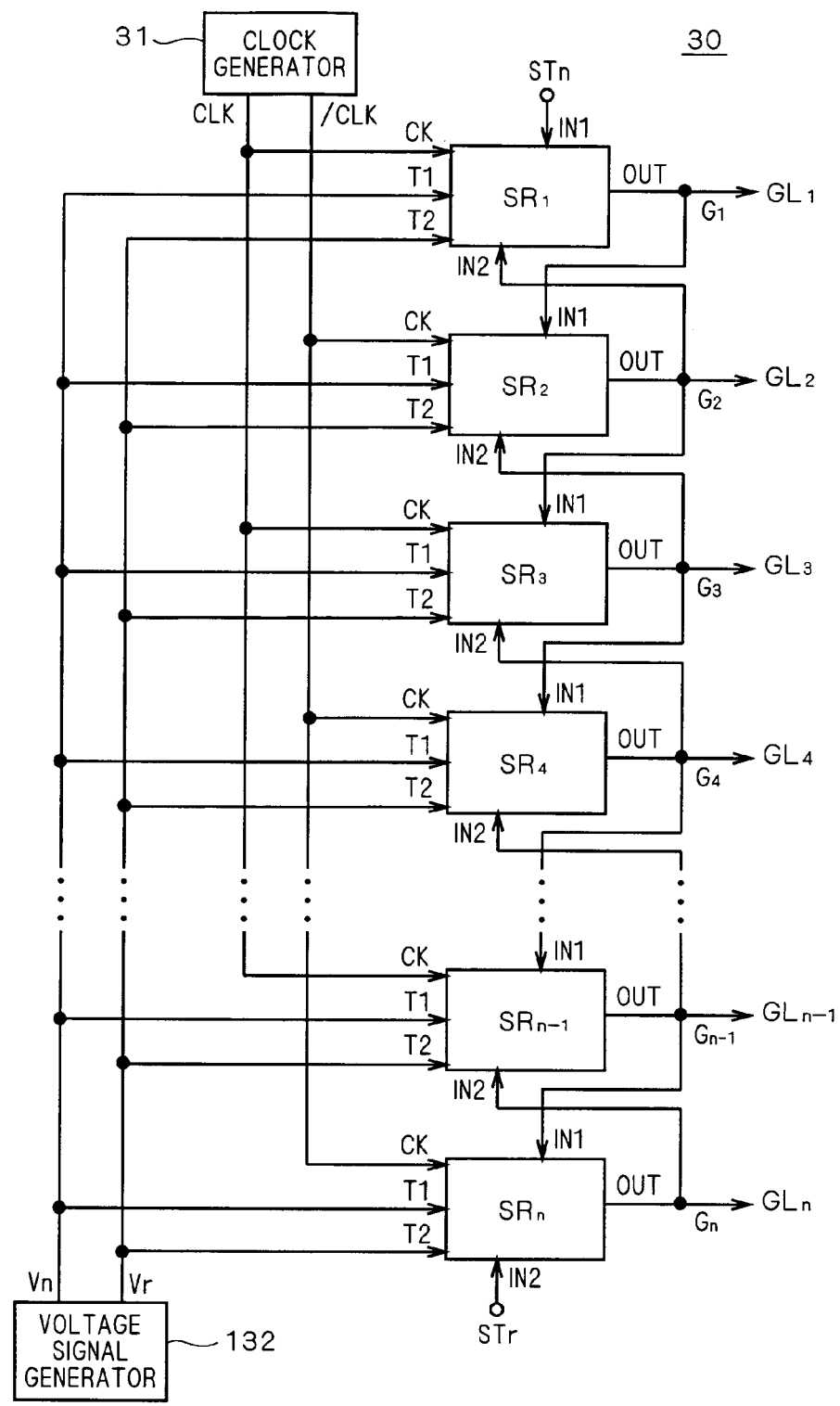

F I G. 3
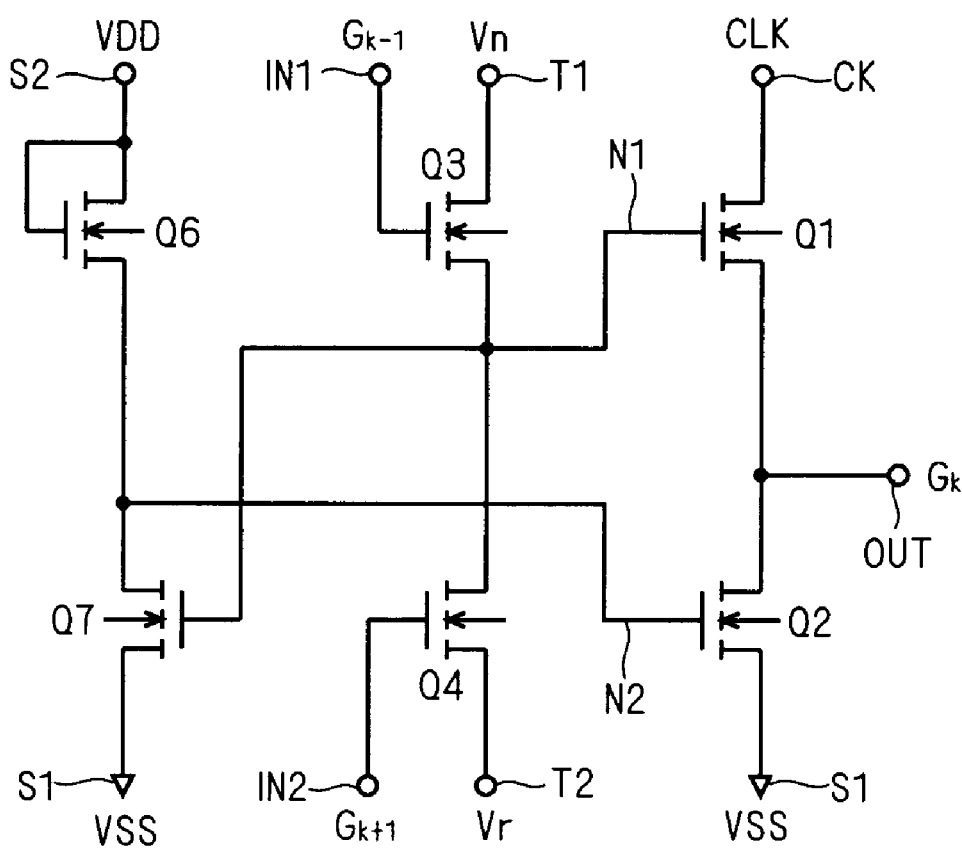

F I G . 8
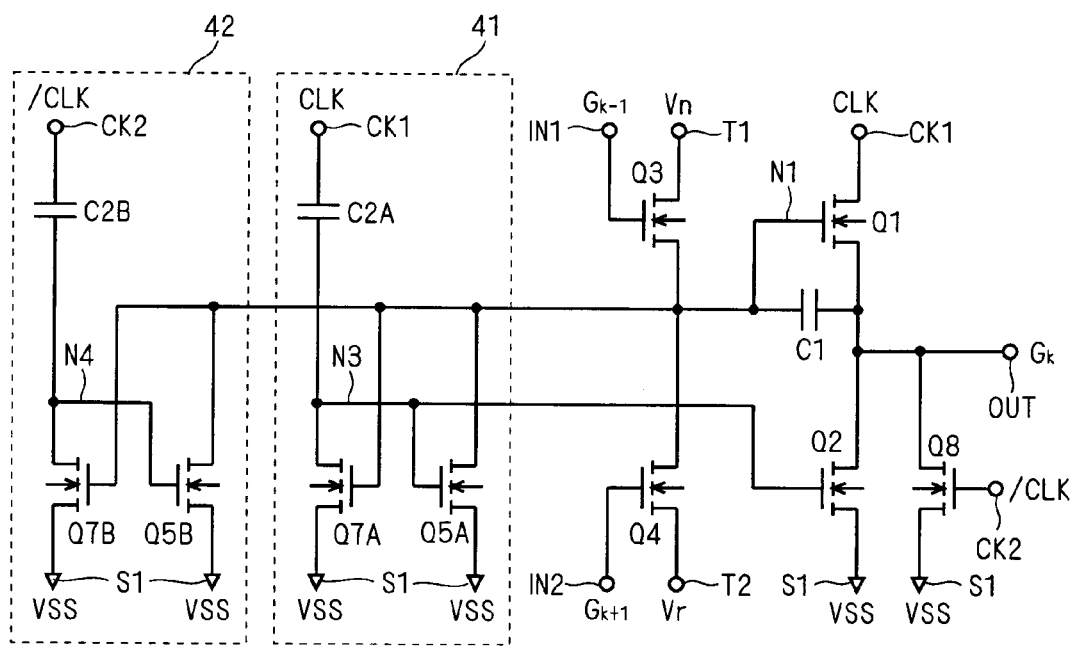

F I G . 3 0
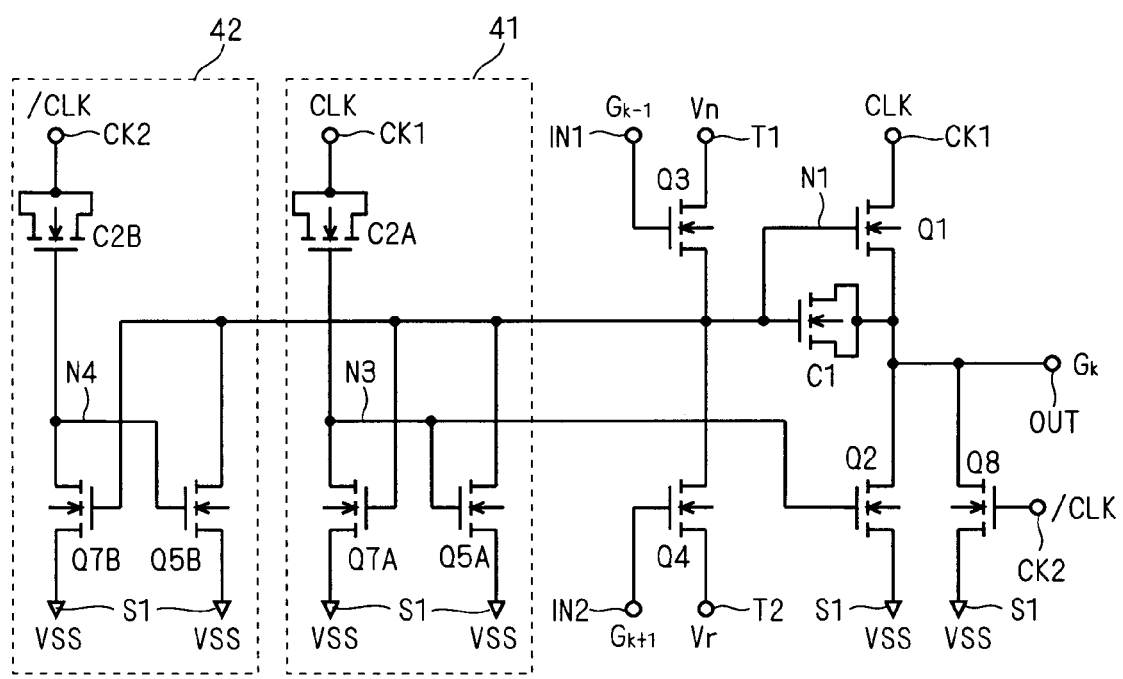

SHIFT REGISTER CIRCUIT AND IMAGE DISPLAY APPARATUS CONTAINING THE SAME

BACKGROUND OF THE INVENTION

1. Field of the Invention

The present invention relates to a shift register circuit for use as, for example, a scanning line driving circuit in an image display apparatus and constituted by only field-effect transistors of the same conductivity type, and in particular to a bidirectional shift register that can reverse the direction of shift of a signal.

2. Description of the Background Art

In an image display apparatus (hereinafter referred to as a "display apparatus") such as a liquid crystal display, a plurality of pixels are arranged in a matrix in a display panel and a gate line (scanning line) is provided for each row of pixels (pixel line) of the display panel. In a cycle of one horizontal period of a display signal, the gate lines are sequentially selected and driven to update a display image. As a gate line driving circuit (scanning line driving circuit) for sequentially selecting and driving pixel lines, i.e., gate lines, a shift register may be used which performs a round of shift operation in one frame period of a display signal.

In order to reduce the number of steps in the manufacturing process of a display apparatus, a shift register for use as a gate line driving circuit should preferably be constituted by only field-effect transistors of the same conductivity type. Therefore, various shift registers constituted by only N- or P-type field-effect transistors and various display apparatuses containing such shift registers have been proposed. As a field-effect transistor, a MOS (Metal Oxide Semiconductor) transistor, a thin film transistor (TFT) or the like is used.

A gate line driving circuit is constituted by a shift register having a plurality of stages. Specifically, a gate line driving circuit is constituted by a plurality of cascade-connected shift register circuits, each of which is provided for each pixel line, i.e., each gate line. In this specification, for convenience of description, each of a plurality of shift register circuits which are constituents of a gate line driving circuit is referred to as a "unit shift register."

For example in a matrix type liquid crystal display apparatus with a matrix of liquid crystal pixels, it is often requested to change the display pattern, such as to turn the display image upside down and from side to side and to change the order of display at the time of display.

Turning the display, for example, is desired when a translucent screen is used with a liquid crystal display applied to an OHP (overhead projector). This is because, in the case of using a translucent screen, an image is projected from the back side of the screen as viewed from a viewer, so that when projected from the front side of the screen, an image is inverted on the screen. Changing the order of display is desired when rendering effects, such as gradual appearance of a display image from top to bottom or from bottom to top, are required for display of a bar graph, a histogram, etc.

One of the techniques for changing the display pattern in a display apparatus is to switch the direction of shift of a signal in a gate line driving circuit. For this, shift registers that can switch the direction of shift of a signal (hereinafter referred to as "bidirectional shift registers") have been proposed.

For example, Japanese Patent Application Laid-open No. 2001-350438 (pp. 13-19, FIGS. 13-25) discloses in its FIG. 13, a unit shift register (hereinafter also referred to as a "bidirectional unit shift register") for use in a bidirectional shift register and constituted by only N-channel type field effect transistors (a similar circuit is shown in FIG. 3 of the specification of the present invention, and the reference numerals or characters in parentheses below correspond to those in FIG. 3 of the present invention).

An output stage of the unit shift register is constituted by a first transistor (Q1) that supplies a clock signal (CLK) inputted to a clock terminal (CK) to an output terminal (OUT), and a second transistor (Q2) that supplies a reference voltage (VSS) to the output terminal. Here, a gate node (N1) of the first transistor is defined as a first node, and a gate node (N2) of the second transistor as a second node.

The unit shift register includes a third transistor (Q3) that supplies a first voltage signal (Vn) to the first node based on a signal inputted to a predetermined first input terminal (IN1), and a fourth transistor (Q4) that supplies a second voltage signal (Vr) to the first node based on a signal inputted to a predetermined second input terminal (IN2). The first and second voltage signals are complementary to each other in such a way that when one of them is at a HIGH voltage level (voltage level is hereinafter referred to simply as a "level"), the other is at a LOW level.

The first transistor is driven by those third and fourth transistors. The second transistor is driven by an inverter (Q6, Q7) that uses the first node as the input end (input node) and the second node as the output end (output node). Specifically, when the unit shift register outputs an output signal, the second and third transistors operate to set the first node to HIGH level, and accordingly the inverter sets the second node to LOW level. Thereby, the first transistor is turned on and the second transistor is turned off, in which state a clock signal is transmitted to the output terminal which then outputs an output signal. On the other hand, when the unit shift register does not output an output signal, the second and third transistors operate to set the first node to LOW level, and accordingly the inverter sets the second node to HIGH level Thereby, the first transistor is turned off and the second transistor is turned on, in which state the voltage level of the output terminal is maintained LOW.

For example when the first voltage signal is at the HIGH level and the second voltage signal is at the LOW level, a signal input to the first input terminal causes the first node to become HIGH and accordingly the second node to become LOW, whereby the first transistor is turned on and the second transistor is turned off. Thus, the unit shift register outputs an output signal at a subsequent time when a clock signal is inputted. In other words, when the first voltage signal is HIGH and the second voltage signal is LOW, the unit shift register operates to time-shift and output a signal inputted to the first input terminal.

On the contrary, when the first voltage signal is at the LOW level and the second voltage signal is at the HIGH level, a signal input to the second input terminal causes the first node to become HIGH and accordingly the second node to become LOW, whereby the first transistor is turned on and the second transistor is turned off. Thus, the unit shift register outputs an output signal at a subsequent time when a clock signal is inputted. In other words, when the first voltage signal is LOW and the second voltage signal is HIGH, the unit shift register operates to time-shift and output a signal inputted to the second input terminal.

In this way, the bidirectional unit shift register disclosed in FIG. 13 of Japanese Patent Application Laid-open No. 2001-350438 (FIG. 3 of the specification of the present invention) switches the direction of shift of a signal by switching the levels of the first and second voltage signals for driving the first transistor.

As described above, a conventional bidirectional unit shift register circuit includes the output stage constituted by the first transistor (Q1) that supplies the clock signal (CLK) inputted to the clock terminal (CK) to the output terminal (OUT), and the second transistor (Q2) that supplies the reference voltage (VSS) to the output terminal. During the period when the unit shift register does not output an output signal (this period is hereinafter referred to as a "non-selected period"), the first transistor remains ON and the second transistor remains OFF, whereby the voltage level (hereinafter referred to simply as a "level") of the output terminal is maintained LOW.

A display apparatus in which shift registers in a gate line driving circuit are constituted by amorphous silicon TFTs (a-Si TFTs), is easy to increase its area and has high productivity, so that it is widely adopted, for example, as a display screen of a notebook PC, a large-screen display or the like.

But, a-Si TFTs have a tendency that, when their gate electrodes are positively and continuously (dc) biased, their threshold voltages may shift in a positive direction, which causes impaired drive capabilities (capabilities to pass current). Especially in a shift register of a gate line driving circuit, during the non-selected period which is of the same length as about one frame period (approximately 16 ms), the gate of the second transistor is positively and continuously biased in order to turn the second transistor on. Repeating that operation impairs the drive capability of the second transistor. If that is the case, when unnecessary charges are supplied to the output terminal due to noise or the like, the second transistor cannot discharge those charges and such a malfunction results that the gate lines may be activated by mistake. It is known that a similar problem can occur not only in a-Si TFTs but also in, for example, organic TFTs.

On the other hand, Japanese Patent Application Laid-open No. 2006-24350 discloses in its FIG. 7, a unit shift register that can reduce the problem of this threshold voltage shift (Vth shift) (the reference numerals or characters in parentheses below correspond to those in FIG. 7 of Japanese Patent Application Laid-open No. 2006-24350).

The unit shift register shown in FIG. 7 of Japanese Patent Application Laid-open No. 2006-24350 includes two transistors (TdA, Td) corresponding to the second transistor, and a transistor (T1A) that prevents a rise in the level of the gate of a first transistor (Tu) during the non-selected period. When not selected, the unit shift register swings the levels of the gates of those three transistors (TdA, Td, T1A) in response to level transitions of clock signals (CLK, CKB). According to this technique, the threshold voltages of those three transistors (TdA, Td, T1A) will be ultimately settled to values that are almost intermediate between HIGH and LOW levels of the clock signals (CLK, CKB) (assuming that parasitic capacitances accompanying gate nodes of the transistors TdA, Td and T1A are extremely small and that the duty ratios of the clock signals (CLK, CKB) are 50%).

Although the unit shift register in FIG. 7 of Japanese Patent Application Laid-open No. 2006-24350 has only one fixed direction of shift of a signal (i.e., a unidirectional shift register), it can serve as a bidirectional unit shift register if the aforementioned first voltage signal (Vn) is supplied to the drain of the transistor T0 and the second voltage signal (Vr) is supplied to the source of the transistor T1 in the unit shift register.

Doing so, however, causes the following problem. Specifically, although the transistors T0 and T1 are off during the non-selected period, if they are activated by light or thermal energy from the outside of the display apparatus, off-state current will flow. Since either of the first voltage signal (Vn) and the second voltage signal (Vr) is always at the HIGH level, a high-level charge is supplied to the gate of the first transistor (Tu) through the transistor T0 or T1. Consequently, there is concern that the level of the gate of the first transistor (Tu) might rise during the non-selected period. The problem is that if, at this time, the level of the gate exceeds the threshold voltage of the first transistor (Tu), an error output signal will be outputted.

As described above, the unit shift register shown in FIG. 7 of Japanese Patent Application Laid-open No. 2006-24350 includes the transistor T1A in order to prevent the occurrence of such a problem. However, since the gate of the transistor T1A swings in response to a clock signal, the transistor T1A is turned off associated with the cycle of the clock signal. Accordingly, if a large off-state current flows through the transistors T0 and T1, the level of the gate of the first transistor Tu might exceed the threshold voltage thereof during the off period of the transistor T1A.

SUMMARY OF THE INVENTION

Threshold voltage shifts of transistors which are constituents of a shift register circuit are controlled to prevent a malfunction in the shift register circuit.

A shift register circuit according to the present invention includes first and second input terminals, first and second voltage-signal terminals, first and second clock terminals, an output terminal, and first to fourth transistors. The first and second voltage-signal terminals each input a predetermined voltage signal. The first and second clock terminals each input a clock signal with a different phase from the one inputted to the other. The first transistor supplies a first clock signal inputted to the first clock terminal to the output terminal. The second transistor discharges the output terminal. The third transistor has a control electrode connected to the first input terminal and supplies a first voltage signal inputted to the first voltage-signal terminal to a first node connected to a control electrode of the first transistor. The fourth transistor has a control electrode connected to the second input terminal and supplies a second voltage signal inputted to the second voltage-signal terminal to the first node.

The shift register circuit further includes a first pull-down circuit that discharges the first node in response to activation of the first clock signal, and a second pull-down circuit that discharges the first node in response to activation of a second clock signal inputted to the second clock terminal. Discharge of the first node by the first and second pull-down circuits is performed during a period when the first node is not charged, and it is not performed during a period when the first node is charged.

In a conventional shift register circuit with only one pull-down circuit that discharges a first node during a period when the first node is not charged (a non-selected period), since a specific transistor in that pull-down circuit needs to continuously discharge the first node, the control electrode of that transistor is continuously biased, which causes a threshold voltage shift of the transistor. According to the present invention, the first pull-down circuit and the second pull-down circuit operate such that they discharge the first node in turn during the non-selected period, so that it is not necessary to continuously bias the control electrode of a specific transistor in those pull-down circuits. This reduces deterioration in the drive capabilities of the first and the second pull-down circuits and allows the first node to be discharged with reliability, thereby preventing a malfunction in the shift register circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram showing by way of example a configuration of a gate line driving circuit using conventional bidirectional unit shift registers;

FIG. 3 is a circuit diagram of a conventional bidirectional unit shift register;

FIG. 8 is a circuit diagram showing a configuration of a unit shift register according to the first preferred embodiment;

FIGS. 29 and 30 are circuit diagrams showing a configuration of a unit shift register according to a fourteenth preferred embodiment;

DESCRIPTION OF THE PREFERRED EMBODIMENTS

Figure 1:
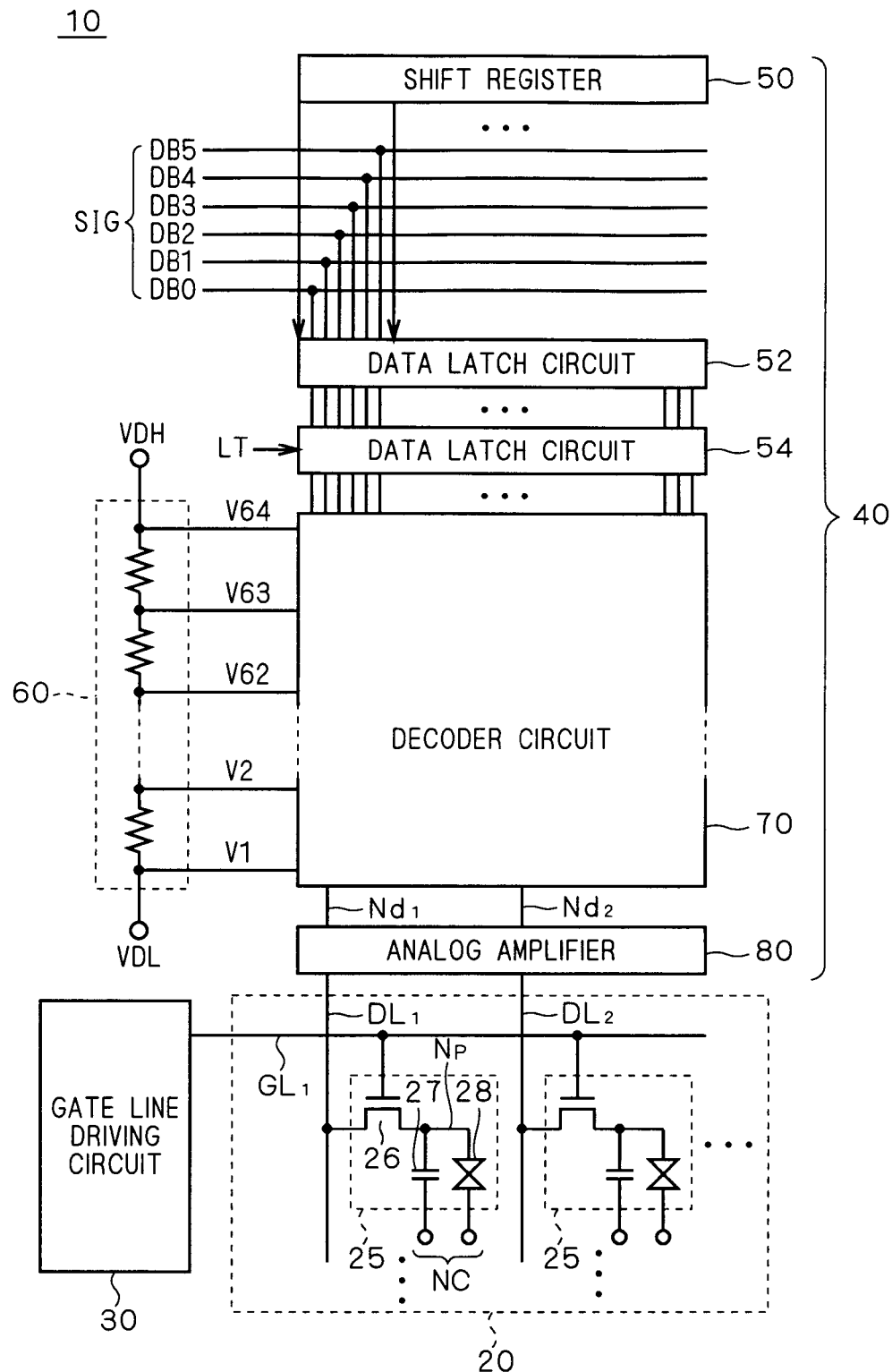
FIG. 1 is a schematic block diagram showing a configuration of a display apparatus according to preferred embodiments of the present invention.

Hereinbelow, preferred embodiments of the present invention will be described with reference to the accompanied drawings. To avoid repetition and redundancy of description, elements having the same or equivalent functions are designated by the same reference numerals or characters in the drawings.

First Preferred Embodiment

FIG. 1 is a schematic block diagram showing a configuration of a display apparatus according to a first preferred embodiment of the present invention. It shows an overall configuration of a liquid crystal display 10 as a representative example of the display apparatus.

The liquid crystal display 10 includes a liquid crystal array 20, a gate line driving circuit (scanning line driving circuit) 30, and a source driver 40. As will be clear from the following description, a bidirectional shift register according to the preferred embodiments of the present invention is mounted in the gate line driving circuit 30 and is formed integrally with the liquid crystal array 20.

The liquid crystal array 20 includes a plurality of pixels 25 arranged in a matrix. Each of gate lines $GL_1$, $GL_2$, ... (hereinafter also referred to generically as "gate lines GL") is provided for each row of pixels (hereinafter also referred to as a "pixel line"), and each of data lines $DL_1$, $DL_2$, ... (hereinafter also referred to generically as "data lines DL") is provided for each column of pixels (hereinafter also referred to as a "pixel column"). FIG. 1 representatively shows the pixels 25 in the first and second columns of the first row, the corresponding gate line $GL_1$, and the corresponding data lines $DL_1$ and $DL_2$.

Each pixel 25 has a pixel switching element 26 provided between its corresponding data line DL and a pixel node Np, and a capacitor 27 and a liquid crystal display device 28 which are connected in parallel between the pixel node Np and a common electrode node NC. The orientation of the liquid crystal in the liquid crystal display device 28 changes with a voltage difference between the pixel node Np and the common electrode node NC, in response to which the display luminance of the liquid crystal display device 28 changes. This makes it possible to control the luminance of each pixel using a display voltage transmitted to the pixel node Np through a data line DL and the pixel switching element 26. Specifically, an intermediate luminance can be obtained by applying an intermediate voltage difference between a voltage difference corresponding to the maximum luminance and a voltage difference corresponding to the minimum luminance to between the pixel node Np and the common electrode node NC. By setting the above display voltages stepwise, gradations of luminance can be obtained.

The gate line driving circuit 30 sequentially selects and drives the gate lines GL in a predetermined scanning cycle. In this preferred embodiment, the gate line driving circuit 30 is constituted by bidirectional shift registers and thus can switch the direction of the order to activate the gate lines GL. The pixel switching elements 26 have their gate electrodes connected to their corresponding gate lines GL. During the period when a certain gate line GL is selected, the pixel switching element 26 in each of the pixels connected to the selected gate line GL is conducting so that the pixel node Np is connected to a corresponding data line DL. Then, a display voltage transmitted to the pixel node Np is held by the capacitor 27. In general, the pixel switching element 26 is a TFT formed on the same insulator substrate (such as a glass substrate and a resin substrate) as the liquid crystal display device 28.

The source driver 40 is configured to output display voltages that are set stepwise by a display signal SIG which is an N-bit digital signal, to the data lines DL. By way of example, the display signal SIG shall be a 6-bit signal including display signal bits DB0 to DB5. With such a 6-bit display signal SIG, $2^6=64$ levels of gray can be displayed in each pixel. Further, by forming a single color display unit with three pixels of R (Red), G (green), and B (Blue), a display of approximately 260 thousand colors can be achieved.

As shown in FIG. 1, the source driver 40 includes a shift register 50, data latch circuits 52 and 54, a gradation voltage generating circuit 60, a decoder circuit 70, and an analog amplifier 80.

As to the display signal SIG, the display signal bits DB0 to DB5 corresponding to the display luminance of each pixel 25 are serially generated. Specifically, the display signal bits DB0 to DB5 obtained at each point in time indicate the display luminance of any one pixel 25 in the liquid crystal array 20.

The shift register 50 instructs the data latch circuit 52 to fetch the display signal bits DB0 to DB5 with timing synchronized with a cycle in which the setting of the display signal SIG is switched. The data latch circuit 52 sequentially fetches serially-generated display signals SIG to hold display signals SIG of one pixel line.

A latch signal LT inputted to the data latch circuit 54 is activated at the time when display signals SIG of one pixel line are fetched by the data latch circuit 52. In response to this, the data latch circuit 54 fetches display signals SIG of one pixel line held at that time in the data latch circuit 52.

The gradation voltage generating circuit 60 is composed of sixty-three partial pressure resistances which are connected in series between a high voltage VDH and a low voltage VDL and which generate 64 levels of gradation voltages V1 to V64, respectively.

The decoder circuit 70 decodes display signals SIG held in the data latch circuit 54, and based on the result of decoding, selects a voltage from the gradation voltages V1 to V64 to output to each of decoder output nodes $Nd_1$, $Nd_2$, . . . (hereinafter also referred to generically as "decoder output nodes Nd").

Consequently, display voltages (any of the gradation voltages V1 to V64) corresponding to display signals SIG of one pixel line held in the data latch circuit 54 are outputted simultaneously (in parallel) to the decoder output nodes Nd. FIG. 1 representatively shows the decoder output nodes $Nd_1$ and $Nd_2$ corresponding to the data lines $DL_1$ and $DL_2$ of the first and second columns, respectively.

The analog amplifier 80 outputs analog voltages that correspond to the display voltages outputted to the decoder output nodes $Nd_1$, $Nd_2$, . . . from the decoder circuit 70 to the data lines $DL_1$, $DL_2$, . . . , respectively.

The source driver 40 repeatedly outputs display voltages of one pixel line corresponding to a series of display signals SIG in a predetermined scanning cycle, and the gate line driving circuit 30 drives the gate lines $GL_1$, $GL_2$, . . . in this order or in reverse order in synchronization with that scanning cycle. Accordingly, an image or inverted image based on the display signals SIG is displayed in the liquid crystal array 20.

Now, for ease of description of the present invention, the conventional gate line driving circuit 30 and bidirectional unit shift registers included therein will be described. FIG. 2 shows a configuration of the conventional gate line driving circuit 30. This gate line driving circuit 30 is constituted by a bidirectional shift register having a plurality of stages. Specifically, the gate line driving circuit 30 includes n bidirectional unit shift registers $SR_1$, $SR_2$, $SR_3$, . . . $SR_n$ (hereinafter referred to generically as "unit shift registers SR") which are connected in cascade. Each unit shift register SR is provided for each pixel line, i.e., each gate line GL.

A clock generator 31 shown in FIG. 2 is configured to input two phases of clock signals CLK and /CLK that are opposite to each other in phase, to the unit shift registers SR in the gate line driving circuit 30. These clock signals CLK and /CLK are controlled to be activated alternately with timing synchronized with a scanning cycle of the display apparatus.

A voltage signal generator 132 shown in FIG. 2 is configured to generate a first voltage signal Vn and a second voltage signal Vr that determine the direction of shift of a signal in the bidirectional shift register. The first and second voltage signals Vn and Vr are complementary to each other. When shifting a signal in a direction from the previous stage to the subsequent stage (in the order of the unit shift registers $SR_1$, $SR_2$, . . . $SR_n$) (this direction is defined as a "forward direction"), the voltage signal generator 132 sets the first voltage signal Vn to HIGH level and the second voltage signal Vr to LOW level. In reverse, when shifting a signal in a direction from the subsequent stage to the previous stage (in the order of the unit shift registers $SR_n$, $SR_{n-1}$, $SR_{n-2}$, . . . ) (this direction is defined as a "backward direction"), the voltage signal generator 132 sets the second voltage signal Vr to HIGH level and the first voltage signal Vn to LOW level.

Each unit shift register SR has a first input terminal IN1, a second input terminal IN2, an output terminal OUT, a clock terminal CK, a first voltage-signal terminal T1, and a second voltage signal terminal T2. As shown in FIG. 2, the clock terminal CK of each unit shift register SR receives either one of the clock signals CLK and /CLK which is different from the one inputted to its adjacent unit shift registers SR of the preceding and subsequent stages.

The clock signals CLK and /CLK generated by the clock generator 31 can exchange their phases with each other according to the direction of shift of the signals by using a program or by changing connections in wiring. The exchange by changing connections in wiring is available when the direction of shift is fixed in one direction before the manufacture of the display apparatus. The exchange by using a program is available when the direction of shift is fixed in one direction after the manufacture of the display apparatus, or when the direction of shift can be changed during the use of the display apparatus.

The gate lines GL are connected to the output terminals OUT of the unit shift registers SR. In other words, signals (output signals) outputted from the output terminals OUT are horizontal (or vertical) scanning pulses for activating the gate lines GL.

A first control pulse STn is inputted to the first input terminal IN1 of the unit shift register $SR_1$ of the first stage which is the foremost stage. This first control pulse STn becomes a start pulse that corresponds to the head of each frame period of an image signal for a forward shift and becomes an end pulse that corresponds to the end of each frame period of an image signal for a backward shift. The first input terminal IN1 of the unit shift register SR of the second or subsequent stage is connected to the output terminal OUT of the unit shift register SR of the preceding stage. That is, the first input terminal IN1 of the unit shift register SR of the second or subsequent stage receives the output signal of the preceding stage.

A second control pulse STr is inputted to the second input terminal IN2 of the unit shift register $SR_n$ of the nth stage which is the last stage. This second control pulse STr becomes a start pulse for a backward shift and becomes an end pulse for a forward shift. The second input terminal IN2 of the (n−1)th or previous stage is connected to the output terminal OUT of the subsequent stage. That is, the second input terminal IN2 of the second or subsequent stage receives the output signal of the subsequent stage.

For a forward shift, in synchronization with the clock signal CLK or /CLK, each unit shift register SR transmits an input signal inputted from the preceding stage (the output signal of the preceding stage) to its corresponding gate line GL and to the unit shift register SR of the subsequent stage while shifting that input signal. For a backward shift, each unit shift register SR transmits an input signal inputted from the subsequent stage (the output signal of the subsequent stage) to its corresponding gate line GL and to the unit shift register SR of the preceding stage while shifting that input signal (the operations of the unit shift registers SR will be described later in detail). As a result, a series of unit shift registers SR serve as a so-called gate line driving unit for sequentially activating the gate lines GL with timing based on a predetermined scanning cycle.

FIG. 3 is a circuit diagram showing a configuration of a conventional bidirectional unit shift register SR as disclosed in the aforementioned Japanese Patent Application Laid-open No. 2001-350438. In the gate line driving circuit 30, each of the cascade-connected unit shift registers SR has substantially the same configuration, so that the configuration of one unit shift register SR will be described representatively below. While transistors which are constituents of this unit shift register SR are all field-effect transistors of the same conductivity type, they all shall be N-type TFTs in this example.

As shown in FIG. 3, the conventional bidirectional unit shift register SR has a first power supply terminal S1 supplied with a low power supply potential VSS and a second power supply terminal S2 supplied with a high power supply potential VDD, in addition to the first and second input terminals IN1 and IN2, the output terminal OUT, the clock terminal CK, and the first and second voltage-signal terminals T1 and T2 which have already been shown in FIG. 2. In the following description, the low power supply potential VSS shall be a reference potential (=0V) of the circuit, but in practical use, the reference potential is determined with reference to a voltage of data written into pixels. For example, the high power supply potential VDD may be set to 17 V and the low power supply potential VSS to −12 V.

An output stage of the unit shift register SR is constituted by a transistor Q1 connected between the output terminal OUT and the clock terminal CK, and a transistor Q2 connected between the output terminal OUT and the first power supply terminal S1. Specifically, the transistor Q1 is an output pull-up transistor that supplies a clock signal inputted to the clock terminal CK to the output terminal OUT, and the transistor Q2 is an output pull-down transistor that supplies a potential at the first power supply terminal S1 to the output terminal OUT. Hereinafter, a node connected to the gate (control electrode) of the transistor Q1 which is a constituent of the output stage of the unit shift register SR is defined as a node N1, and a gate node of the transistor Q2 as a node N2.

A transistor Q3 is connected between the node N1 and the first voltage-signal terminal T1 so that its gate is connected to the first input terminal IN1. A transistor Q4 is connected between the node N1 and the second voltage-signal terminal T2 so that its gate is connected to the second input terminal IN2.

A transistor Q6 is connected between the node N2 and the second power supply terminal S2, and a transistor Q7 is connected between the node N2 and the first power supply terminal S1. The transistor Q6 is so-called diode-connected with its gate as well as its drain connected to the second power supply terminal S2. The gate of the transistor Q7 is connected to the node N1. The transistor Q7 has a drive capability (capability to pass current) that is set sufficiently higher than that of the transistor Q6. That is, the on-resistance of the transistor Q7 is smaller than that of the transistor Q6. Accordingly, the potential of the node N2 decreases with increasing gate potential of the transistor Q7, and conversely, the potential of the node N2 increases with decreasing gate potential of the transistor Q7. In other words, the transistors Q6 and Q7 form an inverter using the node N1 as the input end (input node) and the node N2 as the output end (output node). This inverter is a so-called "ratio inverter" whose operation is defined by the ratio between the on-resistance values of the transistors Q6 and Q7. This inverter functions as a "pull-down driving circuit" that drives the transistor Q2 in order to pull down the output terminal OUT during the non-selected period.

Now, the operation of the unit shift register SR shown in FIG. 3 will be described. Since the unit shift registers SR which are constituents of the gate line driving circuit 30 operate in substantially the same manner, the operation of a unit shift register $SR_k$ of the kth stage will be described representatively herein.

For the sake of simplicity, the description is given on the assumption that the clock signal CLK is inputted to the clock terminal CK of the unit shift register $SR_k$ (for example, the unit shift register $SR_1$ or $SR_3$ shown in FIG. 2 corresponds to this). The output signal G of a unit shift register $SR_1$ of the ith stage is designated by $G_i$. It is also assumed that the clock signals CLK and /CLK, the first voltage signal Vn, and the second voltage signal Vr all have the same high potential level, VDD, and that transistors which are constituents of each unit shift register SR all have the same threshold voltage, Vth.

First, a forward shift operation of the gate line driving circuit 30 will be described. In this case, the voltage signal generator 132 sets the first voltage signal Vn to HIGH level (VDD) and the second voltage signal Vr to LOW level (VSS). That is, for the forward shift, the transistor Q3 serves as a transistor for charging (pulling up) the node N1, and the transistor Q4 serves as a transistor for discharging (pulling down) the node N1.

First, an initial state is assumed to be such that the node N1 is at the LOW level (VSS) (this state is hereinafter referred to as a "reset state"). At this time, the node N2 is at the HIGH level (VDD−Vth). It is also assumed that the clock terminal CK (the clock signal CLK), the first input terminal IN1 (the output signal $G_{k-1}$ of the preceding stage), and the second input terminal IN2 (the output signal $G_{k+1}$ of the subsequent stage) are all at the LOW level. Since in this reset state, the transistor Q1 is off (in a cut-off state) and the transistor Q2 is on (in a conducting state), the output terminal OUT (the output signal $G_k$) remains at the LOW level irrespective of the level of the clock terminal CK (the clock signal CLK). That is, the gate line $GL_k$ connected to this unit shift register $SR_k$ is not being selected.

Starting from this state, when the output signal $G_{k-1}$ of the unit shift register $SR_{k-1}$ of the preceding stage (in the case of the first stage, the first control pulse STn as a start pulse) becomes HIGH, it is inputted to the first input terminal IN1 of the unit shift register $SR_k$ in which then the transistor Q3 is turned on and the node N1 becomes HIGH (VDD−Vth: Vth is the threshold voltage of the transistor Q3). Correspondingly, the transistor Q7 is turned on, and the node N2 becomes LOW (≈VSS: the potential is determined by the ratio of the on-resistances of the transistors Q6 and Q7 and the power supply voltage). In this state where the node N1 is HIGH and the node N2 is LOW (this state is hereinafter referred to as a "set state"), the transistor Q1 is on and the transistor Q2 is off. After that, the transistor Q3 is subsequently turned off when the output signal $G_{k-1}$ of the preceding stage returns to LOW level, but since the node N1 is HIGH in a floating state, this set state is maintained.

Subsequent to this, the clock signal CLK inputted to the clock terminal CK becomes HIGH. Since at this time, the transistor Q1 is on and the transistor Q2 is off, the level of the output terminal OUT rises therewith. Besides, the level of the node N1 in a floating state is boosted by a predetermined voltage due to coupling through the gate-channel capacitance of the transistor Q1. Accordingly, the transistor Q1 maintains a high drive capability even with a rise in the level of the output terminal OUT, so that the level of the output signal $G_k$ changes following a change in the level of the clock terminal CK. In particular, since the transistor Q1 operates in a non-saturated region (performs a non-saturated operation) when its gate-source voltage is sufficiently high, the output terminal OUT rises to the same level as the clock signal CLK with no loss of the threshold voltage. Therefore, only during the HIGH level period of the clock signal CLK, the output signal $G_k$ becomes HIGH to activate and select the gate line $GL_k$.

Subsequently, when the clock signal CLK returns to LOW level, the output signal $G_k$ also follows the clock signal CLK to become LOW, whereby the gate line $GL_k$ is discharged and returns to the state where it is not selected.

Since the output signal $G_k$ is inputted to the first input terminal IN1 of the subsequent stage, the output signal $G_{k+1}$ of the subsequent stage becomes HIGH at the next time when the clock signal /CLK becomes HIGH. In that case, since the transistor Q4 of the unit shift register $SR_k$ is turned on, the node N1 becomes LOW. Correspondingly, the transistor Q7 is turned off and the node N2 becomes HIGH. That is, the transistor $SR_k$ returns to its reset state where the transistor Q1 is off and the transistor Q2 is on.

After that, the transistor Q4 is turned off when the output signal $G_{k+1}$ of the subsequent stage returns to LOW level. However, since at this time the transistor Q3 is also off, the node N1 remains LOW in a floating state. This state is maintained until the next signal is inputted to the first input terminal IN1, so that the unit shift register $SR_k$ is maintained in the reset state.

In summary of the aforementioned forward shift operation, the unit shift register SR is maintained in the reset state during the period when a signal (the start pulse or the output signal $G_{k-1}$ of the preceding stage) is not inputted to the first input terminal IN1. Since in the reset state, the transistor Q1 is off and the transistor Q2 is on, the output terminal OUT (the gate line $GL_k$) remains at the LOW level (VSS) with low impedance. Upon signal input to the first input terminal IN1, the unit shift register SR is switched to the set state. Since in the set state, the transistor Q1 is on and the transistor Q2 is off, during the period when the signal (the clock signal CLK) at the clock terminal CK is at the HIGH level, the output terminal OUT becomes HIGH to output the output signal $G_k$. Then, upon input of a signal (the output signal $G_{k+1}$ of the subsequent stage or the end pulse) to the second input terminal IN2, the unit shift register SR returns to its original reset state.

Figure 4:
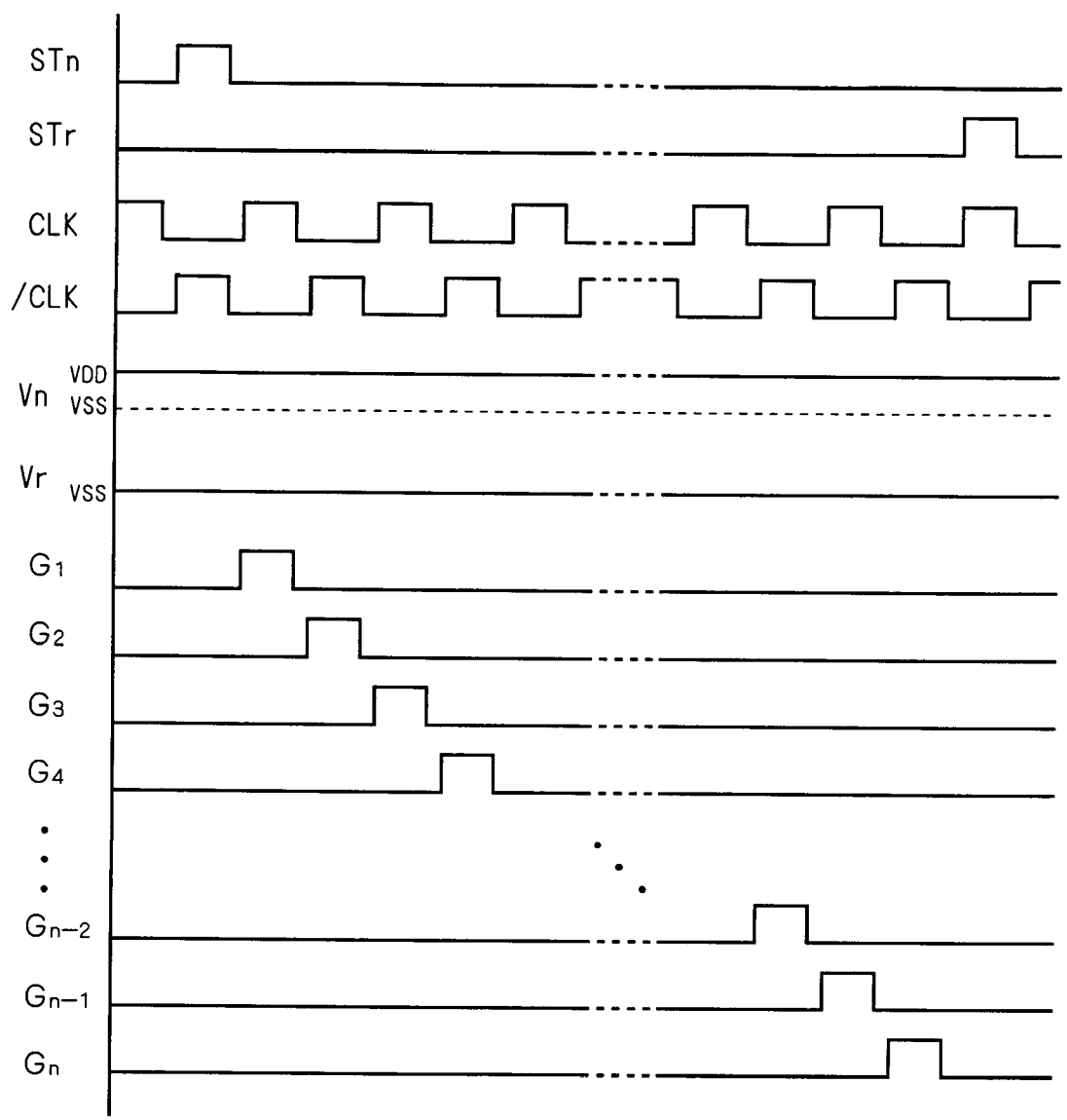
FIGS. 4 and 5 are timing charts illustrating the operation of a gate line driving circuit.

When the gate line driving circuit 30 is configured such that a plurality of unit shift registers SR operating in this manner are connected in cascade as shown in FIG. 2, the first control pulse STn inputted as a start pulse to the first input terminal IN1 of the unit shift register $SR_1$ of the first stage is transmitted in sequence to the unit shift registers $SR_2$, $SR_3$, . . . while being shifted with timing synchronized with the clock signal CLK or /CLK as shown in the timing chart of FIG. 4. Thereby, the gate line driving circuit 30 can drive the gate lines $GL_1$, $GL_2$, $GL_3$, . . . in this order in a predetermined scanning cycle.

For the forward shift, immediately after the unit shift register $SR_n$ outputs the output signal $G_n$ as shown in FIG. 4, it is necessary to input the second control pulse STr as an end pulse to the second input terminal IN2 of the unit shift register $SR_n$ of the last stage. Thereby, the unit shift register $SR_n$ returns to the set state.

On the other hand, when the gate line driving circuit 30 performs a backward shift operation, the voltage signal generator 132 sets the first voltage signal Vn to LOW level (VSS) and the second voltage signal Vr to HIGH level (VDD). That is, for the backward shift, contrary to the case of the forward shift, the transistor Q3 serves as a transistor for discharging (pulling down) the node N1, and the transistor Q4 serves as a transistor for charging (pulling up) the node N1. The second control pulse STr is inputted as a start pulse to the second input terminal IN2 of the unit shift register $SR_n$ of the last stage, and the first control pulse STn is inputted as an end pulse to the first input terminal IN1 of the unit shift register $SR_1$ of the first stage. In this way, in the unit shift register SR of each stage, the operations of the transistors Q3 and Q4 are exchanged with each other as compared with the case of the forward shift.

Thus, for the backward shift, the unit shift register SR is maintained in the reset state during the period when a signal (the start pulse or the output signal $G_{k+1}$ of the subsequent stage) is not inputted to the second input terminal IN2. Since in the reset state, the transistor Q1 is off and the transistor Q2 is on, the output terminal OUT (the gate line $GL_k$) remains at the LOW level (VSS) with low impedance. Then, upon signal input to the second input terminal IN2, the unit shift register SR is switched to the set state. Since in the set state, the transistor Q1 is on and the transistor Q2 is off, the output terminal OUT becomes HIGH to output the output signal $G_k$ during the HIGH level period of the signal at the clock terminal CK (the clock signal CLK). Then, upon input of a signal (the output signal $G_{k-1}$ of the preceding stage or the end pulse) to the first input terminal IN1, the unit shift register SR returns to its original reset state.

Figure 5:
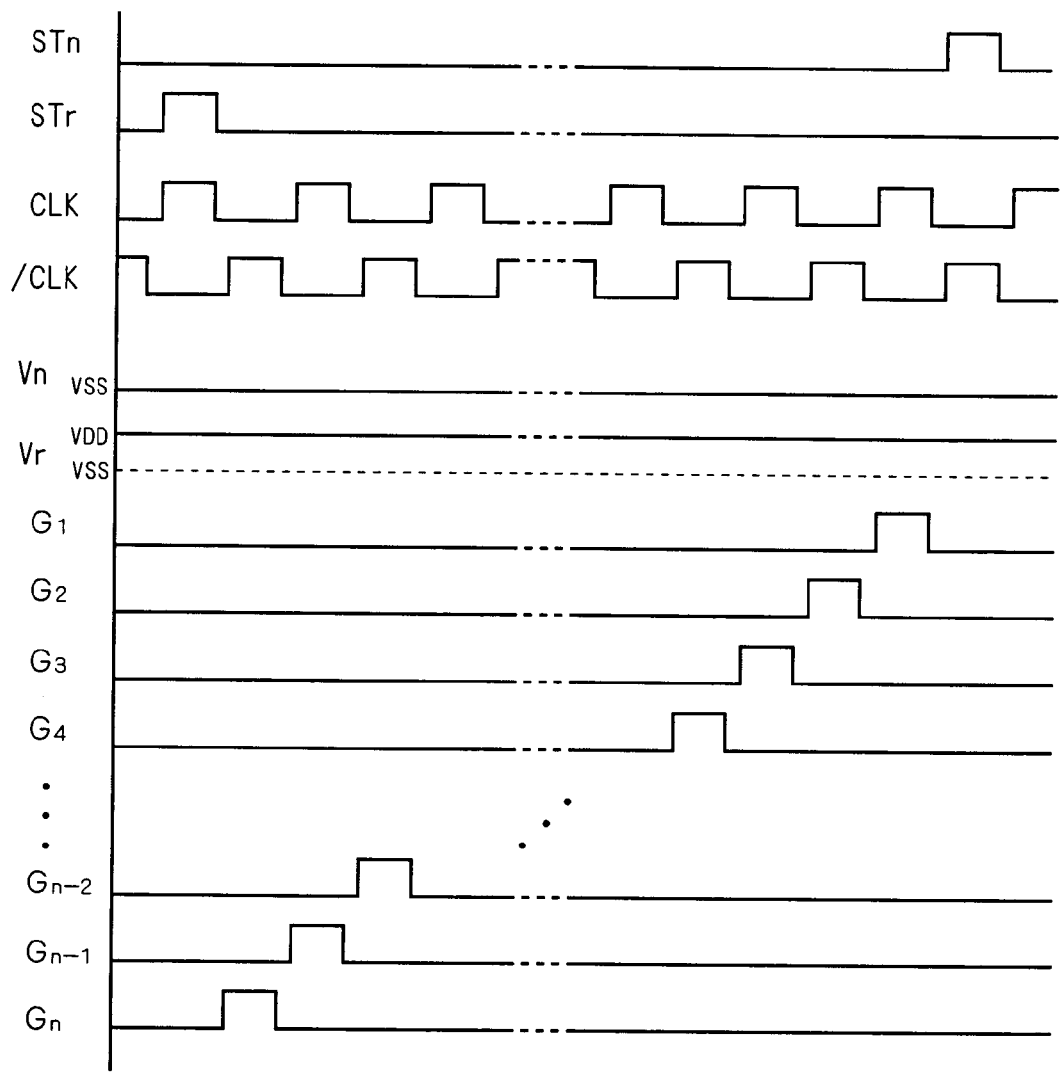

When the gate line driving circuit 30 is configured such that a plurality of unit shift registers SR operating in this manner are connected in cascade as shown in FIG. 2, the second control pulse STr inputted as a start pulse to the second input terminal IN2 of the unit shift register $SR_n$ of the last stage (nth stage) is transmitted to the unit shift registers $SR_{n-1}$, $SR_{n-2}$, . . . in this order while being shifted with timing synchronized with the clock signal CLK or /CLK as shown in the timing chart of FIG. 5. Thereby, the gate line driving circuit 30 can drive the gate lines $GL_n$, $GL_{n-1}$, $GL_{n-2}$, . . . in this order, i.e., in the reverse order of the forward shift, in a predetermined scanning cycle.

For the backward shift, as shown in FIG. 5, immediately after the unit shift register $SR_1$ of the first stage outputs the output signal G1, it is necessary to input the first control pulse STn as an end pulse to the first input terminal IN1 of the unit shift register $SR_1$. Thereby, the unit shift register $SR_1$ returns to the reset state.

While the above example shows the plurality of unit shift registers SR operating with a two-phase clock, the unit shift registers SR may operate with three phases of clock signals. In that case, the gate line driving circuit 30 may be configured as shown in FIG. 6.

The clock generator 31 in this case outputs clock signals CLK1, CLK2, and CLK3 of different phases as a three-phase clock. Each unit shift register SR receives any one of the clock signals CLK1, CLK2, and CLK3 at its clock terminal CK so that its adjacent unit shift registers SR of the preceding and subsequent stages receive different ones of the clock signals. The order that the clock signals CLK1, CLK2, and CLK3 will become HIGH can be changed according to the direction of shift of the signals, by using a program or by changing connections in wiring. For example, the clock signals become HIGH in the order of CLK1, CLK2, CLK3, CLK1, . . . for the forward shift and in the order of CLK3, CLK2, CLK1, CLK3, . . . for the backward shift.

Figure 6:
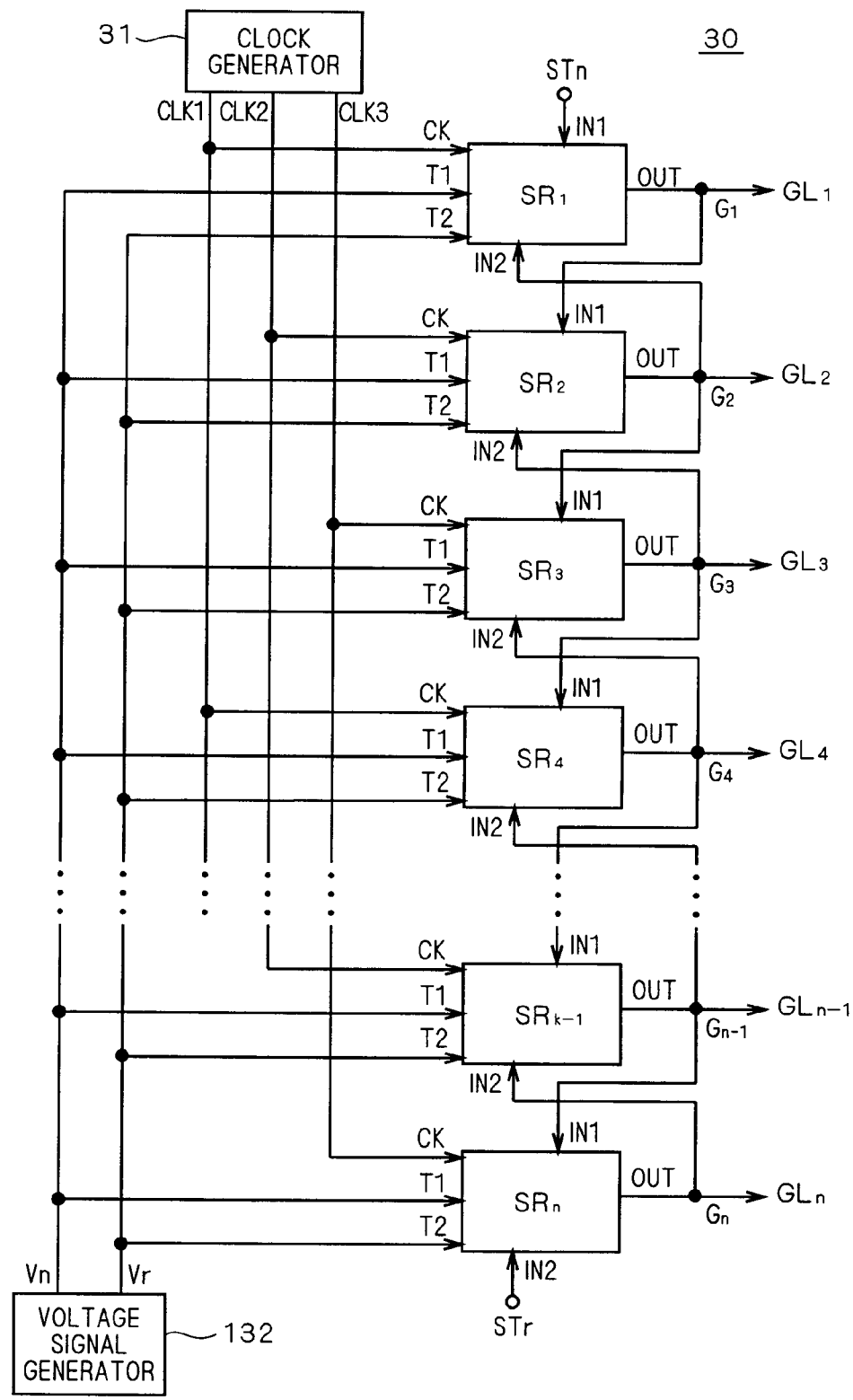
FIG. 6 is a block diagram showing by way of example a configuration of a gate line driving circuit using conventional bidirectional unit shift registers.

Also in the gate line driving circuit 30 configured as shown in FIG. 6, individual unit shift registers SR operate in the same manner as described above in FIG. 2, so that the description thereof will be omitted herein.

In the gate line driving circuit 30 configured as shown in FIGS. 2 and 6, for example for a forward shift, each unit shift register SR will not be brought into the reset state (i.e., the aforementioned initial state) unless at least one operation of the unit shift register SR of its subsequent stage has been completed. On the other hand, for a backward shift, each unit shift register SR will not be brought into the reset state unless at least one operation of the unit shift register SR of its preceding stage has been completed. Each unit shift register SR cannot perform normal operation unless it passes through the reset state. Therefore, it is necessary to, prior to normal operation, perform such dummy operation that a dummy input signal is transmitted through the unit shift registers SR from the first stage to the last stage (or from the last stage to the first stage). Alternatively, a transistor for reset may additionally be provided between the node N2 and the second power supply terminal S2 (high potential power supply) in each unit shift register SR to perform such a reset operation that the node N2 is forcedly charged prior to normal operation. In that case, however, an additional signal line for reset becomes necessary.

Figure 7:
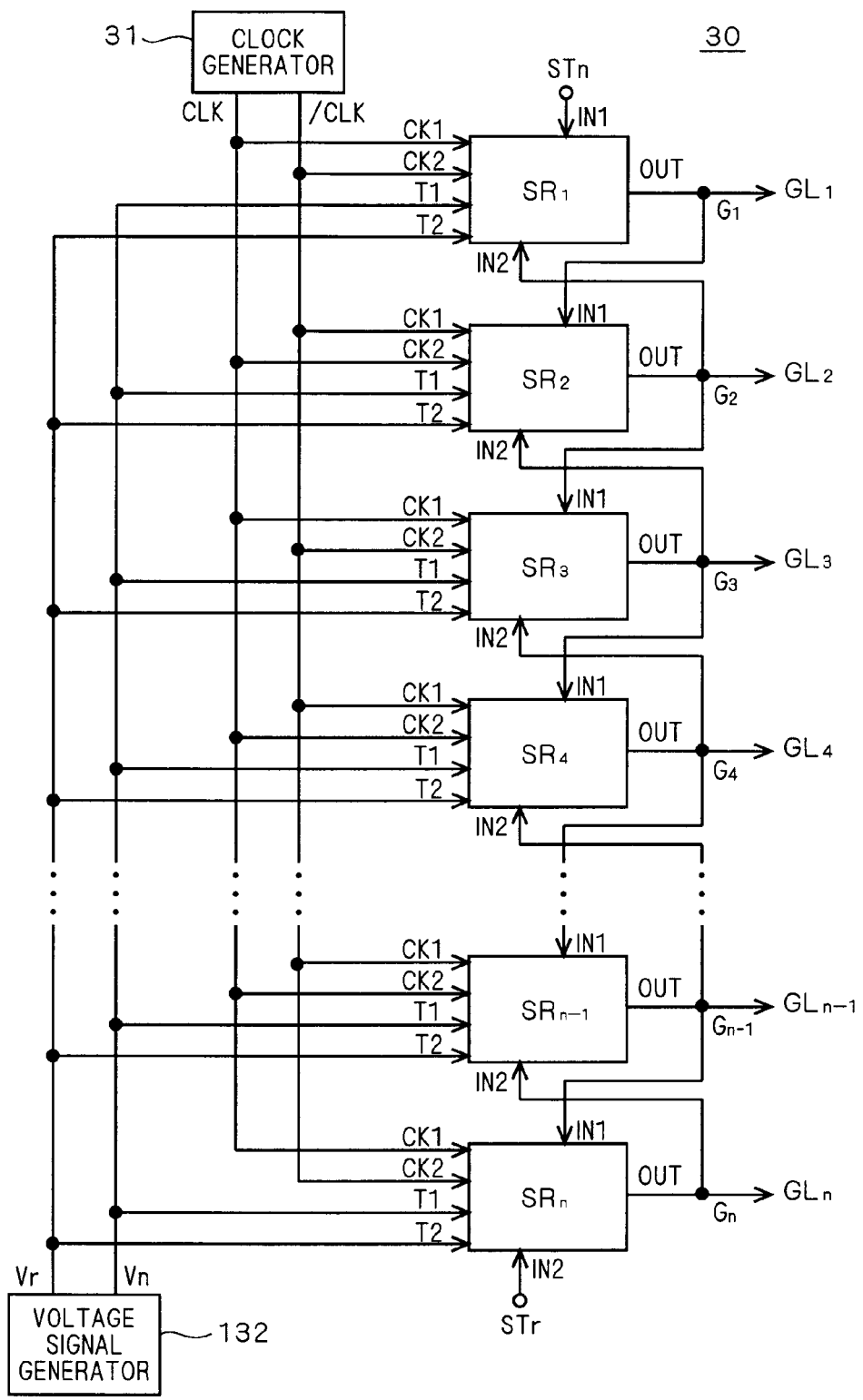
FIG. 7 is a block diagram showing a configuration of a gate line driving circuit according to a first preferred embodiment.

Now, the gate line driving circuit 30 and the bidirectional unit shift registers as constituents thereof according to the present invention will be described. FIG. 7 shows a configuration of the gate line driving circuit 30 according to the first preferred embodiment. This gate line driving circuit 30 is also constituted by a multi-stage shift register including a plurality of cascade-connected bidirectional unit shift registers $SR_1$, $SR_2$, $SR_3$, $SR_4$, . . . $SR_n$.

As shown in FIG. 7, each unit shift register SR according to the first preferred embodiment has the first input terminal IN1, the second input terminal IN2, the output terminal OUT, the first clock terminal CK1, the second clock terminal CK2, the first voltage-signal terminal T1, and the second voltage-signal terminal T2.

The first clock terminal CK1 corresponds to the clock terminal CK in the circuit of FIG. 3 and receives either one of the clock signals CLK and /CLK that is different from the one inputted to the adjacent unit shift registers SR of its preceding and subsequent stages. The second clock terminal CK2 is supplied with either one of the clock signals CLK and /CLK that is different in phase from the one inputted to the first clock terminal CK1.

Also in the case of FIG. 7, the first input terminal IN1 of the unit shift register $SR_1$ of the first stage, which is the foremost stage, receives the first control pulse STn. The first control pulse STn becomes a start pulse that corresponds to the head of each frame period of an image signal for a forward shift and becomes an end pulse that corresponds to the end of each frame period of an image signal for a backward shift. The first input terminal IN1 of the unit shift register SR of the second or subsequent stage receives the output signal of the preceding stage.

The second input terminal IN2 of the unit shift register $SR_n$ of the nth stage, which is the last stage, receives the second control pulse STr. The second control pulse STr becomes a start pulse for the backward shift and becomes an end pulse for the forward shift. The second input terminal IN2 of the (n−1)th or previous stage receives the output signal of the subsequent stage.

FIG. 8 is a circuit diagram showing a configuration of a bidirectional unit shift register SR according to the first preferred embodiment. Herein, also, a configuration of one unit shift register SR will be described representatively. It is assumed that transistors which are constituents of this unit shift register SR are all N-type a-Si TFTs. However, the application of the present invention is not limited to a-Si TFTs, and the present invention is also applicable to a unit shift register constituted by, for example, organic TFTs or the like.

As shown in FIG. 8, an output stage of the unit shift register SR is constituted by a transistor Q1 connected between the output terminal OUT and the first clock terminal CK1; and transistors Q2 and Q8 both connected between the output terminal OUT and the first power supply terminal S1. In other words, the transistor Q1 is a transistor (first transistor) that supplies a clock signal inputted to the first clock terminal CK1 to the output terminal OUT, and the transistors Q2 and Q8 are transistors (second transistors) that supply a potential (low power supply potential VSS) at the first power supply terminal S1 to the output terminal OUT thereby to discharge the output terminal OUT. As shown in FIG. 8, a node connected to the gate (control electrode) of the transistor Q1 is defined as a node (first node) N1.

A capacitive element C1 is provided between the gate and source of the transistor Q1, i.e., between the node N1 and the output terminal OUT. This capacitive element C1 is provided to enhance the effect of boosting the voltage at the node N1 associated with a rise in the level of the first output terminal OUT.

As in the circuit of FIG. 3, a transistor Q3 with its gate connected to the first input terminal IN1 is connected between the node N1 and the first voltage-signal terminal T1 to which a first voltage signal Vn is inputted, and a transistor Q4 with its gate connected to the second input terminal IN2 is connected between the node N1 and the second voltage-signal terminal T2 to which a second voltage signal Vr is inputted. In other words, the transistor Q3 is a transistor (third transistor) that supplies the first voltage signal Vn to the node N1 based on a signal (first input signal) inputted to the first input terminal IN1. The transistor Q4 is a transistor (fourth transistor) that supplies the second voltage signal Vr to the node N1 based on a signal (second input signal) inputted to the second input terminal IN2.

Also in this preferred embodiment, the first voltage signal Vn and the second voltage signal Vr are complementary to each other in such a manner that their levels are switched according to the direction of shift of the signals. Specifically, the first voltage signal Vn becomes HIGH level and the second voltage signal Vr becomes LOW level for a forward shift, while the second voltage signal Vr becomes HIGH level and the first voltage signal becomes LOW level for a backward shift.

The node N1 is connected to first and second pull-down circuits 41 and 42 that discharge (pull down) the node N1. These first and second pull-down circuits 41 and 42 operate in such a manner that they discharge the node N1 during the non-selected period of the unit shift register SR (during the period when the node N1 is not charged), and that they do not discharge the node N1 during the period (selected period) when the unit shift register SR is selected (during the period when the node N1 is charged). In this preferred embodiment, as shown in FIG. 8, the first pull-down circuit 41 includes transistors Q5A and Q7A and a capacitive element C2A, and similarly, the second pull-down circuit 42 includes transistors Q5B and Q7B and a capacitive element C2B.

In the first pull-down circuit 41, the transistor Q5A is connected between the node N1 and the first power supply terminal S1. Herein, a node connected to the gate of the transistor Q5A is defined as a "node N3." The transistor Q7A is connected between this node N3 and the first power supply terminal S1 so that its gate is connected to the node N1. The capacitive element C2A is connected between the node N3 and the first clock terminal CK1.

The capacitive element C2A and the transistor Q7A form an inverter using the node N1 as the input end (input node) and the node N3 as the output end (output node). That is, this inverter is an inverter with capacitive load, using the capacitive element C2A as its load element, and its output is inputted to the gate of the aforementioned transistor Q5A (the fifth transistor). However, this inverter differs from traditional ones in that its power supply is a clock signal inputted to the first clock terminal CK1. That is, this inverter operates in an alternating manner by being activated by a clock signal inputted to the first clock terminal CK1. Thus, the capacitive element C2A serves not only as the load element of the inverter but also as a coupling capacitance between the output end of the inverter (the node N3) and the first clock terminal CK1.

In this preferred embodiment, the second pull-down circuit 42 has a similar configuration to the aforementioned first pull-down circuit 41. The transistor Q5B is connected between the node N1 and the first power supply terminal S1. Herein, a node connected to the gate of the transistor Q5B is defined as a "node N4." The transistor Q7B is connected between the node N4 and the first power supply terminal S1 so that its gate is connected to the node N1. The capacitive element C2B is connected between the node N4 and the second clock terminal CK2.

The capacitive element C2B and the transistor Q7B form an inverter using the node N1 as the input end and the node N4 as the output end. In other words, this inverter is an inverter with capacitive load, using the capacitive element C2B as its load element, and its output is inputted to the gate of the aforementioned transistor Q5B (the sixth transistor). However, this inverter differs from traditional ones in that its power supply is a clock signal inputted to the second clock terminal CK2. That is, this inverter operates in an alternating manner by being activated by a clock signal inputted to the second clock terminal CK2. Thus, the capacitive element C2B serves not only as the load element of the inverter but also as a coupling capacitance between the output end of the inverter (the node N4) and the second clock terminal CK2.

In this preferred embodiment, the gate of the transistor Q2 is connected to the node N3. That is, the inverter constituted by the transistor Q7B and the capacitive element C2A in the first pull-down circuit 41 also serves as a "pull-down driving circuit" for driving the transistor Q2 (which corresponds to the inverter constituted by the transistors Q6 and Q7 in FIG. 3). On the other hand, the gate of the transistor Q8 connected in parallel to the transistor Q2 is connected to the second clock terminal CK2.

Figure 9:
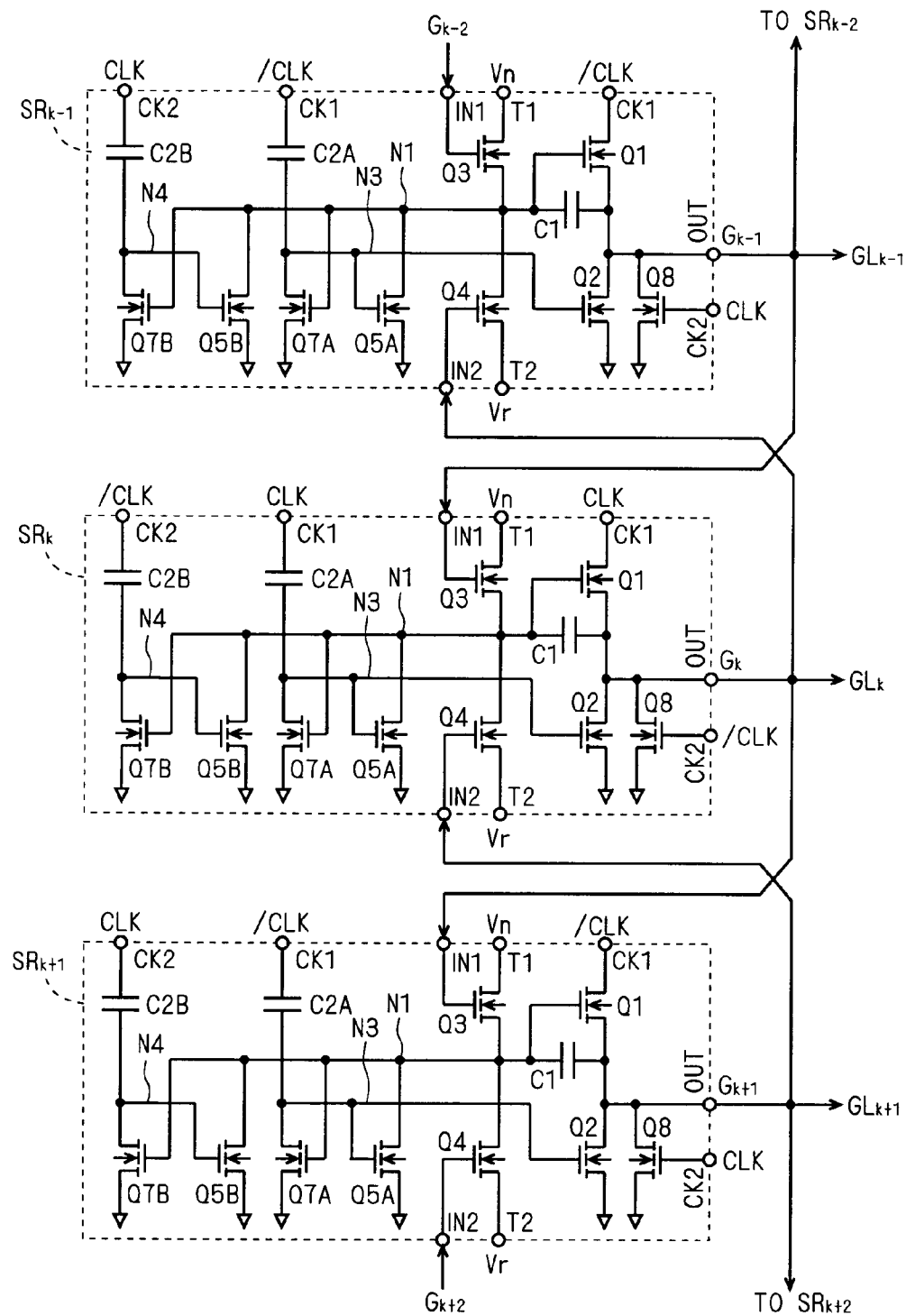
FIG. 9 is a circuit diagram showing the relationship of connection of unit shift registers according to the first preferred embodiment.

Next, the operations of the bidirectional unit shift registers SR according to the first preferred embodiment will be described. The description is given on the assumption that unit shift registers SR as shown in FIG. 8 are cascade-connected to form the gate line driving circuit 30 as shown in FIG. 7. For the sake of simplicity, the operation of a unit shift register $SR_k$ of the kth stage will be described representatively, assuming that the clock signal CLK is inputted to the first clock terminal CK1 and the clock signal /CLK is inputted to the second clock terminal CK2 in the unit shift register $SR_k$. The output signal of a unit shift register $SR_i$ of the ith stage is designated by $G_i$. FIG. 9 is a circuit diagram showing the relationship of connection of the unit shift register $SR_k$ of the kth stage, the unit shift register $SR_{k-1}$ of the preceding stage (the (k−1)th stage), and the unit shift register $SR_{k+1}$ of the subsequent stage (the (k+1)th stage).

Now, a forward shift operation of the gate line driving circuit 30 will be described. Specifically, the voltage signal generator 132 generates the first voltage signal Vn of HIGH level (VDD) and the second voltage signal Vr of LOW level (VSS).

Figure 10:
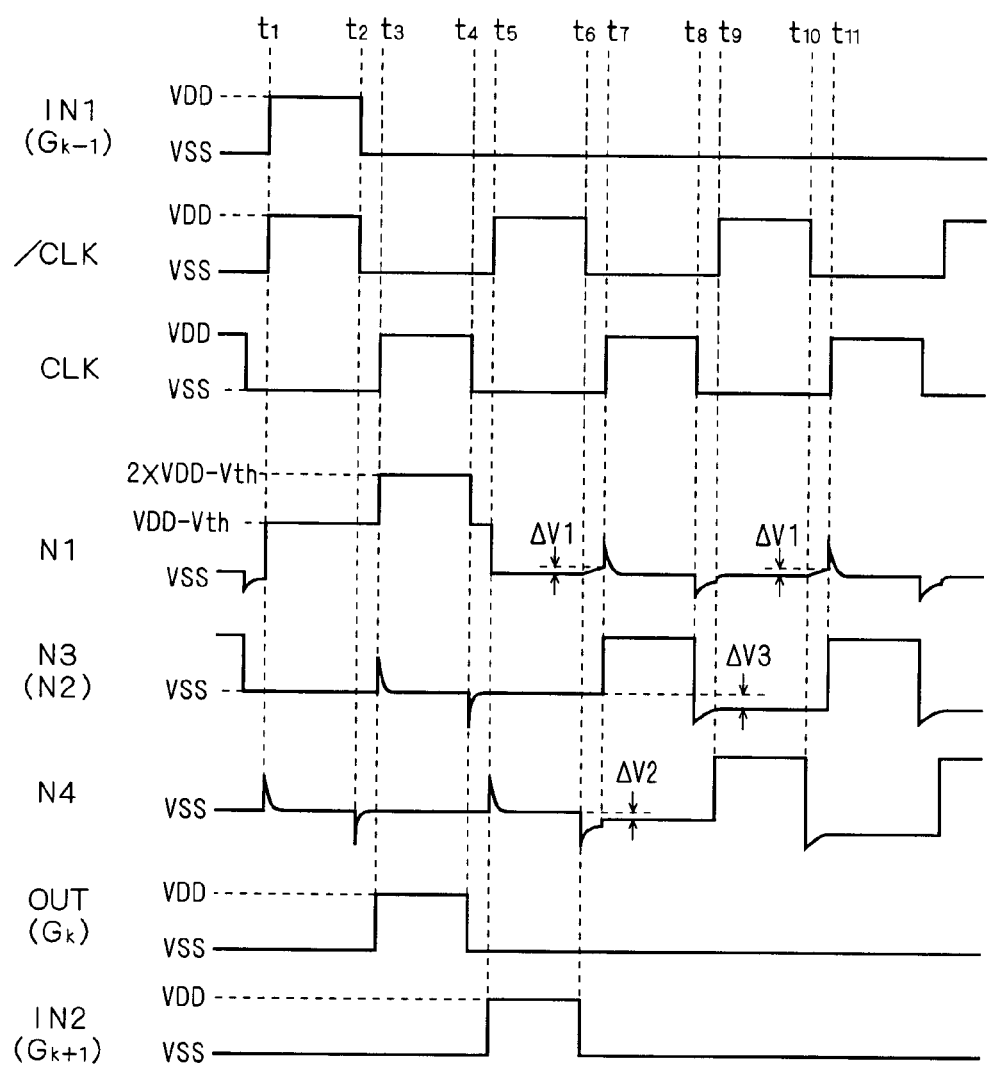
FIG. 10 is a timing chart illustrating the operation of a unit shift register according to the first preferred embodiment.

FIG. 10 is a timing chart for explaining a forward shift operation of the unit shift register $SR_k$, showing a mechanism of the unit shift register $SR_k$ of the kth stage that sets the output signal $G_k$ to HIGH level during the period when the gate line $GL_k$ is selected and that maintains the output signal $G_k$ at the LOW level during the period when the gate line $GL_k$ is not selected. Hereinbelow, the operation of the unit shift register SR according to this preferred embodiment will be described with reference to FIGS. 8 to 10.

For the sake of simplicity, the description is given on the assumption that the clock signals CLK and /CLK and the first and second voltage signals Vn and Vr all have the same high potential level and the same low potential level. The high potential level is equivalent to the high power supply potential VDD, and the low potential level is equivalent to the low power supply potential VSS. The potential VSS shall be 0V. It is also assumed that transistors which are constituents of each unit shift register SR all have the same threshold voltage, Vth.

First, an initial state of the unit shift register $SR_k$ immediately before time $t_1$ in FIG. 10 is assumed to be a reset state where the node N1 is at the LOW level. Although, during the LOW level period of the node N1, the transistors Q7A and Q7B are off and thus the nodes N3 and N4 are both in a floating state, both the nodes N3 and N4 are assumed to be at the LOW level in the above initial state. It is also assumed that, in the unit shift register $SR_k$, the first clock terminal CK1 (the clock signal CLK), the second clock terminal CK2 (the clock signal /CLK), the first input terminal IN1 (the output signal $G_{k-1}$ of the preceding stage), the second input terminal IN2 (the output signal $G_{k+1}$ of the subsequent stage), and the output terminal OUT are all at the LOW level.

Referring to FIG. 10, it is assumed that, with a rise of the clock signal /CLK at time $t_1$, the output signal $G_{k-1}$ of the unit shift register $SR_{k-1}$ of the preceding stage becomes HIGH. Then, the transistor Q3 is turned on, and the node N1 is charged to HIGH level (VDD−Vth). That is, the unit shift register $SR_k$ is brought into the set state. Correspondingly, the transistors Q1, Q7A, and Q7B are turned on.

Since, due to coupling through the capacitive element C2B, the level of the node N4 rises in response to the rise of the clock signal /CLK at time $t_1$, it can be expected that the transistor Q5B may be turned on. However, the discharge time constant of the node N1 determined by the transistor Q5B is set sufficiently higher than that of the node N4 determined by the transistor Q7B, so that the node N4 returns to LOW level (VSS) instantaneously after the transistor Q7B is turned on. In other words, although the transistor Q5B can possibly be turned on instantaneously at time $t_1$, that will not affect the operation of the unit shift register $SR_k$ (or the level of the node N1).

On the other hand, since the clock signal CLK remains at the LOW level, the node N3 is maintained at the LOW level. Accordingly, the transistor Q2 remains off. However, when the clock signal /CLK becomes HIGH at time $t_1$, the transistor Q8 is turned on so that the output terminal OUT is set to LOW level with low impedance.

When the output signals $G_{k-1}$ of the preceding stage becomes LOW with the fall of the clock signal /CLK at time $t_2$, the transistor Q3 is turned off, but the node N1 remains at the HIGH level (VDD−Vth) in a floating state. At this time, the node N4 once falls to a level lower than VSS due to coupling through the capacitive element C2B, but it instantaneously returns to VSS because the transistor Q7B is on. Thus, that will not affect the level of the node N1. Further, although the transistor Q8 is turned off, the output terminal OUT remains at the LOW level with low impedance because the transistor Q1 is on.

When the clock signal CLK rises at time $t_3$, the level of the output terminal OUT (the output signal $G_k$) correspondingly rises to HIGH level because, at this time, the transistor Q1 is on and the transistors Q2 and Q8 are off. With the rise in the level of the output terminal OUT, the level of the node N1 rises due to coupling through the gate-channel capacitance of the transistor Q1 and the capacitive element C1.

On the other hand, although the level of the node N3 tries to rise simultaneously with the rise of the clock signal CLK due to coupling through the capacitive element C2A, it will instantaneously return to LOW level (VSS) because the transistor Q7A has already been turned on. That is, the rise in the level of the node N3 at time $t_3$ is only instantaneous, and even if the transistors Q2 and Q5A are turned on, only a small current flows through those transistors. Thus, that will not affect the levels of the node N1 and the output terminal OUT.

Since, as above described, the voltage at the node N1 is boosted with a rise in the level of the output terminal OUT, the transistor Q1 can maintain a high drive capability even during the output of the output signal $G_k$. Besides, since the transistor Q1 performs a non-saturation operation, the level of the output signal $G_k$ at this time reaches VDD that is equivalent to the HIGH level of the clock signal CLK. As a result, a corresponding gate line $GL_k$ is selected.

When the clock signal CLK becomes LOW at time t4, the output signal $G_k$ follows to become LOW (VSS), whereby the state where the gate line $GL_k$ is selected comes to an end. Further, the level of the node N1 returns to VDD−Vth with a fall of the output signal $G_k$.

Although the node N3 at this time is once pulled down to a level lower than VSS due to coupling through the capacitive element C2A, it instantaneously returns to VSS because the transistor Q7A is on. Thus, that will not affect the levels of the node N1 and the output terminal OUT (the output signal $G_k$).

When the output signal $G_{k+1}$ of the unit shift register $SR_{k+1}$ of the subsequent stage becomes HIGH with the rise of the clock signal /CLK at time $t_5$, the transistor Q4 is turned on and the node N1 is discharged to LOW level. That is, the unit shift register $SR_k$ returns to its reset state.

At this time, although the level of the node N4 rises in response to the rise of the clock signal /CLK due to coupling through the capacitive element C2B, it instantaneously falls and returns to VSS because it takes a certain amount of time for the transistor Q4 to discharge the node N1, and during that time, the transistor Q7B remains on. Thus, the transistor Q5B remains off at this time and cannot discharge the node N1. However, since the transistor Q4 is on during the HIGH level period of the output signal $G_{k+1}$ of the subsequent stage, it is possible to prevent the level of the node N1 from rising due to leakage current in the transistor Q3.

When the output signal $G_{k+1}$ of the subsequent stage becomes LOW with the fall of the clock signal /CLK at time $t_6$, the transistor Q4 is turned off. On the other hand, the level of the node N4 is pulled down to VSS or lower in response to the fall of the clock signal /CLK due to coupling through the capacitive element C2B. Thereby the transistor Q7B is turned on. As will be described later, since, at this time, the level at the gate of the transistor Q7B, i.e., the level of the node N1, is almost equivalent to VSS ($\Delta V1 \approx 0$ in FIG. 10), the pulled-down level of the node N4 rises toward a level (−Vth) at which the transistor Q7B is turned off, and that rise will stop at the level of −Vth.

At this time, since the transistors Q4, Q5A, and Q5B are all off, the node N1 is set to LOW level with high impedance. Thus, the level of the node N1 is caused to rise by leakage current in the transistor Q3. However, because of a short time interval between $t_6$ and $t_7$, the amount of that rise is so small (the above $\Delta V1$) that it will not cause a malfunction in the unit shift register $SR_k$.

When the clock signal CLK rises at time $t_7$, the level of the node N1 tries to rise due to coupling through the gate-drain overlap capacitance of the transistor Q1. However, the level of the node N1 after that rise is also low because it has already been discharged by the transistor Q4. Further, the node N3 becomes HIGH in response to the rise of the clock signal CLK due to coupling through the capacitive element C2A. This causes the transistor Q5A to be turned on and accordingly causes the raised level of the node N1 to instantaneously return to LOW level (VSS). Therefore, this rise in the level of the node N1 is insufficient to turn the transistor Q1 on, so that the output signal $G_k$ is maintained at the LOW level.

In this preferred embodiment, since the transistor Q2 is turned on when the node N3 becomes HIGH, the output signal $G_k$ can be set to LOW level with low impedance. This prevents the generation of an error signal as the output signal $G_k$ with reliability.

At time $t_7$, since the gate of the transistor Q7B is biased with an instantaneous rise in the level of the node N1, the level of the node N4 rises somewhat from −Vth (ΔV2<|−Vth| in FIG. 10).

When the clock signal CLK falls at time $t_8$, the level of the node N1 is pulled down due to coupling through the gate-drain overlap capacitance of the transistor Q1. At this time, since the node N1 falls to a level lower than VSS, the transistor Q4 whose gate potential is VSS is turned on, and the level of the node N1 rises toward −Vth. The node N1 also rises due to leakage current in the transistor Q3.

At time $t_8$, the node N3 becomes LOW due to coupling through the capacitive element C2A. The level of the node N3 at this time is lower than VSS. Although the level of the node N3 is difficult to rise because the level of the node N1 is also lower than VSS as described above, it will rise following a rise in the level of the node N1.

When the clock signal /CLK rises at time $t_9$, the level of the node N4 becomes HIGH due to coupling through the capacitive element C2B. Accordingly, the transistor Q5B is turned on, and the level of the node N1 becomes almost VSS. As a result, the level of the node N3 becomes −Vth (ΔV3=|−Vth| in FIG. 10).

In this preferred embodiment, the transistor Q2 is turned off at time $t_8$, but the transistor Q8 connected in parallel to the transistor Q2 is turned on at time $t_9$ so that the output terminal OUT is set to LOW level with low impedance. This prevents the generation of an error signal as the output signal $G_k$ with reliability.

When the clock signal /CLK falls at time $t_{10}$, the level of the node N4 becomes LOW due to coupling through the capacitive element C2B. Since, at this time, the level of the node N4 falls to a level lower than VSS by the threshold voltage or more, the transistor Q7B is turned on. Since the level at the gate of the transistor Q7B, i.e., the level of the node N1, is almost equivalent to VSS, the level of the node N4 rises toward a level (−Vth) at which the transistor Q7B is turned off, and that rise will stop at the level of −Vth.

On the other hand, since the transistor Q5B is turned off, the node N1 is set to VSS with high impedance. Thus, the level of the node N1 is caused to rise by leakage current in the transistor Q3; however, the amount of that rise (ΔV1) is small because of a short time interval between $t_{10}$ and $t_{11}$.

Assuming that there is no second pull-down circuit 42 provided, the node N1 is in a floating state during a time interval between $t_8$ and $t_{11}$, during which interval the level of the node N1 continues to rise due to leakage current from the transistor Q3. Consequently, when the level of the node N1 rises in response to the rise of the clock signal CLK at time $t_{11}$, it is likely to exceed Vth. In other words, it is likely that the transistor Q1 will be turned on, thereby causing such a malfunction that an error signal is outputted as the output signal $G_k$. The second pull-down circuit 42 mainly serves to prevent such a malfunction.

In the unit shift register $SR_k$ with the second pull-down circuit 42 according to this preferred embodiment, even if the level of the node N1 tries to rise with the rise of the clock signal CLK at time $t_{11}$, the level after the rise can be kept low because it has already been discharged by the second pull-down circuit 42 (the transistor Q5B). At time $t_{11}$, the node N3 becomes HIGH due to coupling through the capacitive element C2A. This causes the transistor Q5A to be turned on and accordingly causes the raised level of the node N1 to instantaneously return to LOW level (VSS). Thus, this rise in the level of the node N1 is insufficient to turn the transistor Q1 on, so that the output signal $G_k$ is maintained at the LOW level.

From then on, the aforementioned operation between $t_7$ and $t_{11}$ is repeated until the next time that the output signal $G_{k-1}$ of the preceding stage is inputted to the first input terminal IN1 (i.e., until the selected period in the next frame).

When the gate line driving circuit 30 performs a backward shift operation, the first voltage signal Vn becomes LOW (VSS) and the second voltage signal Vr becomes HIGH (VDD). Accordingly, the transistor Q3 serves as a transistor for discharging (pulling down) the node N1, and the transistor Q4 serves as a transistor for charging (pulling up) the node N1. This allows a backward shift operation. Also in this case, the first and second pull-down circuits 41 and 42 operate in the same manner as described above in the case of the forward shift.

Now, the aforementioned operation will be conceptually described. When the unit shift register $SR_k$ shifts to a state where it is selected, the node N1 is charged to HIGH level. Accordingly, the node N3 that is the output end of the inverter (the capacitive element C2A and the transistor Q7A) in the first pull-down circuit 41, and the node N4 that is the output end of the inverter (the capacitive element C2B and the transistor Q7B) in the second pull-down circuit 42 are both fixed at the LOW level. As a result, the transistors Q5A and Q5B are turned off and the node N1 is maintained at the HIGH level in a floating state. Thus, the next time when the clock signal CLK becomes HIGH, the voltage at the node N1 is boosted as in the case of the conventional circuit shown in FIG. 3, and the output signal $G_k$ is outputted from the output terminal OUT (as described above, both the transistors Q2 and Q8 are off when the output signal $G_k$ is outputted).

On the other hand, during the non-selected period of the unit shift register $SR_k$, since the node N1 becomes LOW, the inverter in the first pull-down circuit 41 is activated by the clock signal CLK and its output end, i.e., the node N3, becomes HIGH. When the inverter in the second pull-down circuit 42 is activated by the clock signal /CLK, its output end, i.e., the node N4, becomes HIGH. Thus, the node N1 is pulled down (set to LOW level with low impedance) by the transistor Q5A during activation (HIGH level) of the clock signal CLK, while it is pulled down by the transistor Q5B during activation of the clock signal /CLK.

In other words, since the first and second pull-down circuits 41 and 42 alternately discharge charges at the node N1 (the charge accumulated by leakage current in the transistors Q3 and Q4) in synchronization with the clock signals CLK and /CLK, respectively, the node N1 can be set to LOW level with low impedance during almost all the non-selected period. Besides, since the gates of the transistors Q5A and Q5B are not dc-biased, the threshold voltage shifts thereof, i.e., deterioration in the drive capabilities thereof, can be reduced. This prevents a rise in the level of the node N1 with reliability, thereby preventing a malfunction in the unit shift register $SR_k$.

In this preferred embodiment, the gate of the transistor Q2 for pulling down the output terminal OUT is connected to the node N3 (the output end of the inverter in the first pull-down circuit 41 that is activated by the clock signal CLK), and the gate of the transistor Q8 connected in parallel to the transistor Q2 receives the clock signal /CLK. Thus, the gates of the transistors Q2 and Q8 are not dc-biased, and the transistors Q2 and Q8 can pull down the output terminal OUT alternately. This reduces the threshold voltage shifts of the transistors Q2 and Q8, thereby preventing the generation of an error signal as the output signal $G_k$ with more reliability during the non-selected period.

While the foregoing description has given the example that there is a certain time interval between the HIGH level period of the clock signal CLK and the HIGH level period of the clock signal /CLK, this time interval may be omitted. That is, a two-phase clock may be such that the clock signal /CLK falls simultaneously with the rise of the clock signal CLK, and the clock signal /CLK rises simultaneously with the fall of the clock signal CLK. The same applies to the following preferred embodiments.

Second Preferred Embodiment

Hereinbelow, variations of the first pull-down circuit 41 and the second pull-down circuit 42 in the unit shift register SR according to the present invention will be described. As will be described later, as to the first pull-down circuit 41, the one described in the first preferred embodiment (FIG. 8) is basically preferable. Thus, the following description is mainly related to the details of variations of the second pull-down circuit 42.

Figure 11A:
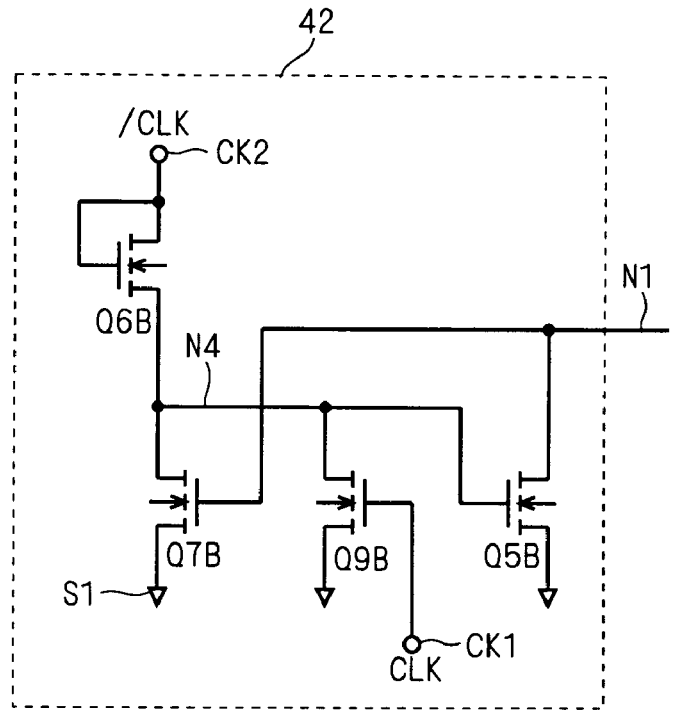
FIGS. 11A and 11B are circuit diagrams of first and second pull-down circuits according to a second preferred embodiment.

FIG. 11A is a circuit diagram of the second pull-down circuit 42 according to a second preferred embodiment. FIG. 11A shows an example that the clock signal CLK is inputted to the first clock terminal CK1 and the clock signal /CLK is inputted to the second clock terminal CK2 (the same applies to each circuit diagram of FIG. 12 and following drawings).

According to this preferred embodiment, in contrast to the second pull-down circuit 42 of FIG. 8, the capacitive element C2B is replaced by transistors Q6B and Q9B. The transistor Q6B is connected between the second clock terminal CK2 and the node N4 so that its gate is connected to the second clock terminal CK2. In other words, the transistor Q6B is diode-connected so that the direction from the second clock terminal CK2 to the node N4 becomes the conducting direction (the second clock terminal CK2 side becomes the anode, and the node N4 side becomes the cathode). The transistor Q9B is connected between the node N4 and the first power supply terminal S1 so that its gate is connected to the first clock terminal. The on-resistance of the transistor Q6B is set sufficiently higher than that of the transistor Q7B, and the transistors Q6B and Q7B form a ratio inverter.

As described in the first preferred embodiment, the second pull-down circuit 42 in the unit shift register SR according to the present invention swings the level of the node N4 in synchronization with a clock signal inputted to the second clock terminal CK2 (i.e., a clock signal that is different in phase from the one inputted to the first clock terminal CK1) during the non-selected period, thereby to control the threshold voltage shift of the transistor Q5B. The second pull-down circuit 42 in FIG. 8 charges and discharges the node N4 during the non-selected period by means of coupling through the capacitive element C2B.

On the other hand, in the second pull-down circuit 42 in FIG. 11A, the transistor Q6B charges the node N4 in response to a clock signal inputted to the second clock terminal CK2, and the transistor Q9B discharges the node N4 in response to a clock signal inputted to the first clock terminal CK1. A resultant level transition of the node N4 is almost identical to that in the case of the second pull-down circuit 42 of FIG. 8, so that the same effect as described in the first preferred embodiment can be achieved.

Using not the capacitive element C2B but the transistor Q6B as a load element of the inverter in the second pull-down circuit 42 allows an increase in the HIGH level of the node N4 (to VDD-Vth) with a circuit having a relatively small area. It is, however, to be noted that feedthrough current that flows between the second clock terminal CK2 and the first power supply terminal S1 during the HIGH level period of the node N1 would increase power consumption.

Figure 11B:
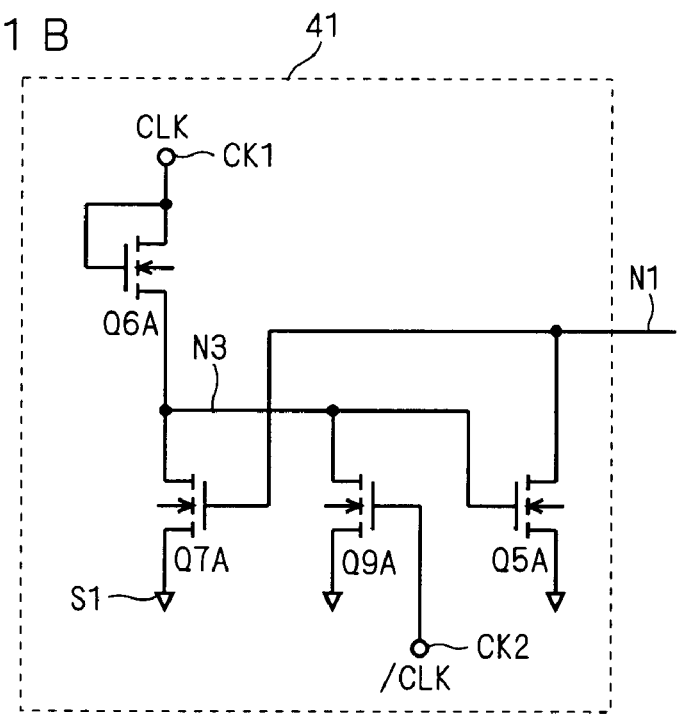

This preferred embodiment is also applicable to the first pull-down circuit 41. More specifically, as shown in FIG. 11B, the capacitive element C2A in FIG. 8 may be replaced by transistors Q6A and Q9A. In this case, the transistor Q6A is diode-connected between the first clock terminal CK1 and the node N3. The transistor Q9A is connected between the node N2 and the first power supply terminal S1 so that its gate is connected to the second clock terminal CK2. A resultant level transition of the node N3 is almost identical to that in the case of the first pull-down circuit 41 shown in FIG. 8, so that the same effect as described in the first preferred embodiment can be achieved.

However, as previously described, as to the first pull-down circuit 41, the one shown in FIG. 8 is basically preferable. Now, the reason for this will be described.

The first pull-down circuit 41 prevents the level of the node N1 from rising due to coupling through the gate-drain overlap capacitance of the transistor Q1 when a clock signal is inputted to the first clock terminal CK1 (the drain of the transistor Q1). In order for the first pull-down circuit 41 to function satisfactorily, the transistor Q5A needs to be turned on with low impedance at high speed with a rise of a clock signal inputted to the first clock terminal CK1. That is, it is desirable that the gate of the transistor Q5A (the node N3) can be charged to a high level at high speed.

In this regard, if the node N3 is charged by means of coupling through the capacitive element C2A as in the first pull-down circuit 41 of FIG. 8, the charging speed is fast and the node N3 can be charged to a high level if the capacitance value of the capacitive element C2A is set sufficiently higher than the parasitic capacitance of the node N3.

On the other hand, in the case where the node N3 is charged by the transistor Q6A as in the first pull-down circuit 41 of FIG. 11B, the charging speed is slower than in the case of using the capacitive element C2A. Further, the node N1 becomes HIGH during the period when the unit shift register SR is selected, so that the transistor Q7A is turned on and the node N3 is fixed at the LOW level. That period includes a period when a clock signal at the first clock terminal CK1 is activated, so that the gate of the transistor Q6 is positively biased although it is a short time. If that causes the threshold voltage shift of the transistor Q6A and accordingly reduces the drive capability thereof, not only the speed of charging the node N3 is reduced but also charging the node N3 to a high level becomes difficult.

Thus, as to the first pull-down circuit 41, the circuit of FIG. 8 is more advantageous. However, if usage conditions, the size of the transistor Q6A or the like are selected properly, the first pull-down circuit 41 shown in FIG. 11B also is sufficiently applicable to the present invention.

Third Preferred Embodiment

Figure 12A:
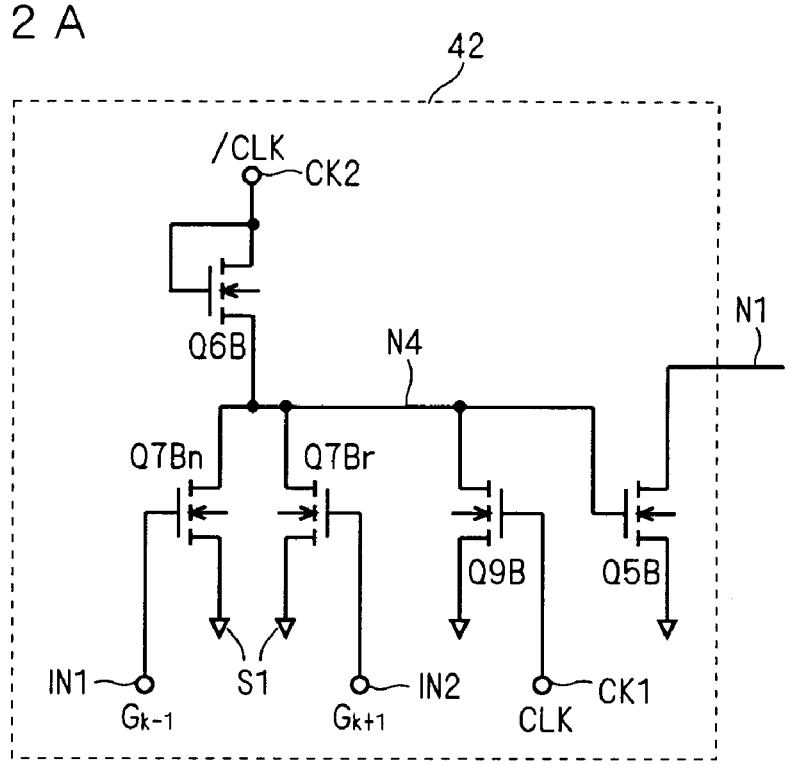
FIGS. 12A and 12B are circuit diagrams of first and second pull-down circuits according to a third preferred embodiment.

FIG. 12A is a circuit diagram of the second pull-down circuit 42 according to a third preferred embodiment. According to this preferred embodiment, in contrast to the circuit of FIG. 11A, the transistor Q7B is replaced by two transistors Q7Bn and Q7Br. The transistor Q7Bn is connected between the node N4 and the first power supply terminal S1 so that its gate is connected to the first input terminal IN1. The transistor Q7Br is connected between the node N4 and the first power supply terminal S1 so that its gate is connected to the second input terminal IN2

The on-resistance of the transistor Q6B is set sufficiently higher than those of the transistors Q7Bn and Q7Br so that a pair of the transistors Q6B and Q7Bn and a pair of the transistors Q6B and Q7Br each form a ratio inverter. In other words, the on-resistances of the transistors Q7Bn and Q7Br are set sufficiently lower then that of the transistor Q6B. Thus, assuming that the second clock terminal CK2 is at the HIGH level in the circuit constituted by the transistors Q6B, Q7Bn, and Q7Br, the level of the node N4 becomes HIGH (active) when the first and second input terminals IN1 and IN2 are both at the LOW (inactive) level, while the level of the node N4 becomes LOW when at least one of the first and second input terminals IN1 and IN2 is at the HIGH level. That is, the circuit constituted by the transistors Q6B, Q7Bn, and Q7Br serves as a NOR circuit using the first and second input terminals IN1 and IN2 as the input ends (input nodes) and the node N4 as the output end (output node). However, this NOR circuit differs from traditional ones in that its power supply is a clock signal inputted to the second clock terminal CK2. Thus, this NOR circuit operates in an alternating manner by being activated by a clock signal inputted to the second clock terminal CK2.

In the second pull-down circuits 42 shown in FIGS. 8 and 11A, at the beginning of the period when the unit shift register SR is selected, the level of the node N1 is set to HIGH and the transistor Q7B is turned on to pull down (discharge) the node N4. This causes the transistor Q5B to be turned off, thereby allowing the node N1 to be charged to a sufficiently high level.

According to this preferred embodiment, when a multistage shift register performs a forward shift operation, the transistor Q7Bn pulls down the node N4 in response to the output signal $G_{k-1}$ of the preceding stage (i.e., the transistor Q7Bn functions like the transistor Q7B of FIGS. 8 and 11A). In that case, the transistor Q7Br is turned on in response to the output signal $G_{k+1}$ of the subsequent stage, but is irrelevant to the shift operation of the signals. On the other hand, for a backward shift operation, the transistor Q7Br pulls down the node N4 in response to the output signal $G_{k+1}$ of the subsequent stage (i.e., the transistor Q7Br functions like the transistor Q7B of FIGS. 8 and 11A). The transistor Q7Bn is turned on in response to the output signal $G_{k-1}$ of the preceding stage, but is irrelevant to the shift operation of the signals.

As compared with the cases of FIGS. 8 and 11A, the number of transistors whose gates are connected to the node N1 is reduced, so that the node N1 is accompanied with a smaller parasitic capacitance. Accordingly, charging the node N1 and boosting the voltage at the node N1 become easier. While, in FIGS. 8 and 11A, the transistors Q7B and Q5B form a flip-flop circuit so that the transition of the node N1 from LOW to HIGH levels is relatively difficult, that becomes easy in this preferred embodiment. That is, the node N1 can be readily charged to a high potential, which contributes to an improvement in the drive capability of the transistor Q1.

Figure 12B:
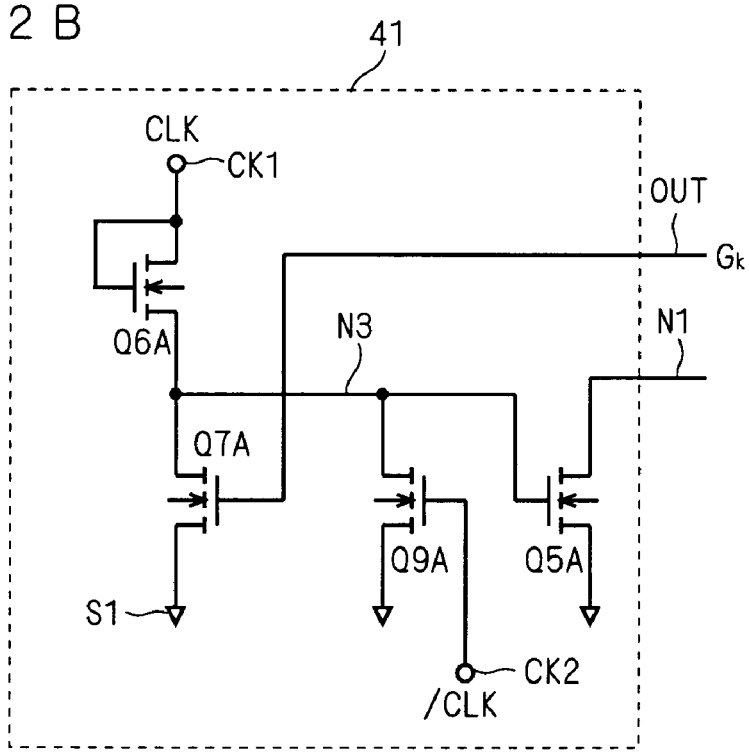

This preferred embodiment is also applicable to the first pull-down circuit 41. In that case, as shown in FIG. 12B, the gate of the transistor Q7A is connected not to the node N1 but to the output terminal OUT. This further reduces the parasitic capacitance accompanying the node N1 and makes it easier to charge the node N1 to a high potential, which contributes to an improvement in the drive capability of the transistor Q1.

While the transistor Q7A of FIGS. 8 and 11B is ON during the HIGH level period of the node N1 (during the time between t1 and t5), the transistor Q7A of FIG. 12B is ON during the HIGH level period of the output terminal OUT (the output signal $G_k$) (during the time between t3 and t4). Although different in this respect, they function almost in the same way. There is, however, concern that, if a rise of the output signal $G_k$ lags far behind a rise of a clock signal at the first clock terminal CK1, the transistor Q6A might be turned on before activation of the output signal $G_k$ thereby to cause a rise in the level of the node N3. If that is the case, the transistor Q5A will be turned on and the level of the node N1 will fall, which raises a problem that the drive capability of the transistor Q1 is reduced at the time of the output of the output signal $G_k$.

It is thus to be noted that, for application of the first pull-down circuit 41 of FIG. 12B, it is necessary to avoid a delay in the rise of the output signal $G_k$ by sufficiently increasing the size of the transistor Q1 or the like.

Fourth Preferred Embodiment

Figure 13A:
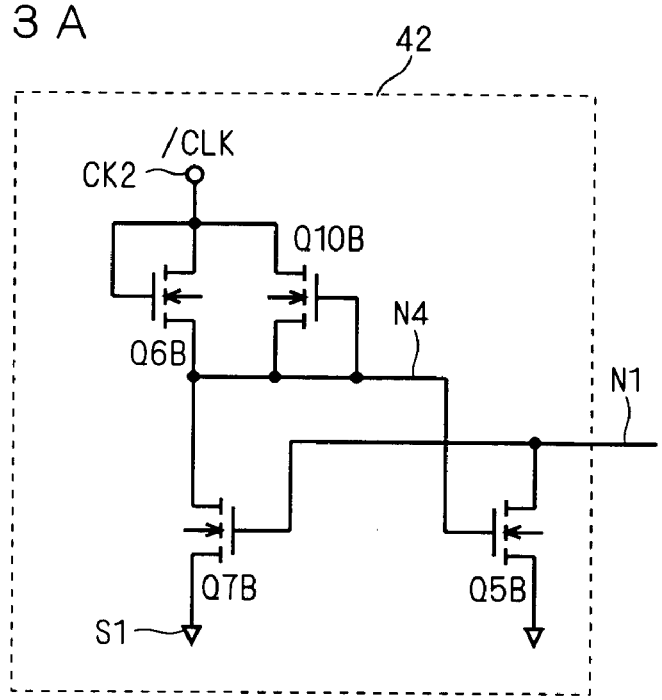
FIGS. 13A and 13B are circuit diagrams of first and second pull-down circuits according to a fourth preferred embodiment.

FIG. 13A is a circuit diagram of the second pull-down circuit 42 according to a fourth preferred embodiment. According to this preferred embodiment, in contrast to the circuit of FIG. 11A, the transistor Q9B is replaced by a transistor Q10B. The transistor Q10B is connected between the node N4 and the second clock terminal CK2 so that its gate is connected to the node N4 (i.e., the transistor Q10B is diode-connected so that the node N4 side becomes the anode, and the second clock terminal CK2 side becomes the cathode).

While the transistor Q9B of FIG. 11A discharges the node N4 when the clock signal at the first clock terminal CK1 becomes HIGH, the transistor Q10B of FIG. 13A discharges the node N4 when the clock signal at the second clock terminal CK2 becomes LOW. Since the first clock terminal CK1 and the second clock terminal CK2 input clock signals of different phases, the transistor Q10B of FIG. 13A consequently functions in the same way as the transistor Q9B of FIG. 11A.

The level of the node N4 after discharge by the transistor Q10B does not fall to VSS, but to Vth. Since this level (Vth) is nearly the LOW level, the level at the gate of the transistor Q5B is swung almost in the same way as in the case of FIG. 11A, which brings about the effect of controlling the threshold voltage shift of the transistor Q5B. Besides, the second pull-down circuit 42 of FIG. 13A does not need to be connected to the first clock terminal CK1, which brings about the effect of facilitating the circuit layout as compared with the case of FIG. 11A.

Figure 13B:
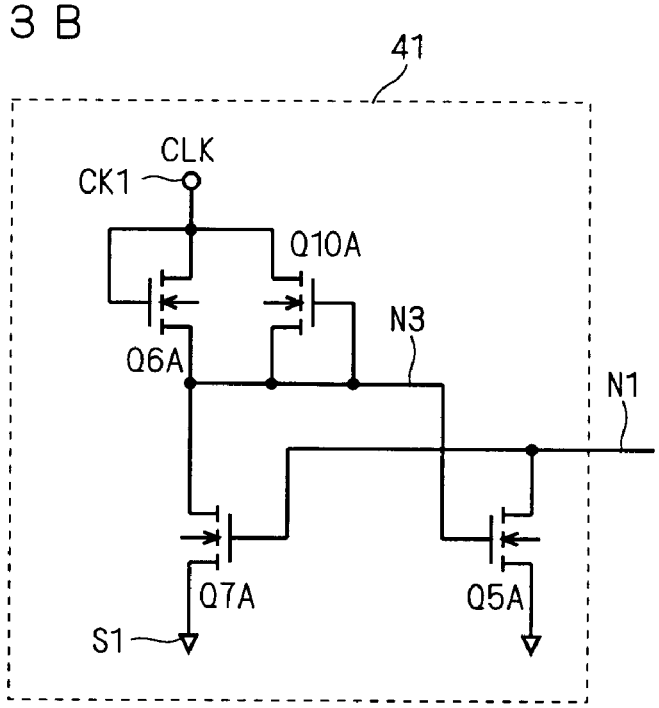

This preferred embodiment is also applicable to the first pull-down circuit 41. Specifically, as shown in FIG. 13B, the transistor Q9A may be replaced by a transistor Q10A that is diode-connected between the node N3 and the first clock terminal CK1 so that the node N3 side becomes the anode and the first clock terminal CK1 side becomes the cathode. Also in this case, almost as in the case of FIG. 11B, the gate of the transistor Q5A is not positively and continuously biased, which brings about the effect of controlling the threshold voltage shift of the transistor Q5A. Besides, the first pull-down circuit 41 of FIG. 13B does not need to be connected to the second clock terminal CK2, which brings about the effect of facilitating the circuit layout as compared with the case of FIG. 11B.

Figure 14A:
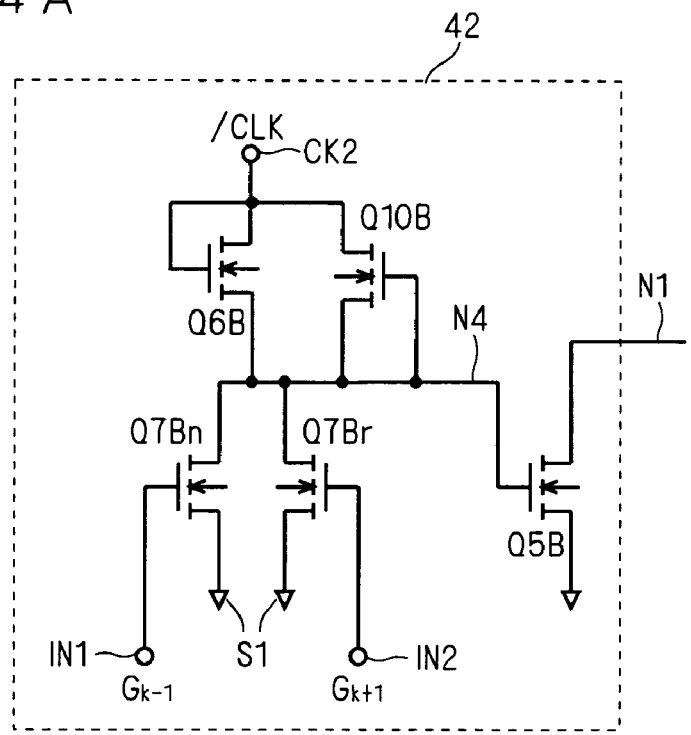
FIGS. 14A and 14B show variations of the first and second pull-down circuits according to the fourth preferred embodiment.
Figure 14B:
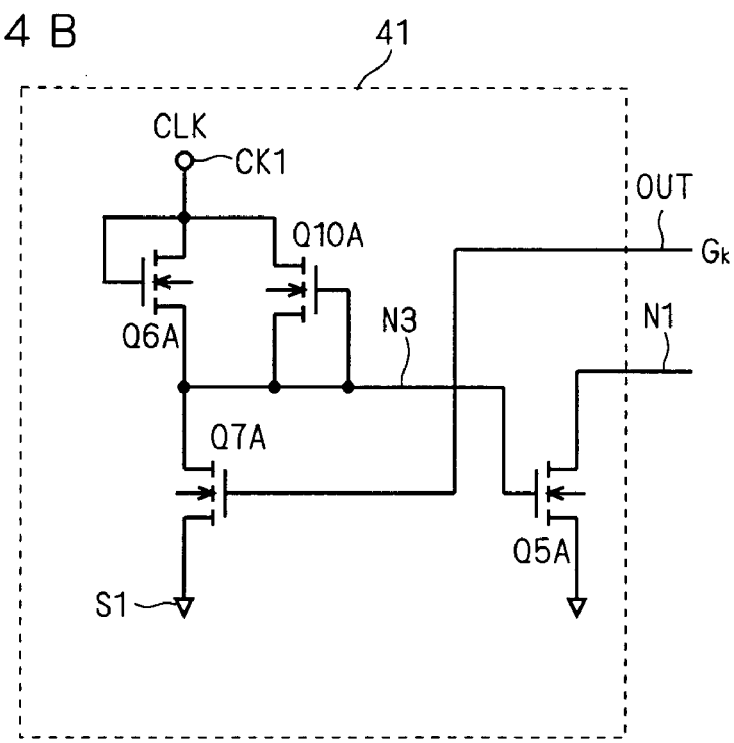

Further, this preferred embodiment is also applicable to the first and second pull-down circuits 41 and 42 according to the third preferred embodiment. An example of the application thereof is shown in FIGS. 14A and 14B. Specifically, in contrast to the circuits of FIGS. 12A and 12B, the transistors Q9B and Q9A may be replaced by the transistors Q10B and Q10A, respectively.

Fifth Preferred Embodiment

Figure 15A:
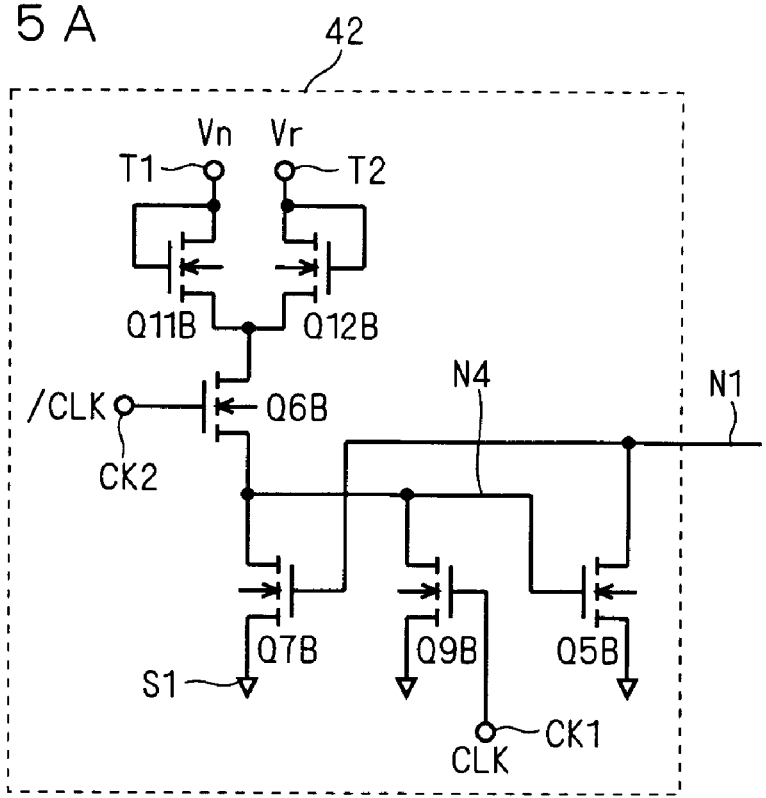
FIGS. 15A and 15B are circuit diagrams of first and second pull-down circuits according to a fifth preferred embodiment.

FIG. 15A is a circuit diagram of the second pull-down circuit 42 according to a fifth preferred embodiment. While, for example in the circuit of FIG. 11A, the transistor Q6B have both its gate and drain connected to the second clock terminal CK2 (i.e., the transistor Q6B is diode-connected between the second clock terminal CK2 and the node N4), the transistor Q6B according to this preferred embodiment has only its gate connected to the second clock terminal CK2. The drain of the transistor Q6B is supplied with the first voltage signal Vn through a diode-connected transistor Q11B and with the second voltage signal Vr through a diode-connected transistor Q12B.

In other words, the transistor Q11B is connected between the drain of the transistor Q6B and the first voltage-signal terminal T1 so that its gate is connected to the first voltage-signal terminal T1. The transistor Q12B is connected between the drain of the transistor Q6B and the second voltage-signal terminal T2 so that its gate is connected to the second voltage-signal terminal T2.

When a shift register performs a forward shift operation, the first voltage-signal Vn becomes HIGH so that the transistor Q11B is turned on. In other words, the first voltage signal Vn is supplied to the drain of the transistor Q6B as a power supply (VDD−Vth) of an inverter constituted by the transistors Q6B and Q7B. In this case, the transistor Q12B is off, so that the second voltage signal Vr will not affect the operation of the second pull-down circuit 42.

For a backward shift operation, the second voltage signal Vr becomes HIGH so that the transistor Q12B is turned on. In other words, the second voltage signal Vr is supplied as a power supply to the inverter constituted by the transistors Q6B and Q7B. In this case, the transistor Q11B is off, so that the first voltage signal Vn will not affect the operation of the second pull-down circuit 42.

According to this preferred embodiment, a reduced load capacitance on the output of a generator (the clock generator 31) for generating the clock signals CLK and /CLK brings about the effect of reducing power consumption by the generator. It is, however, to be noted that a resultant increase in the number of transistors required in the second pull-down circuit 42 increases the circuit area.

Figure 15B:
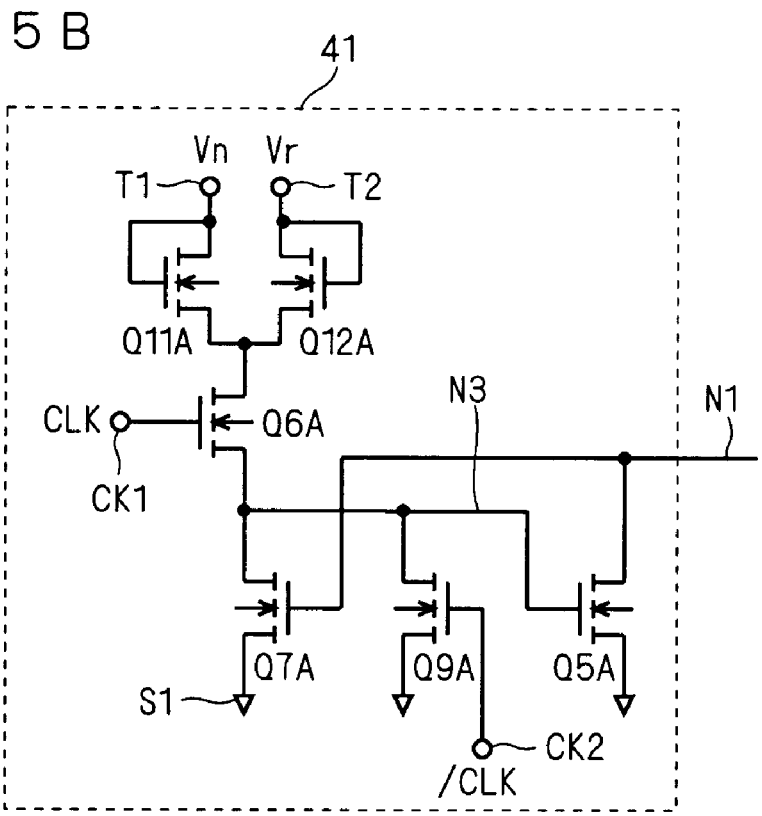

This preferred embodiment is also applicable to the first pull-down circuit 41. More specifically, as shown in FIG. 15B, the drain of the transistor Q6A may be supplied with the first voltage signal Vn through a diode-connected transistor Q11A and with the second voltage signal Vr through a diode-connected transistor Q12A. While the transistors Q11A and Q12A of the first pull-down circuit 41 and the transistors Q11B and Q12B of the second pull-down circuit 42 are separately shown respectively in FIGS. 15A and 15B, they function as power supply circuits in similar ways so that the first pull-down circuit 41 and the second pull-down circuit 42 may use such transistors in common.

Figure 16A:
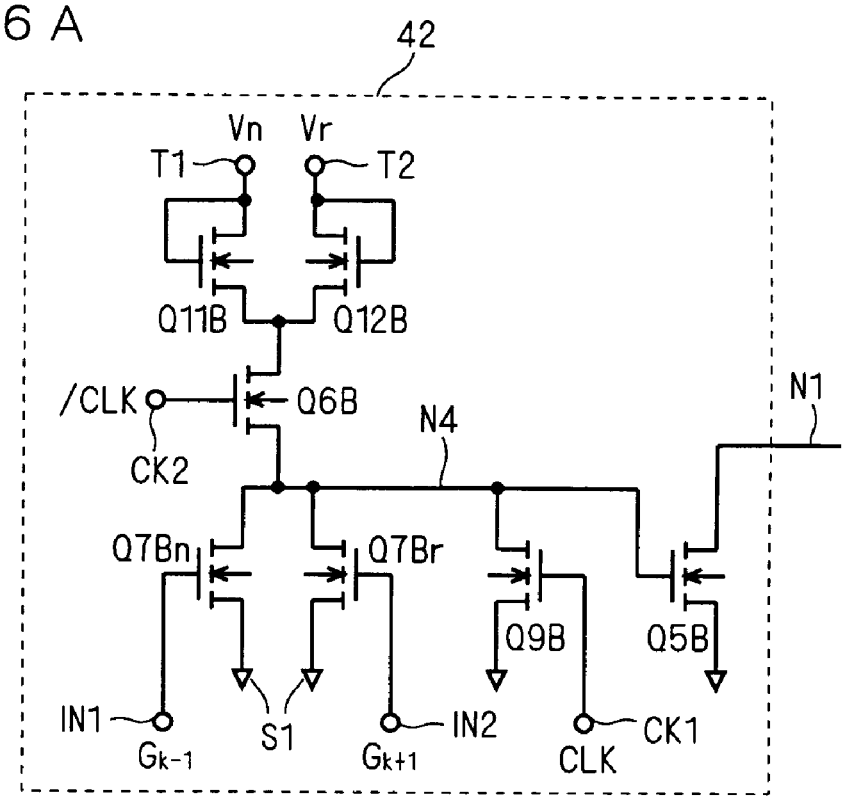
FIGS. 16A and 16B show variations of the first and second pull-down circuits according to the fifth preferred embodiment.
Figure 16B:
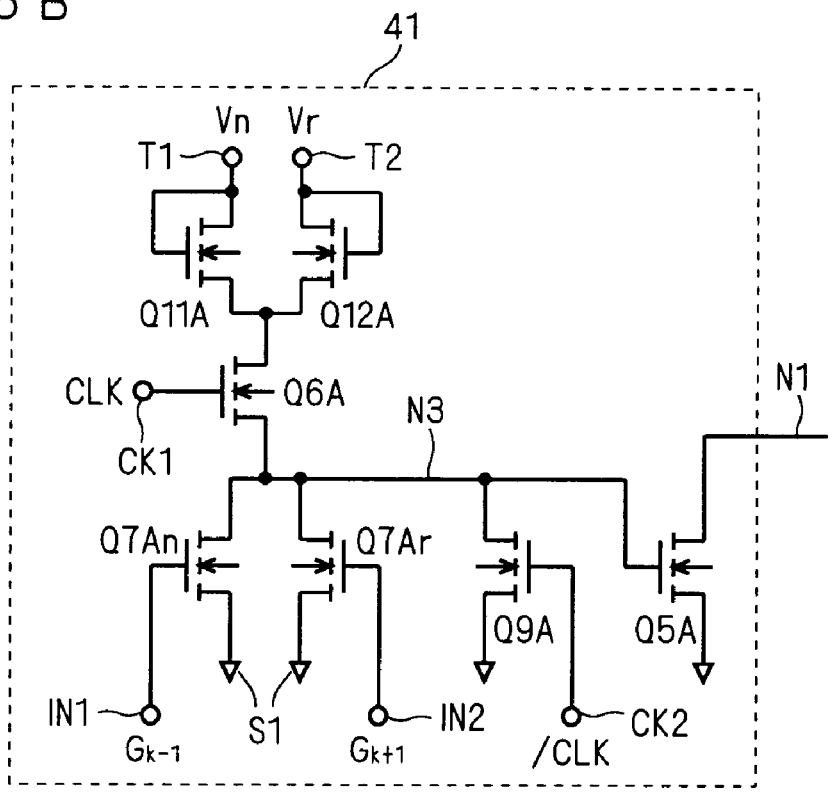

Further, this preferred embodiment is also applicable to the first and second pull-down circuits 41 and 42 according to the third preferred embodiment. An example of the application is shown in FIGS. 16A and 16B. Specifically, in contrast to the circuit of FIG. 12A, the drain of the transistor Q6B may be supplied with the first voltage signal Vn through the diode-connected transistor Q11B and with the second voltage signal Vr through the diode-connected transistor Q12B (FIG. 16A). Further, in contrast to the circuit of FIG. 12B, the drain of the transistor Q6A may be supplied with the first voltage signal Vn through the diode-connected transistor Q11A and with the second voltage signal Vr through the diode-connected transistor Q12A (FIG. 16B).

Sixth Preferred Embodiment

Figure 17A:
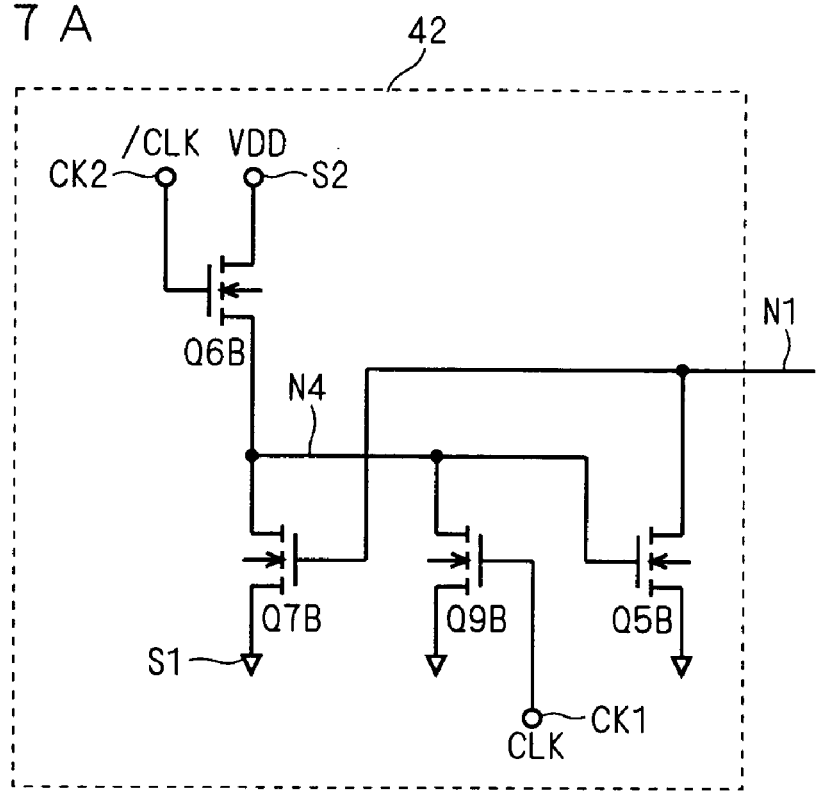
FIGS. 17A and 17B are circuit diagrams of first and second pull-down circuits according to a sixth preferred embodiment.
Figure 17B:
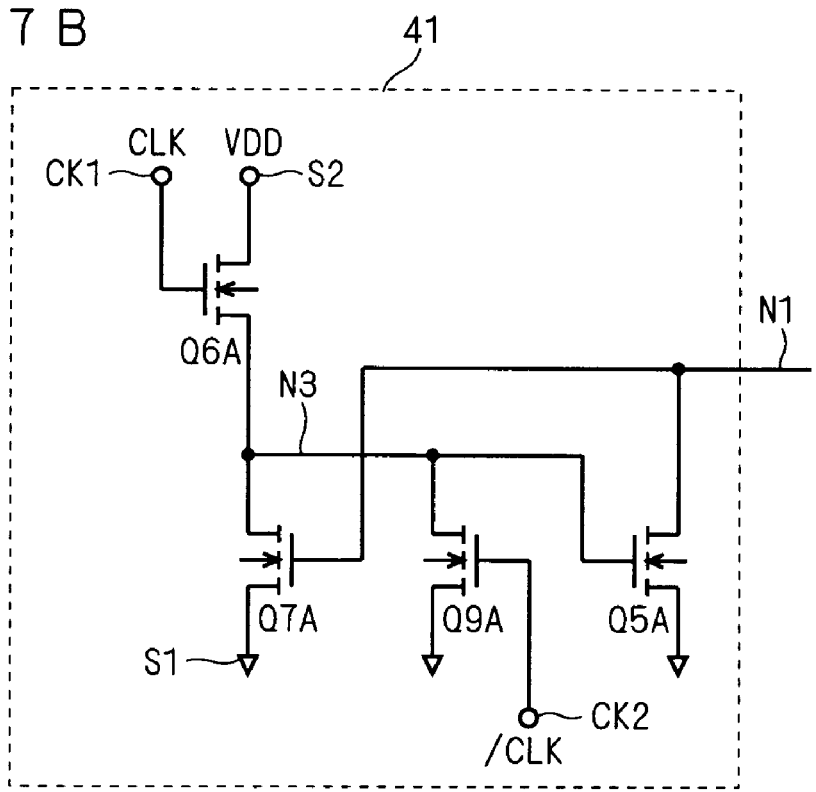

FIGS. 17A and 17B are circuit diagrams of the first and second pull-down circuits 41 and 42 according to a sixth preferred embodiment. In contrast to the circuits of FIGS. 11A and 11B, the inverters in the first and second pull-down circuits 41 and 42 are supplied with a constant high power supply potential VDD as the power supply. In other words, the drains of the transistors Q6A and Q6B are connected to the second power supply terminal S2 supplied with the high power supply potential VDD.

According to this preferred embodiment, as in the fifth preferred embodiment, a reduced load capacitance on the output of the generator (the clock generator 31) for generating the clock signals CLK and /CLK brings about the effect of reducing power consumption by the generator. It is, however, to be noted that it becomes necessary to secure an area for forming interconnection for use in supplying the potential VDD to the first and second pull-down circuits 41 and 42, which will increase the circuit area as compared with the circuits of FIGS. 11A and 11B.

Figure 18A:
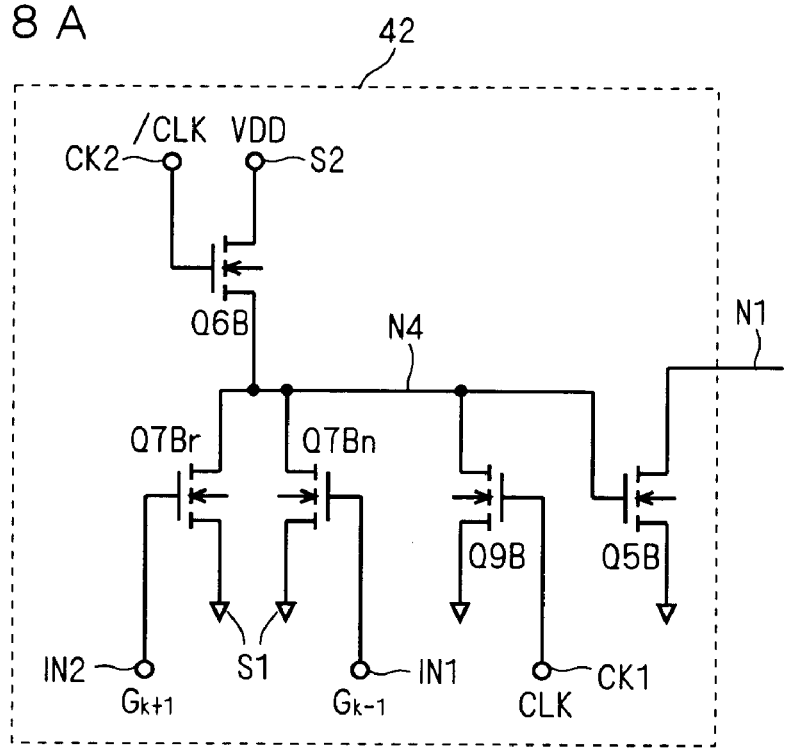
FIGS. 18A and 18B show variations of the first and second pull-down circuits according to the sixth preferred embodiment.
Figure 18B:
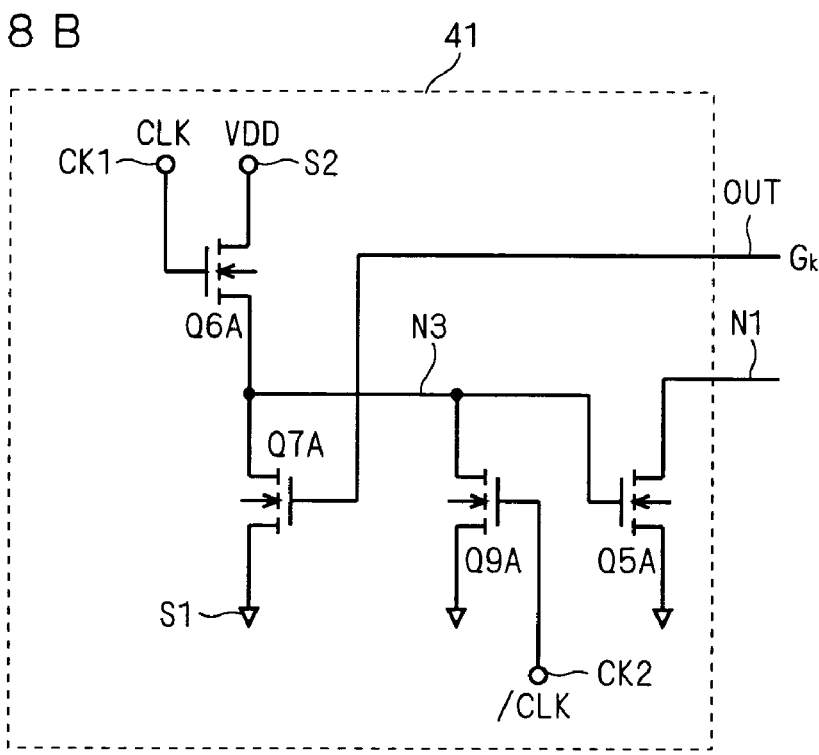

This preferred embodiment is also applicable to the first and second pull-down circuits 41 and 42 according to the third preferred embodiment. An example of the application is shown in FIGS. 18A and 18B. Specifically, in contrast to the circuits of FIGS. 12A and 12B, the drains of the transistors Q6B and Q6A are connected to the second power supply terminal S2 supplied with the high power supply potential VDD.

Seventh Preferred Embodiment

Figure 19A:
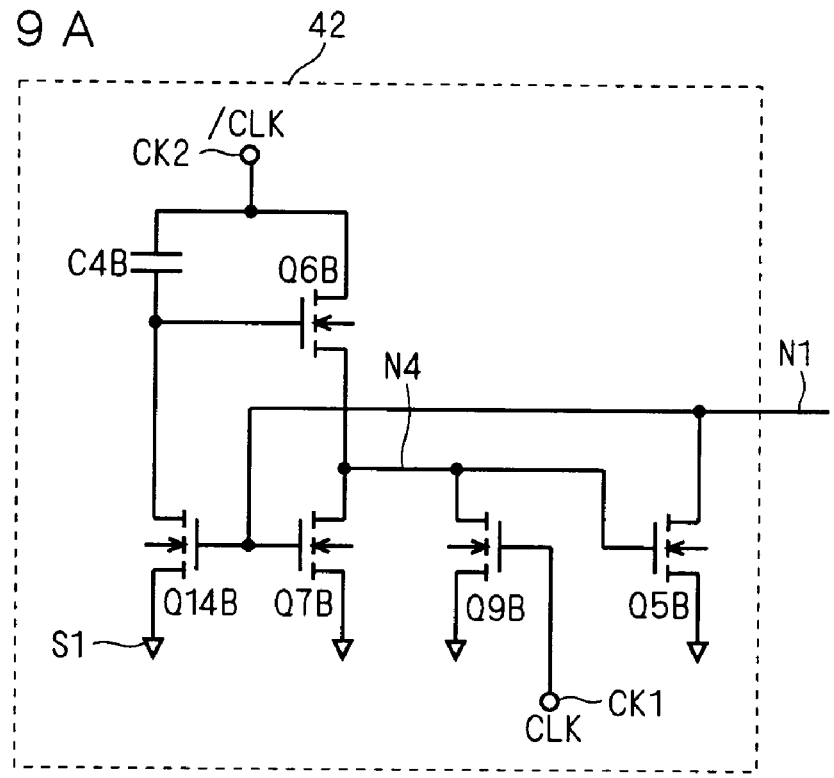
FIGS. 19A and 19B are circuit diagrams of first and second pull-down circuits according to a seventh preferred embodiment.

FIG. 19A is a circuit diagram of the second pull-down circuit 42 according to a seventh preferred embodiment. In this preferred embodiment, the transistor Q6B receives at its gate the output of an inverter that uses the node N1 as the input end and that is activated by a clock signal at the second clock terminal CK2. As shown in FIG. 19A, this inverter is constituted by a transistor Q14B connected between the gate of the transistor Q6B and the first power supply terminal S1, and a capacitive element C4B connected between the gate of the transistor Q6B and the second clock terminal CK2. For convenience of the description, the inverter constituted by the transistors Q6B and Q7B is referred to as a "first inverter," and the inverter constituted by the transistor Q14B and the capacitive element C4B as a "second inverter."

As described in the second preferred embodiment, there is concern about the second pull-down circuit of FIG. 11A that, if a clock signal at the second clock terminal CK2 becomes HIGH during the HIGH level period of the node N1, a resultant feedthrough current flowing through the first inverter will increase power consumption. On the other hand, in the second pull-down circuit 42 of FIG. 19A, the output end of the second inverter (the gate of the transistor Q6B) is fixed at the LOW level when the node N1 becomes HIGH, so that the transistor Q6B remains off. This prevents the generation of feedthrough current in the first inverter.

Further, when viewed from the second inverter, the first inverter serves as a buffer circuit. Accordingly, even if the capacitive element C4B has a smaller capacitance value than, for example, the capacitive element C2B of FIG. 8, the gate of the transistor Q5B (the node N4) can be driven satisfactorily. It is, however, to be noted that a resultant increase in the number of transistors and capacitive elements, as compared to the second pull-down circuit 42 of FIG. 11A, will increase the circuit area.

Figure 19B:
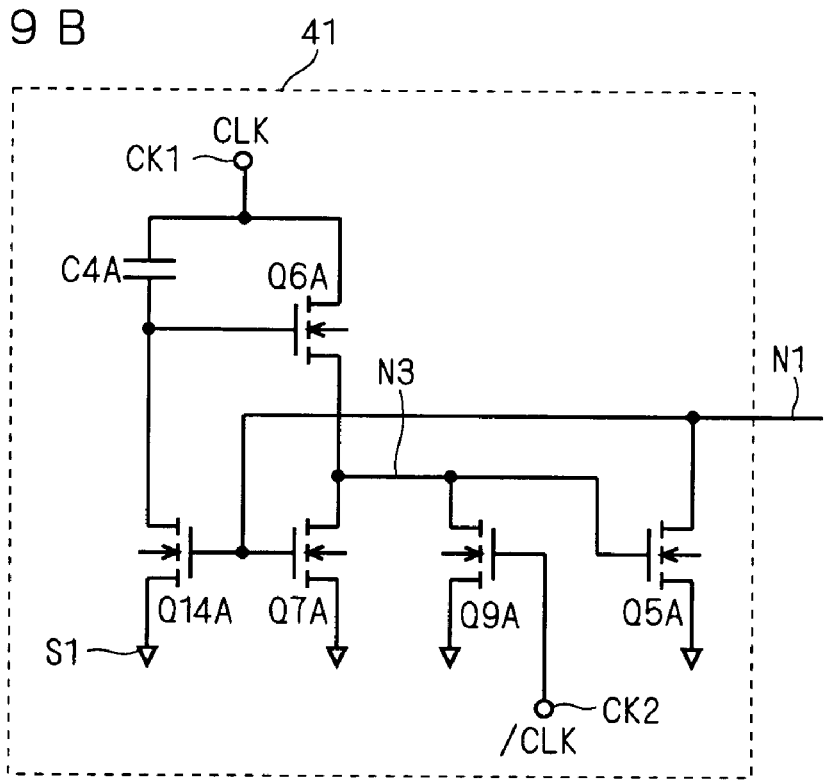

This preferred embodiment is also applicable to the first pull-down circuit 41. Specifically, the transistor Q6A of the first pull-down circuit 41 receives at its gate the output of an inverter that uses the node N1 as the input end and that is activated by a clock signal at the first clock terminal CK1. As shown in FIG. 19B, this inverter may be constituted by a transistor Q14A connected between the gate of the transistor Q6A and the first power supply terminal S1, and a capacitive element C4A connected between the gate of the transistor Q6A and the first clock terminal CK1.

In the first and second pull-down circuits 41 and 42 of FIGS. 19A and 19B, the gates of the transistors Q6A and Q6B are fixed at the LOW level during the HIGH level period of the node N1. Thus, the gates of the transistors Q6A and Q6B are not positively biased, so that there is little occurrence of the threshold voltage shifts of the transistors Q6A and Q6B.

Figure 20A:
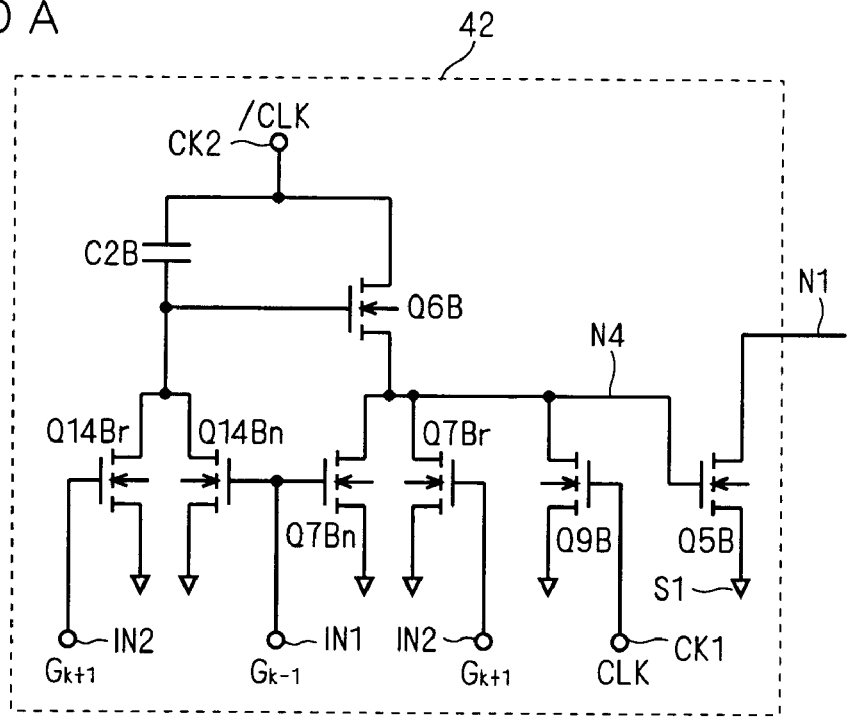
FIGS. 20A and 20B show variations of the first and second pull-down circuits according to the seventh preferred embodiment.
Figure 20B:
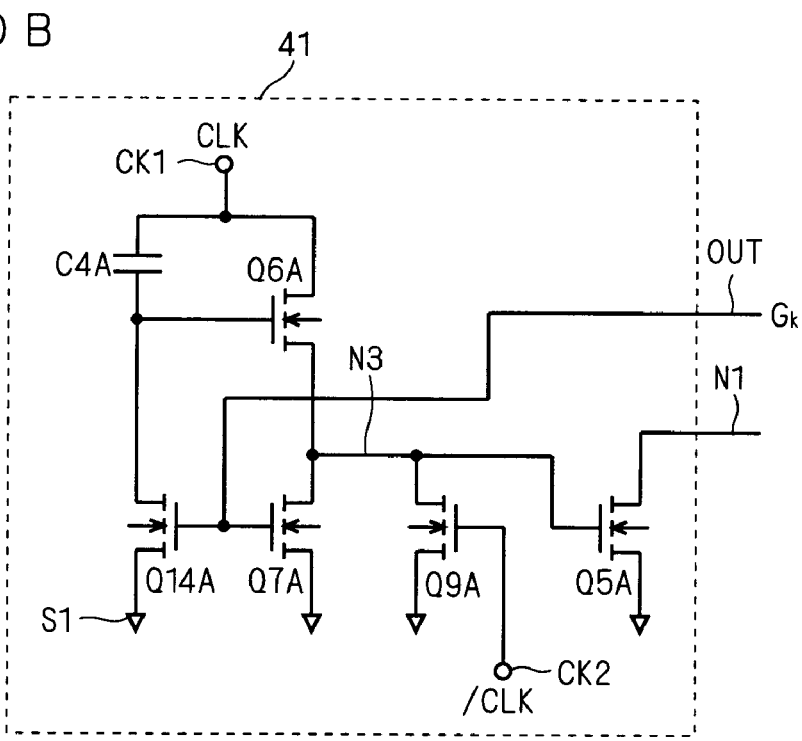

This preferred embodiment is also applicable to the first and second pull-down circuits 41 and 42 according to the third preferred embodiment. An example of the application is shown in FIGS. 20A and 20B. First, as to the second pull-down circuit 42, the transistor Q7B in FIG. 19A is replaced by the two transistors Q7Bn and Q7Br connected between the node N4 and the first power supply terminal S1. As shown in FIG. 20A, the gate of the transistor Q7Bn is connected to the first input terminal IN1 (the output terminal OUT of the preceding stage), and the gate of the transistor Q7Br is connected to the second input terminal IN2 (the output terminal OUT of the subsequent stage). In other words, instead of the aforementioned first inverter, the transistors Q6B, Q7Bn, and Q7Br form a first NOR circuit that uses the first and second input terminals IN1 and IN2 as the input ends and the node N4 as the output end and that is activated by a clock signal at the second clock terminal CK2. Further, the transistor Q14B in FIG. 19A is replaced by two transistors Q14Bn and Q14Br connected between the gate of the transistor Q6B and the first power supply terminal S1. The gate of the transistor Q14Bn is connected to the first input terminal IN1, and the gate of the transistor Q14Br is connected to the second input terminal IN2. In other words, instead of the aforementioned second inverter, the capacitive element C2B and the transistors Q14Br and Q14Bn form a second NOR circuit that uses the first and second input terminals IN1 and IN2 as the input ends and uses the gate of the transistor Q6B, which is activated by a clock signal at the second clock terminal CK2, as the output end.

As to the first pull-down circuit 41, the gates of the transistors Q7A and Q14A in FIG. 19B are connected not to the node N1 but to the output terminal OUT.

In the configurations of FIGS. 20A and 20B, the node N1 is accompanied with a smaller parasitic capacitance than in the cases of FIGS. 19A and 19B. Accordingly, charging the node N1 and boosting the voltage at the node N1 become easier. While, in FIGS. 19A and 19B, a pair of the transistors Q7B and Q5B and a pair of the transistors Q7A and Q5A each form a flip-flop circuit so that the transition of the node N1 from LOW to HIGH levels is relatively difficult, that becomes easy in the case of FIG. 20A. That is, the node N1 can be readily charged to a high potential, which contributes to an improvement in the drive capability of the transistor Q1.

Eighth Preferred Embodiment

In this preferred embodiment, a so-called Schmitt trigger circuit is applied to each inverter in the first and second pull-down circuits 41 and 42 (for the details of the Schmitt trigger circuit, see for example Japanese Patent Application Laid-open No. 56-96525).

Figure 21A:
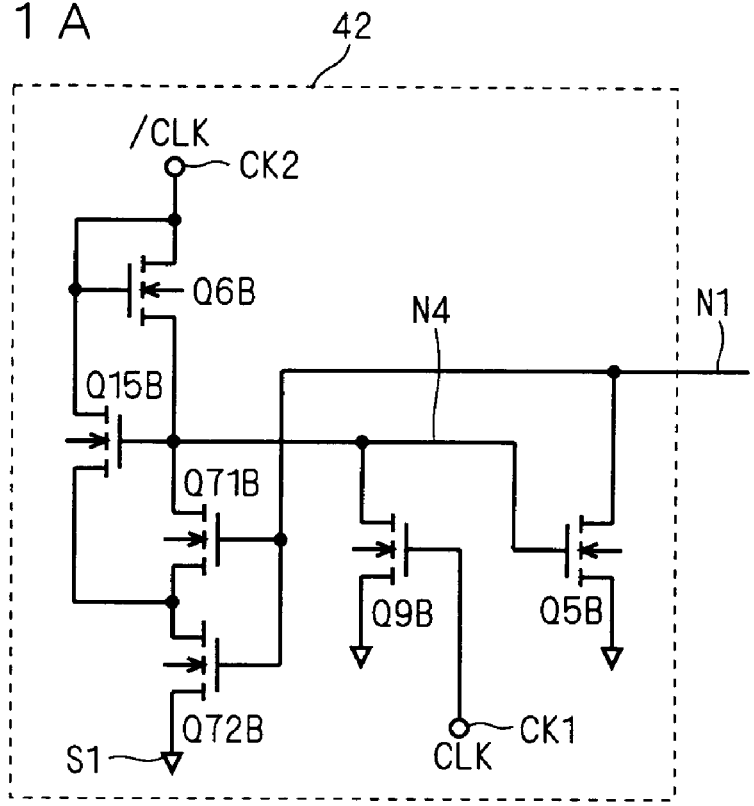
FIGS. 21A and 21B are circuit diagrams of first and second pull-down circuits according to an eighth preferred embodiment.

For example, FIG. 21A shows an example of the application of a Schmitt trigger type of inverter to the inverter in the second pull-down circuit 42 of FIG. 11A. Specifically, in place of the transistor Q7B in the second pull-down circuit of FIG. 11A, transistors Q71B and Q72B are series-connected between the node N4 and the first power supply terminal S1 so that their gates are connected in common to the node N1. Then, a transistor Q15B with its gate connected to the node N4 is connected between the second clock terminal CK2 and a connection node between the transistors Q71B and Q72B. The transistor Q15B is controlled by the potential of the node N4 so that it acts to pass feedback current from the second clock terminal CK2 to the connection node between the transistors Q71B and Q72B.

Figure 21B:
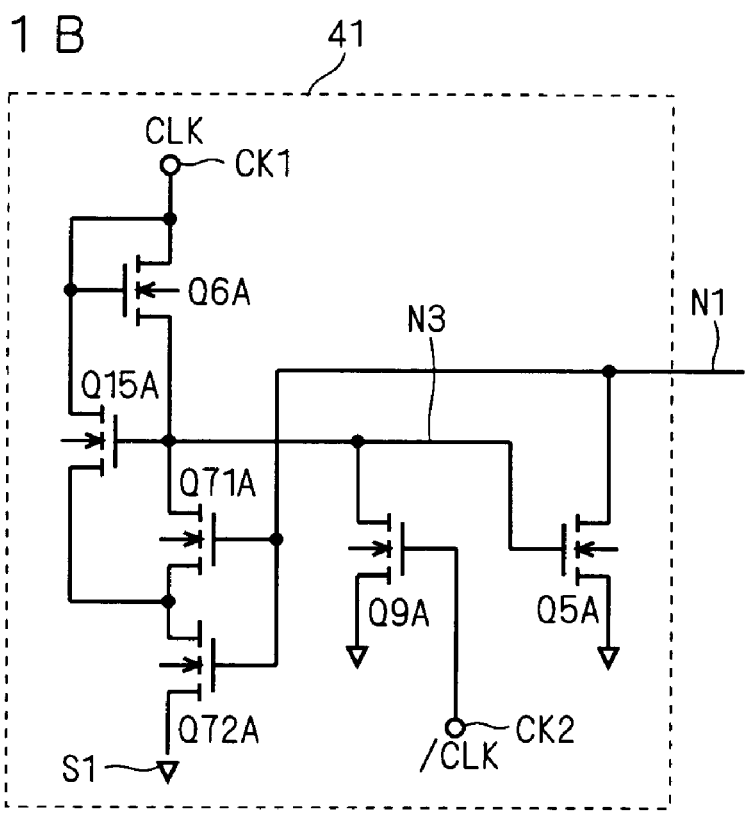

This preferred embodiment is also applicable to the first pull-down circuit 41. For example, FIG. 21B shows an example of the application of a Schmitt trigger type of inverter to the inverter in the first pull-down circuit 41 of FIG. 11B. Specifically, in place of the transistor Q7A in the first pull-down circuit 41 of FIG. 11B, transistors Q71A and Q72A are series-connected between the node N3 and the first power supply terminal S1. Then, a transistor Q15A with its gate connected to the node N3 is connected between the first clock terminal CK1 and a connection node between the transistors Q71A and Q72A.

Since the Schmitt trigger type of inverter has a high threshold voltage, there is an effect that, even if positive polarity noise occurs at the node N1 of the unit shift register SR, it will hardly affect the first and second pull-down circuits 41 and 42.

This preferred embodiment is also applicable to the first and second pull-down circuits 41 and 42 according to the third and subsequent preferred embodiments. For example, FIGS. 22A and 22B show examples of the application to the third preferred embodiment.

Figure 22A:
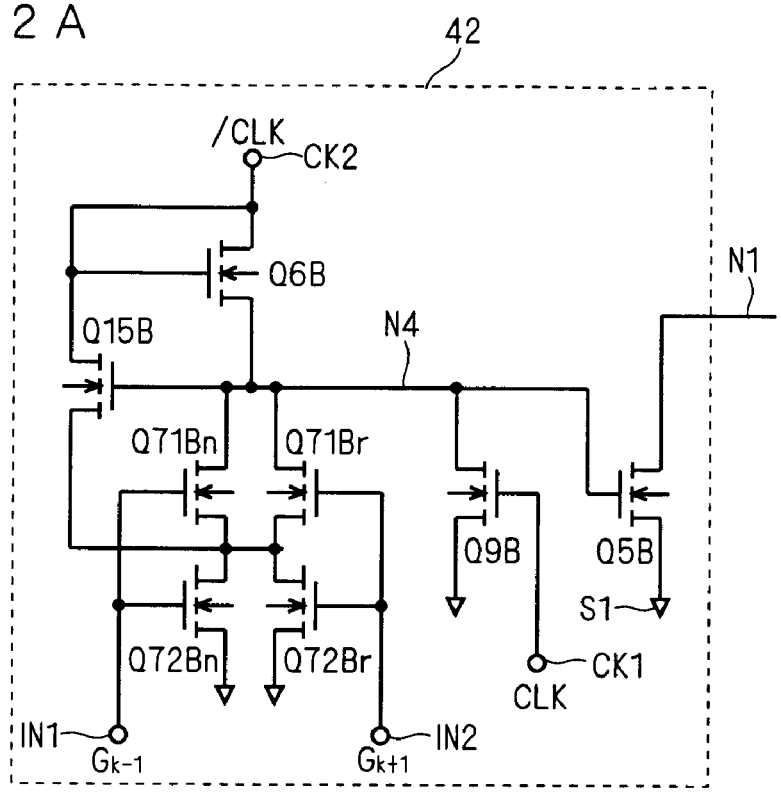
FIGS. 22A and 22B show variations of the first and second pull-down circuits according to the eighth preferred embodiment.

FIG. 22A shows an example of the application of a Schmitt trigger type circuit to the NOR circuit in the second pull-down circuit 42 of FIG. 12A. Specifically, in place of the transistor Q7Bn of FIG. 12A, transistors Q71Bn and Q72Bn are series-connected between the node N4 and the first power supply terminal S1 so that their gates are connected to the first input terminal IN1. Further, in place of the transistor Q7Br, transistors Q71Br and Q72Br are series-connected between the node N4 and the first power supply terminal S1 so that their gates are connected to the second input terminal IN2. Then, the transistor Q15B with its gate connected to the node N4 is connected between the second clock terminal CK2 and both connection nodes between the transistors Q71Bn and Q72Bn and between the transistors Q71Br and Q72Br.

Figure 22B:
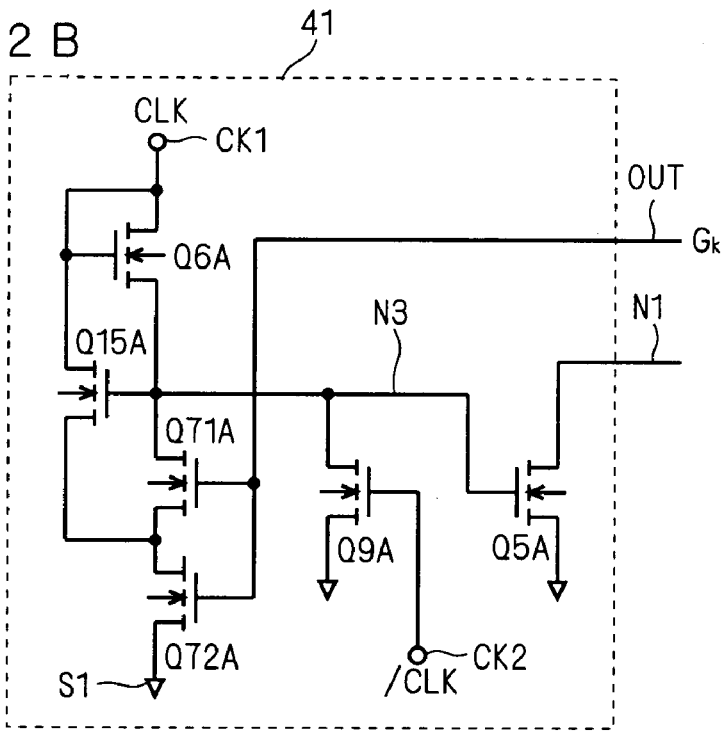

On the other hand, FIG. 22B shows an example of the application of a Schmitt trigger type circuit to the NOR circuit in the first pull-down circuit 41 of FIG. 12B. In this case, in place of the transistor Q7A in the first pull-down circuit 41 of FIG. 12B, the transistors Q71A and Q72A are series-connected between the node N3 and the first power supply terminal S1 so that their gates are connected to the output terminal OUT. Then, the transistor Q15A with its gate connected to the node N3 is connected between the first clock terminal CK1 and a connection node between the transistors Q71A and Q72A. In other words, the circuit of FIG. 22B is equivalent to the one in which the gates of the transistors Q71A and Q72A of FIG. 21B are connected not to the node N1 but to the output terminal OUT.

Ninth Preferred Embodiment

Figure 23:
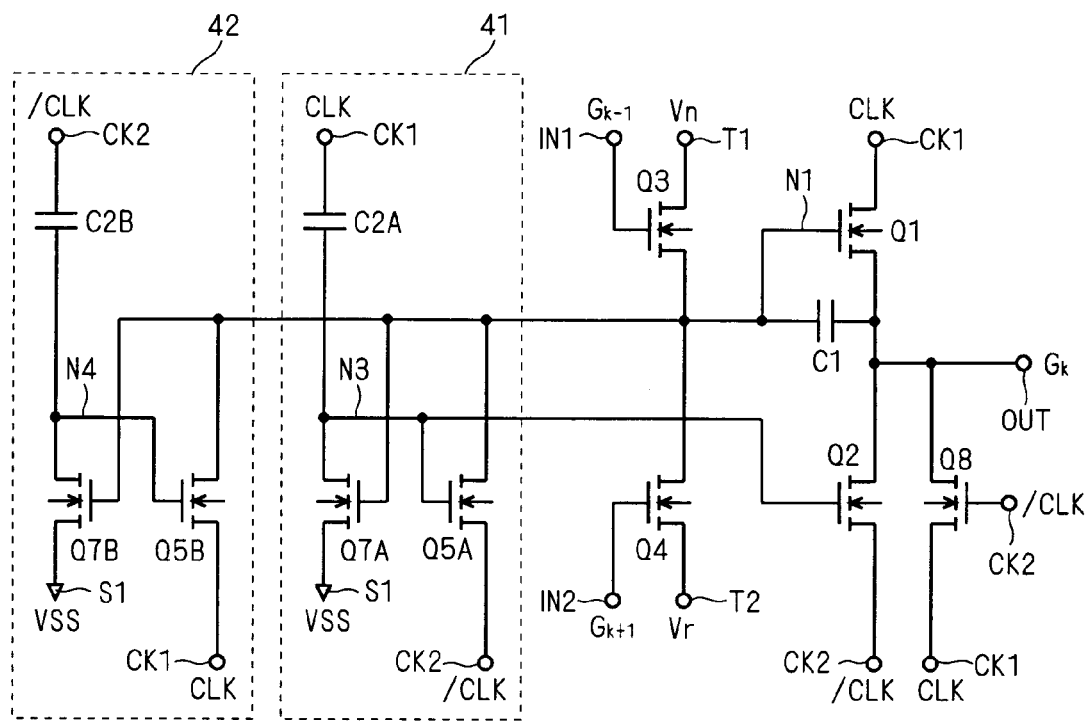
FIG. 23 is a circuit diagram showing a configuration of a unit shift register according to a ninth preferred embodiment.

FIG. 23 is a circuit diagram showing a configuration of a unit shift register SR according to a ninth preferred embodiment. This preferred embodiment is such that, in the unit shift register SR of the first preferred embodiment (FIG. 8), the sources of the transistors Q2 and Q5A are connected to the second clock terminal CK2, and the sources of the transistors Q8 and Q5B are connected to the first clock terminal CK1.

For example, a unit shift register $SR_k$ of the kth stage is considered in which the clock signal CLK is inputted to the first clock terminal CK1, and the clock signal /CLK is inputted to the second clock terminal CK2. Specifically, as shown in FIG. 23, the clock signal /CLK is supplied to the sources of the transistors Q2 and Q5A, and the clock signal CLK is supplied to the sources of the transistors Q8 and Q5B in the unit shift register $SR_k$.

For example, the transistors Q2 and Q5A are configured to discharge the output terminal OUT and the node N1, respectively, and, as is apparent from the description of the first preferred embodiment, they operate in the way that they are off at least during the LOW level period of the clock signal CLK. Since the clock signals CLK and /CLK are complementary to each other, the transistors Q2 and Q5A in the configuration of FIG. 23, when off during the LOW level period of the clock signal CLK, are in a state that is equivalent to the state where their gates are negatively biased with respect to their sources. Thus, the positive threshold voltage shifts of the transistors Q2 and Q5A return in the negative direction for recovery. This results in the effect of reducing the Vth shifts of the transistors Q2 and Q5A and thereby preventing a malfunction due to the Vth shifts.

On the contrary, the transistors Q8 and Q5B operate in the way that they are off at least during the LOW level period of the clock signal /CLK. In the configuration of FIG. 23, therefore, the transistors Q8 and Q5B, when off during the LOW level period of the clock signal /CLK, are in a state that is equivalent to the state where their gates are negatively biased with respect to their sources. This results in the effect of reducing the Vth shifts of the transistors Q8 and Q5B and thereby preventing a malfunction due to the Vth shifts.

While FIG. 23 shows an example that the change that the first and second clock terminals CK1 and CK2 are connected to the sources of transistors is applied to all the transistors Q2, Q8, Q5A and Q5B in the unit shift registers SR of FIG. 8, that change may be applied to only some of the transistors.

According to this preferred embodiment, reducing the Vth shifts and thereby the on-resistances of the transistors Q2, Q8, Q5A, and Q5B increases the effect described in the first preferred embodiment. More specifically, reducing the Vth shifts of the transistors Q2 and Q8 further reduces noise occurring in the gate line (the output terminal OUT), thereby preventing deterioration in the display quality of the display apparatus. Further, reducing the Vth shift of the transistor Q5A further reduces a rise in the level of the node N1 at the rise of a clock signal at the first clock terminal CK1. Reducing the Vth shift of the transistor Q5B further reduces a voltage rise at the node N1 due to leakage current in the transistor Q3 and consequently reduces a rise in the level of the node N1 at the rise of a clock signal at the first clock terminal CK1.

This preferred embodiment is also applicable to the transistors Q5A and Q5B in the first and second pull-down circuits 41 and 42 shown in FIGS. 11A and 11B to FIGS. 22A and 22B.

Tenth Preferred Embodiment

Figure 24:
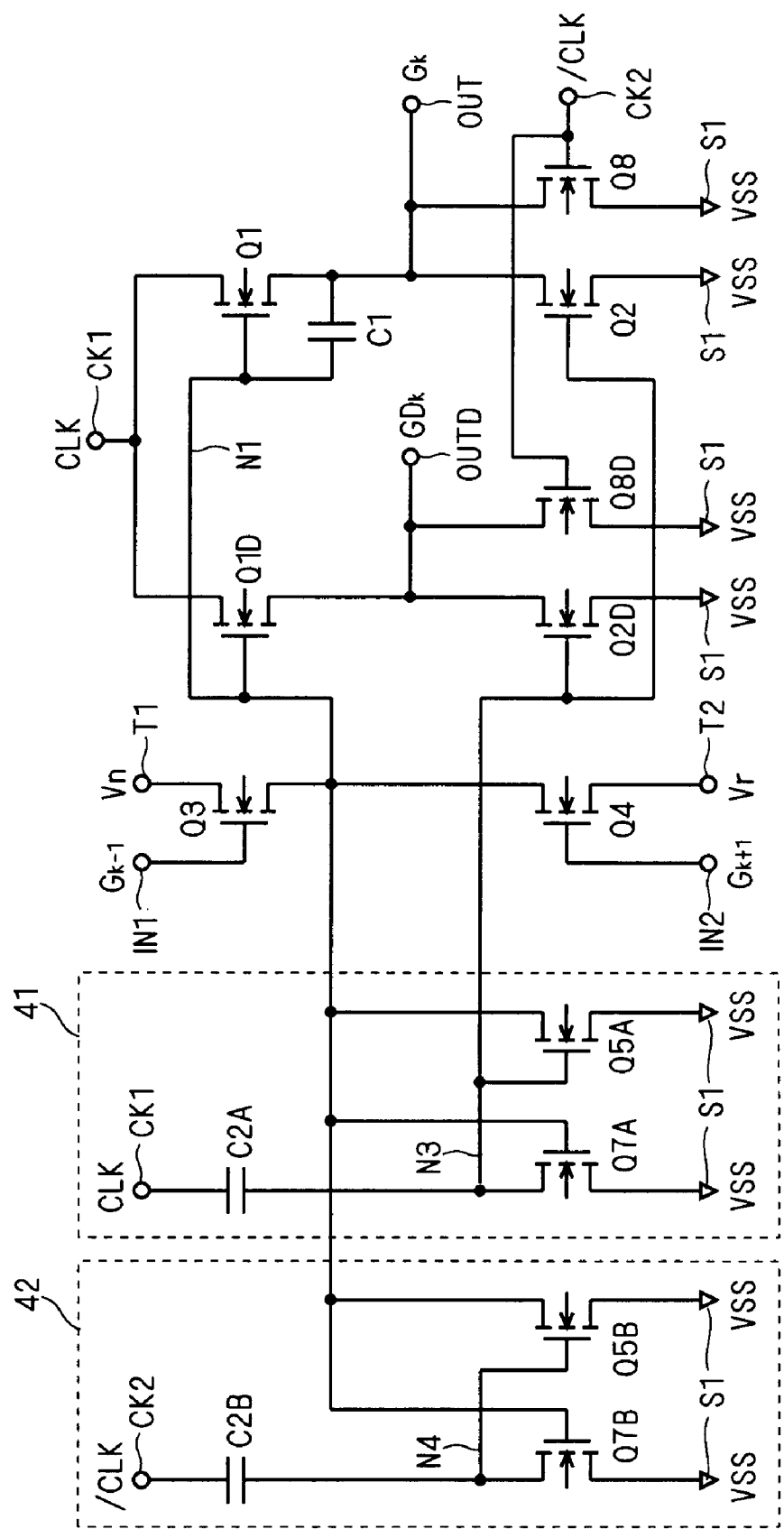
FIGS. 24 and 25 are circuit diagrams showing a configuration of a unit shift register according to a tenth preferred embodiment.

FIG. 24 is a circuit diagram showing a configuration of a unit shift register SR according to a tenth preferred embodiment. The unit shift register SR according to this preferred embodiment has two output terminals OUT and OUTD as in FIG. 11 of Japanese Patent Application Laid-open No. 2006-24350.

Between the output terminal OUTD and the first clock terminal CK1, a transistor Q1D is connected with its gate connected to the node N1. Between the output terminal OUTD and the first power supply terminal S1, a transistor Q2D with its gate connected to the node N3 and a transistor Q8D with its gate connected to the second clock terminal CK2 are connected in parallel. That is, the transistor Q1D is a transistor for supplying a clock signal inputted to the first clock terminal CK1 to the output terminal OUTD, and the transistors Q2D and Q8D are transistors for discharging the output terminal OUTD.

As can be seen from FIG. 24, a circuit constituted by the transistors Q1, Q2, and Q8 and a circuit constituted by the transistors Q1D, Q2D, and Q8D are connected in parallel between the first clock terminal CK1 and the first power supply terminal S1. Further, the transistors Q1 and Q1D have their gates connected to each other, the transistors Q2 and Q2D have their gates connected to each other, and the transistors Q8 and Q8D have their gates connected to each other. Accordingly, the circuit constituted by the transistors Q1, Q2, and Q8 and the circuit constituted by the transistors Q1D, Q2D, and Q8D operate in the same way, as a result of which the output terminals OUT and OUTD theoretically output signals having the same waveforms. Hereinafter, the output terminal OUTD is referred to as a "carry-signal output terminal OUTD," and signals outputted therefrom as "carry signals GD."

Figure 25:
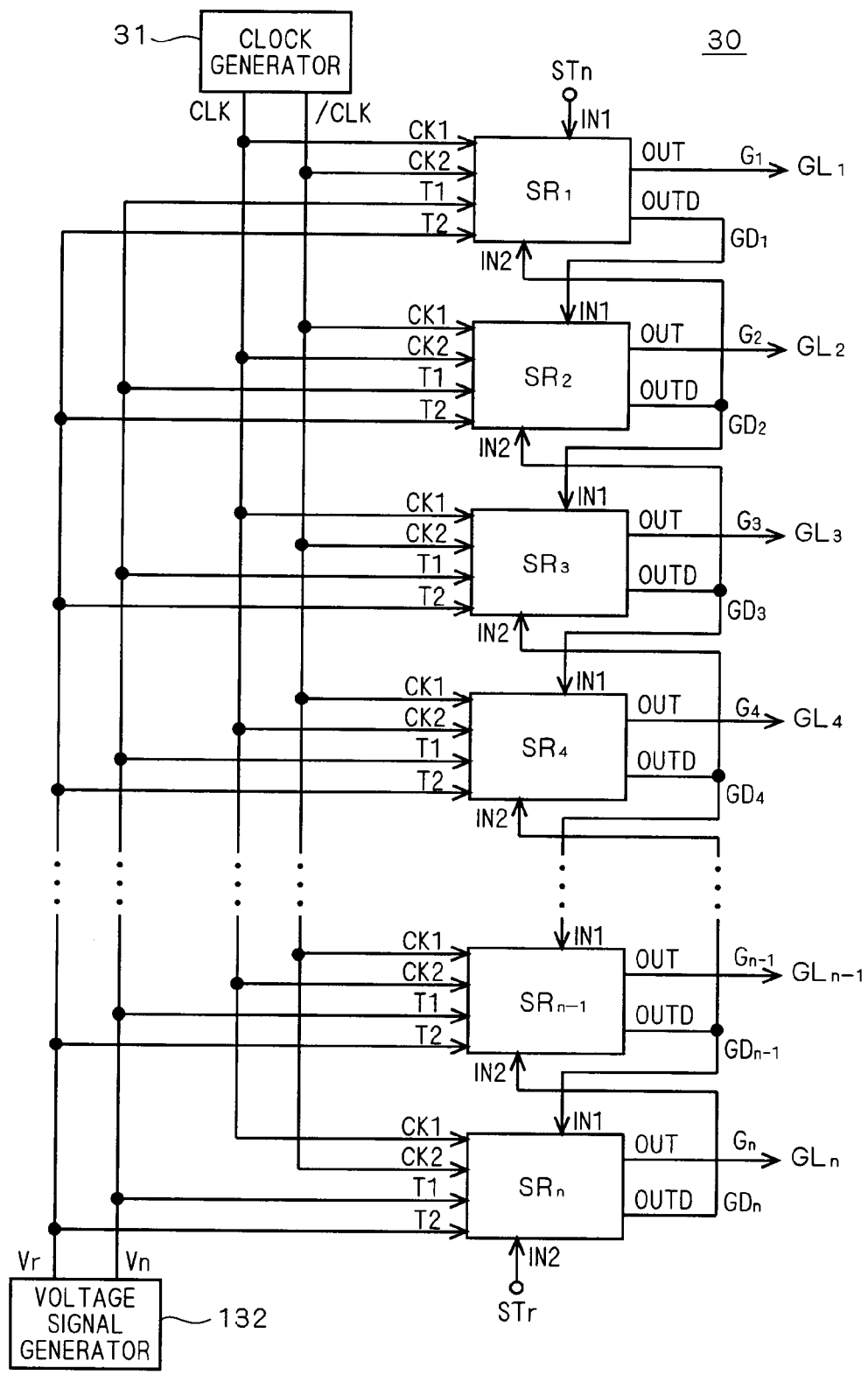

FIG. 25 shows a configuration of a gate line driving circuit 30 (multi-stage shift register) constituted by the unit shift registers SR according to the tenth preferred embodiment.

As shown, the first input terminal IN1 of each stage is connected to the carry-signal output terminal OUTD of the unit shift register SR of the preceding stage. That is, the carry signal GD of the preceding stage is inputted to the first input terminal IN1 of the unit shift register SR of the second or subsequent stage. The second input terminal IN2 of each stage is connected to the carry-signal output terminal OUTD of the subsequent stage. That is, the carry signal GD of the subsequent stage is inputted to the second input terminal IN2 of the second or subsequent stage.

On the other hand, the output terminal OUT of each stage is not connected to the unit shift registers SR of the preceding and subsequent stages but connected only to the gate line GL. That is, the carry signal GD is used exclusively for driving the gate line GL.

Since the gate lines in a display apparatus can generally be large load capacitances, the speeds of the rise of the output signals G inputted to the gate lines tend to be slow. As shown in FIG. 7, when the output signal G is inputted to the first and second input terminals IN1 and IN2 of the preceding and subsequent stages, a slow rise of the output signal G requires some time to charge the gate of the transistor Q1 (the node N1) of each stage to a sufficiently high level. This results in difficulty in speeding up the operation of each unit shift register SR, thereby preventing the speeding up of the operation of the gate line driving circuit and accordingly an increase in the resolution of the display apparatus.

On the other hand, according to this preferred embodiment, as signals inputted to the first and second input terminals IN1 and IN2 of each stage, the carry signals GD generated by a different circuit from the one by which the output signals G are generated are used for driving the gate lines. In other words, the gate lines as load capacitances may affect and reduce the speeds of the rise of the output signals G, but they will not affect the speeds of the rise of the carry signals GD. This prevents a reduction in the speed of charging the node N1 of each stage and thus contributes to the speeding up of the operation of the gate line driving circuit.

The first and second pull-down circuits 41 and 42 according to the second to eighth preferred embodiments (FIGS. 11 to 22) are also applicable to this preferred embodiment. Further, the technique according to the ninth preferred embodiment is also applicable to the transistors Q2D and Q8D of FIG. 24. Specifically, the source of the transistor Q2D may be connected to the second clock terminal CK2, and the source of the transistor Q8D may be connected to the first clock terminal CK1.

Eleventh Preferred Embodiment

Figure 26:
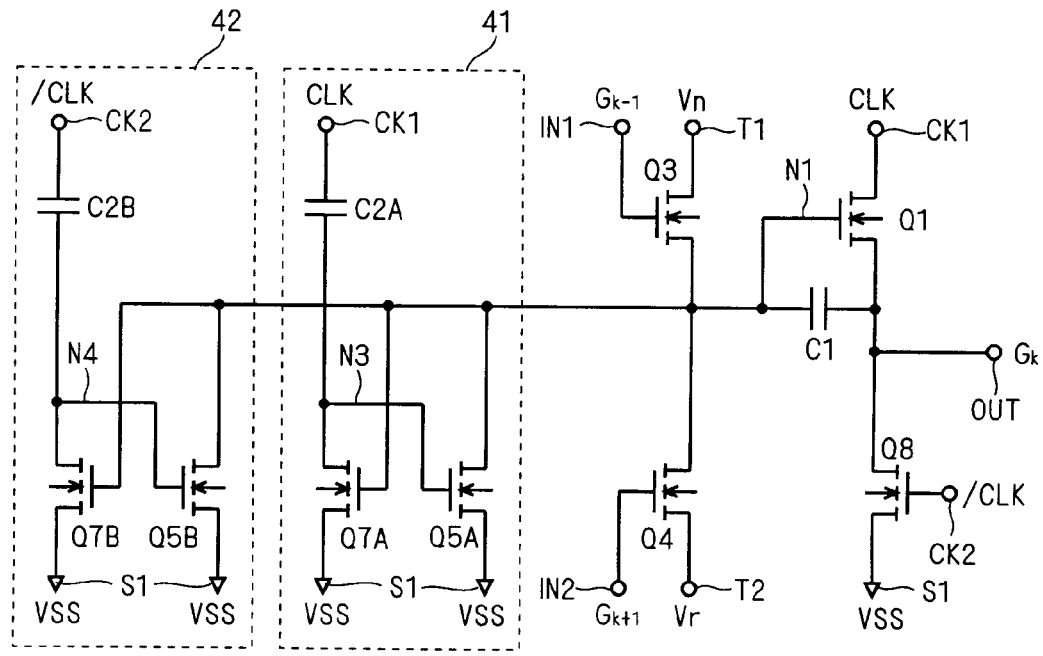
FIG. 26 is a circuit diagram showing a configuration of a unit shift register according to an eleventh preferred embodiment.

FIG. 26 is a circuit diagram showing a configuration of a unit shift register SR according to an eleventh preferred embodiment. In contrast to the circuit of FIG. 8, this unit shift register SR omits the transistor Q2. While the transistor Q2 performs the function of discharging charges at the output terminal OUT according to a clock signal at the second clock terminal CK2, it can be omitted in some cases depending on the timing of occurrence of noise at the output terminal OUT (the gate line GL), the magnitude of that noise or the like.

Omitting the transistor Q2 allows a reduction in the area to form a unit shift register SR. It also reduces a parasitic capacitance accompanying the node N3, so that, in terms of reduced capacitance value of the capacitive element C2A, it contributes to a reduction in the circuit area. There is also an advantage that power consumption by the gate capacitance of the transistor Q2 can be eliminated.

This preferred embodiment is applicable to the second to tenth preferred embodiments. For application of this preferred embodiment to the tenth preferred embodiment, not only the transistor Q2 but also the transistor Q2D may be omitted. However, less malfunction will result if only the transistor Q2 is omitted and the transistor Q2D is kept. In the event of omission of the transistor Q2D, the carry-signal output terminal OUTD will be put in a high impedance state at a rise of a clock signal at the first clock terminal CK1. Since the carry-signal output terminal OUTD has a smaller capacitive load than the output terminal OUT connected to the gate line GL, its high impedance state causes its level to tend to rise in response to a rise of a clock signal at the first clock terminal CK1. That is, an error signal is likely to be outputted as the carry signal GD. Since a malfunction will result if that error signal causes the transistor Q3 of the subsequent stage or the transistor Q4 of the preceding stage to be turned on, the transistor Q2D should desirably be kept in order to prevent the occurrence of a malfunction.

Twelfth Preferred Embodiment

Figure 27:
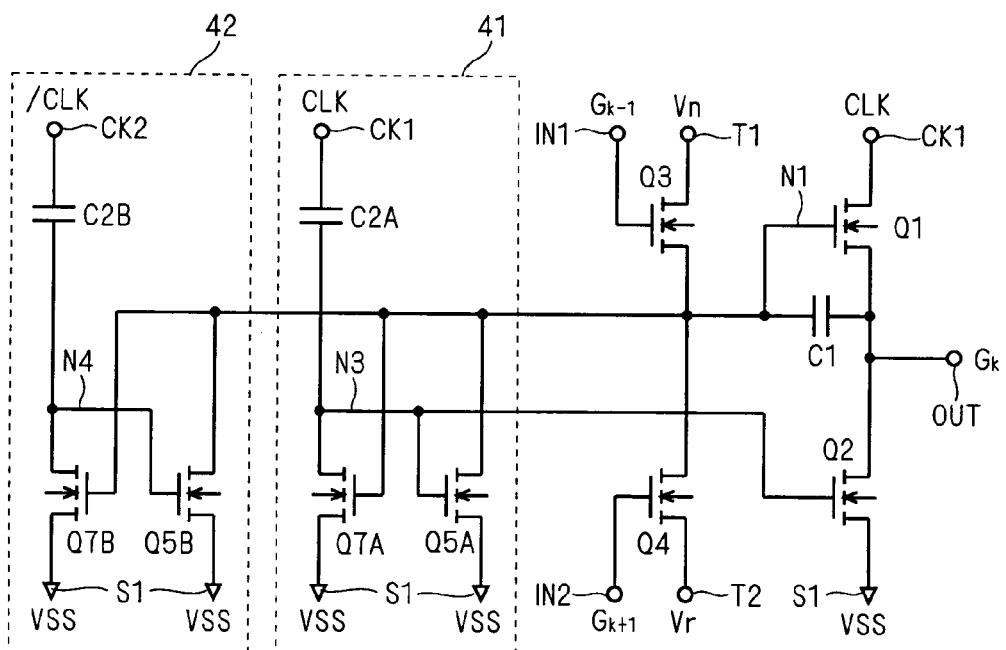
FIG. 27 is a circuit diagram showing a configuration of a unit shift register according to a twelfth preferred embodiment.

FIG. 27 is a circuit diagram showing a configuration of a unit shift register SR according to a twelfth preferred embodiment. In contrast to the circuit of FIG. 8, this unit shift register SR omits the transistor Q8. While the transistor Q8 performs the function of discharging charges at the output terminal OUT according to the level of the node N3, it can be omitted in some cases depending on the timing of occurrence of noise at the output terminal OUT (the gate line GL), the magnitude of that noise or the like.

Omitting the transistor Q8 allows a reduction in the area required to form a unit shift register SR. There is also an advantage that power consumption by the gate capacitance of the transistor Q8 can be eliminated.

This preferred embodiment is applicable to the second to tenth preferred embodiments. For application of this preferred embodiment to the tenth preferred embodiment, not only the transistor Q8 but also the transistor Q8D may be omitted. However, less malfunction will result if only the transistor Q8 is omitted and the transistor Q8D is kept. As previously described, since the carry-signal output terminal OUTD has a smaller capacitive load than the output terminal OUT, its high impedance state resulting from the omission of the transistor Q8D causes its level to tend to rise due to the influence of noise or the like. That is, an error signal is likely to be outputted as the carry signal GD (although the likelihood is less than when the transistor Q2D is omitted as in the eleventh preferred embodiment). Since a malfunction will result if that error signal causes the transistor Q3 of the subsequent stage or the transistor Q4 of the preceding stage to be turned on, the transistor Q8D should desirably be kept in order to prevent the occurrence of a malfunction.

Thirteenth Preferred Embodiment

A field-effect transistor, including a TFT, is an element that is brought into conduction by electrically connecting between the drain and the source with a conductive channel formed immediately under the gate electrodes through gate insulating film, when a voltage greater than the threshold voltage is applied to the gate. Thus, a conducting field-effect transistor can also serve as a capacitive element (gate capacitance) using its gate and channel as electrodes on both sides and the gate insulating film as a dielectric layer.

Figure 28:
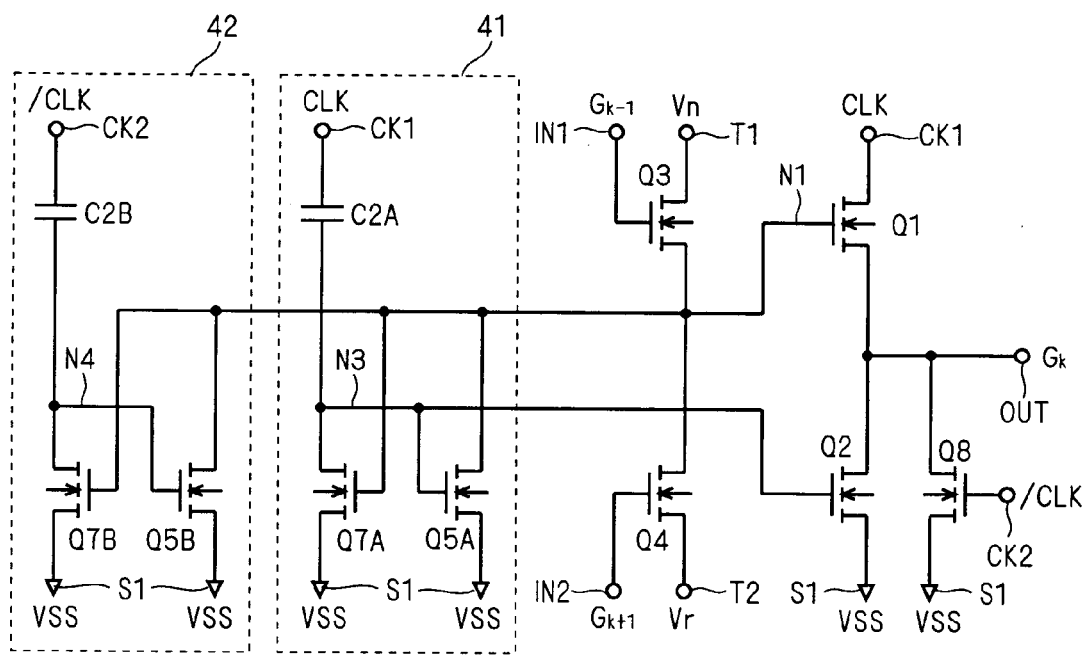
FIG. 28 is a circuit diagram showing a configuration of a unit shift register according to a thirteenth preferred embodiment.

FIG. 28 is a circuit diagram showing a configuration of a unit shift register SR according to a thirteenth preferred embodiment. In contrast to the circuit of FIG. 8, this unit shift register SR omits and replaces the capacitive element C1 with a gate capacitance of the transistor Q1.

Generally, the insulation film as a dielectric layer of a capacitive element formed in a semiconductor integrated circuit has the same thickness as a gate insulating film of a transistor, so that, for replacement of a capacitive element with a gate capacitance of a transistor, a transistor having the same area as that capacitive element can be used. That is, by increasing the gate width of the transistor Q1 by an equivalent amount in the circuit of FIG. 28, a voltage boosting operation equivalent to that of the circuit of FIG. 8 can be achieved.

An increased gate width of the transistor Q1 improves the drive capability of the transistor Q1, thereby resulting in the advantages of increasing the speeds of the rise and fall of the output signal G and thereby speeding up the operation. This preferred embodiment is applicable to the second to twelfth preferred embodiments.

Fourteenth Preferred Embodiment

Figure 29:
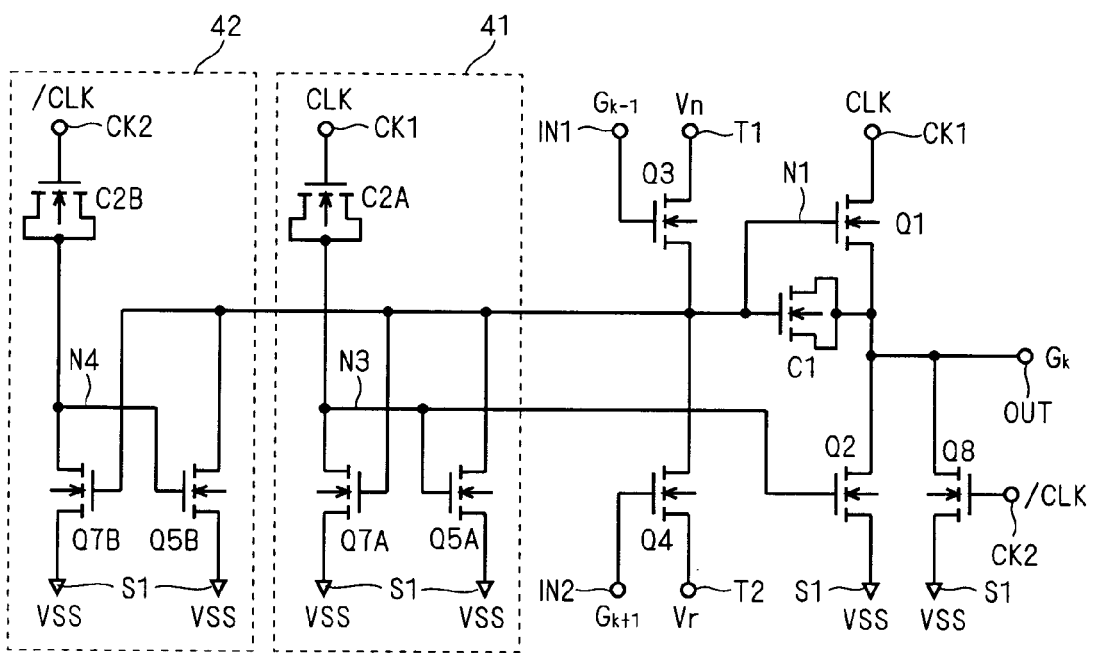

FIGS. 29 and 30 are circuit diagrams showing configurations of unit shift registers SR according to a fourteenth preferred embodiment. As described above, a conducting field-effect transistor can serve as a capacitive element (MOS capacitive element) using its gate and channel as electrodes on both sides and the gate insulating film as a dielectric layer. In this preferred embodiment, the capacitive elements C1, C2A, and C2B are MOS capacitive elements.

As is seen from FIGS. 29 and 30, the MOS capacitive element is formed by connecting between the source and drain of a MOS transistor, so that a transistor similar to those which are constituents of the unit shift register SR, such as Q1, Q2, ... or the like can be used. By so doing, the capacitive elements C1, C2A, and C2B can be formed in the same process as the other transistors. That is, in the manufacturing process, at least one mask for forming capacitive elements can be eliminated, and accordingly, at least one step can be eliminated.

MOS capacitive elements have their gate-source junctions biased at and above their threshold voltages so that they have large capacitance values when channel is formed. Since the capacitive element C1 is configured to further boost the voltage at the node N1 that has already been charged to the HIGH level, it should only serve as a capacitive element at least during the HIGH level period of the node N1. On the contrary, during the non-selected period when the node N1 is at the LOW level, it is preferable that coupling through the capacitive element C1 should be weak in order not to increase the level of the node N1 due to noise at the output terminal OUT. Therefore, it is desirable that, as shown in FIGS. 29 and 30, the MOS capacitive element as the capacitive element C1 should have its gate connected to the node N1 side and its source and drain connected to the output terminal OUT side.

The MOS capacitive element as the capacitive element C2A, as shown in FIG. 29, should desirably have its gate connected to the first clock terminal CK1 side and its source and drain connected to the node N3 side. In that case, since channel is formed when the level of a clock signal at the first clock terminal CK1 becomes the threshold voltage or more, the level of the node N3 can be increased and decreased with more efficiency. For a similar reason, the MOS capacitive element as the capacitive element C2B, as shown in FIG. 29, should desirably have its gate connected to the second clock terminal CK2 side and its source and drain connected to the node N4 side.

Operation is possible even if, as shown in FIG. 30, the orientations of the MOS capacitive elements as the capacitive elements C2A and C2B are opposite to those shown in FIG. 29. In this case, although no channel is formed in those MOS capacitive elements, the gate-drain and gate-source overlap capacitances of each MOS capacitive element serve as the capacitive elements C2A and C2B, respectively.

Fifteenth Preferred Embodiment

This preferred embodiment describes a driving method that allows a reduction in the stress of the transistors Q3 and Q4 in a unit shift register SR.

Figure 31:
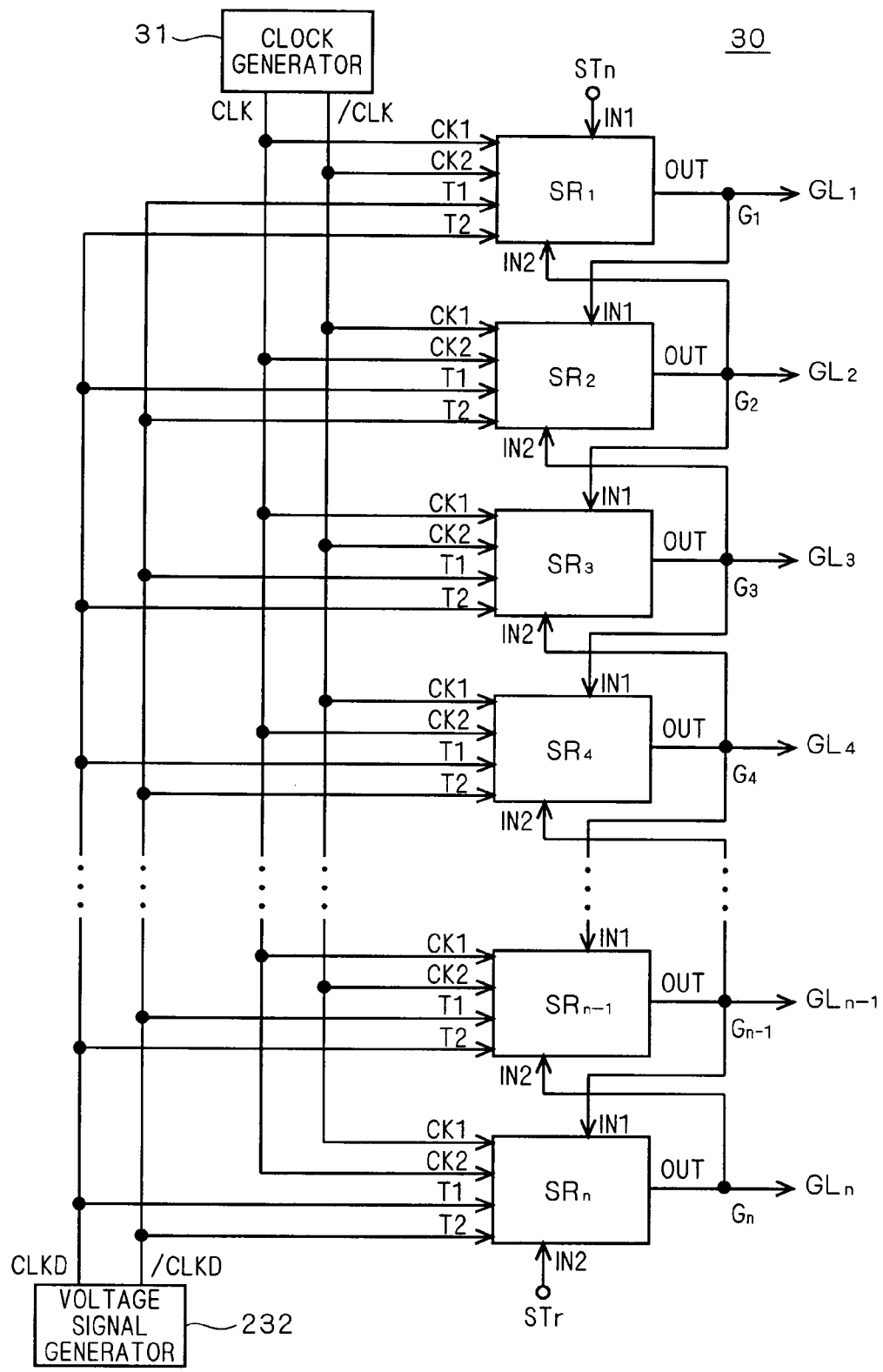
FIG. 31 is a block diagram showing a configuration of a gate line driving circuit using bidirectional unit shift registers according to a fifteenth preferred embodiment.

FIG. 31 is a block diagram showing a configuration of a gate line driving circuit 30 according to a fifteenth preferred embodiment. While the aforementioned preferred embodiments are such that the first and second voltage-signal terminals T1 and T2 in each unit shift register SR are supplied with the first and second voltage signals Vn and Vr, respectively, this preferred embodiment is instead such that the first and second voltage-signal terminals T1 and T2 in each unit shift register SR are supplied with voltage signals CLKD and /CLKD generated by a voltage-signal generator 232. Each unit shift register SR may be any one of those described in the aforementioned preferred embodiments.

Figure 32:
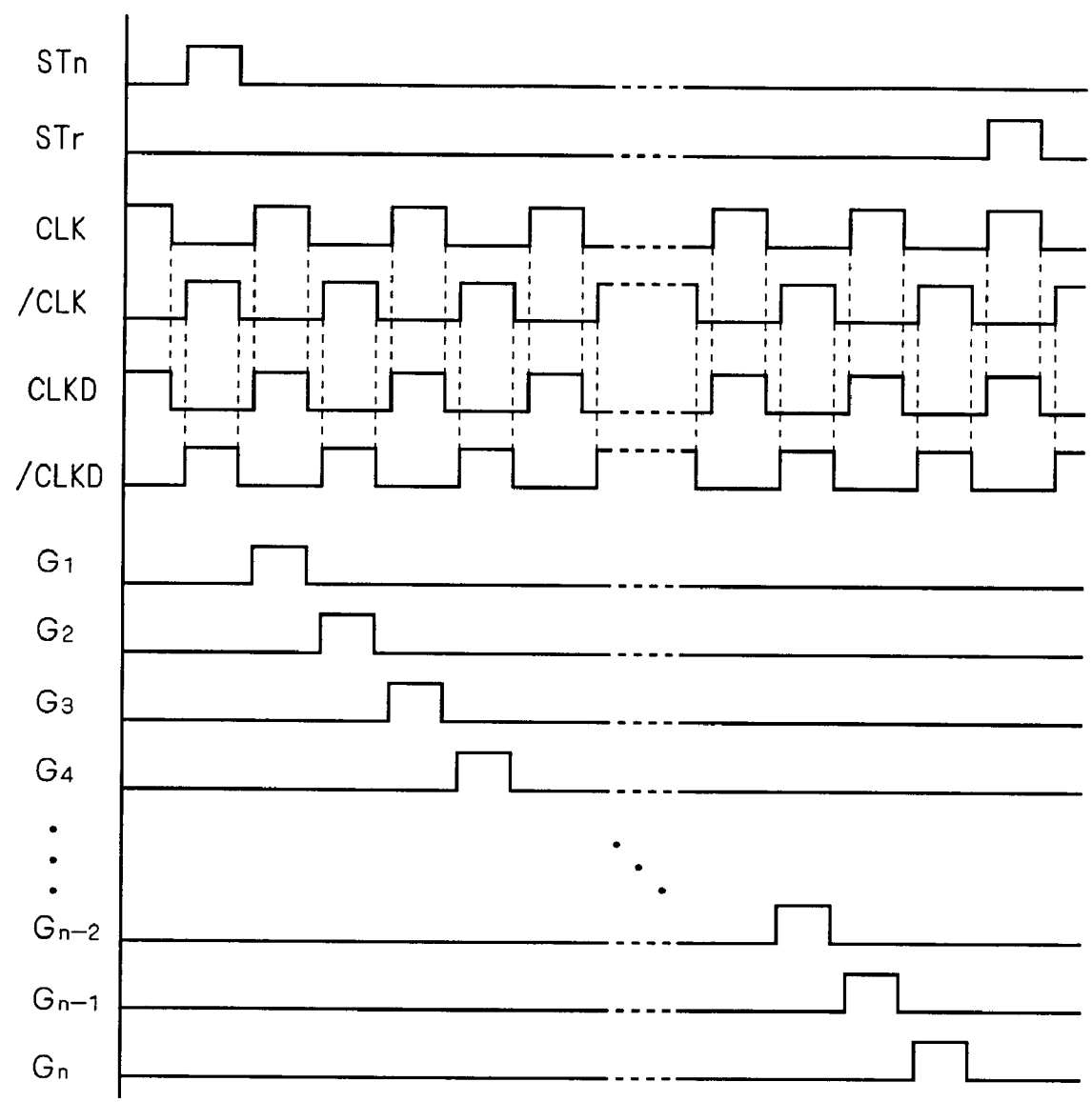
FIGS. 32 and 33 are timing charts illustrating the operations of the bidirectional unit shift registers according to the fifteenth preferred embodiment.
Figure 33:
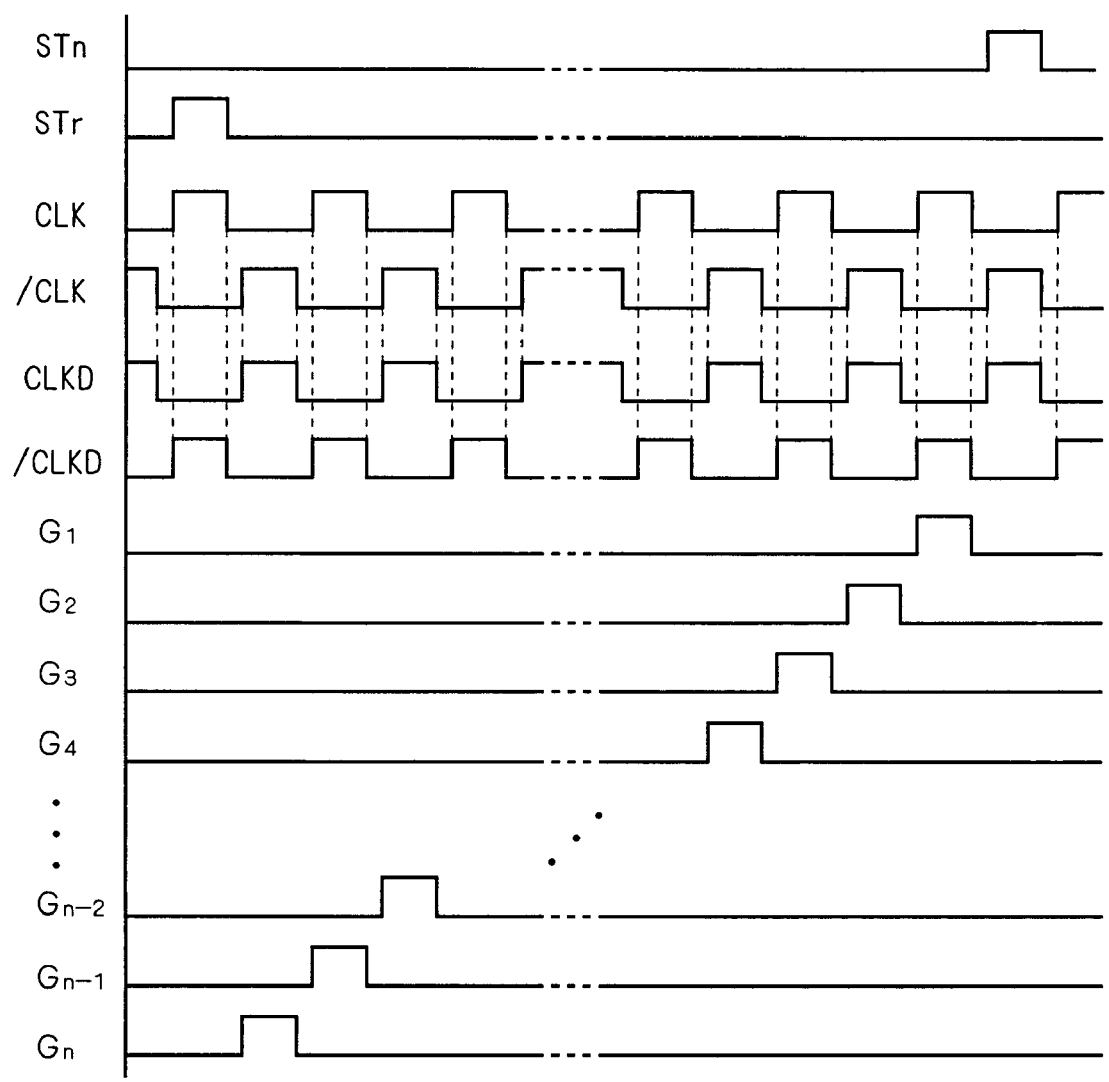

Now, the voltage signals CLKD and /CLKD will be described. FIGS. 32 and 33 are timing charts for explaining the operation of the gate line driving circuit 30 according to this preferred embodiment. FIG. 32 is for the case of a forward shift, and FIG. 33 is for the case of a backward shift.

As shown in FIGS. 32 and 33, the voltage signal CLKD is a signal whose level changes in a similar way to a change in the level of the clock signal CLK for a forward shift and whose level changes in a similar way to a change in the level of the clock signal /CLK for a backward shift. The voltage signal /CLKD is a signal whose level changes in a similar way to a change in the level of the clock signal /CLK for a forward shift and whose level changes in a similar way to a change in the level of the clock signal CLK for a backward shift.

In this preferred embodiment, which of the voltage signals CLKD and /CLKD is supplied to each of the first and second voltage-signal terminals T1 and T2 differs for each unit shift register SR. As shown in FIG. 31, at the stages where the clock signal CLK is inputted to the first clock terminal CK1 (i.e., in the unit shift registers $SR_1$, $SR_3$, . . . ), the voltage signal /CLKD is supplied to the first voltage-signal terminal T1, and the voltage signal CLKD to the second voltage-signal terminal T2. At the stages where the clock signal /CLK is inputted to the first clock terminal CK1 (i.e., in the unit shift registers $SR_2$, $SR_4$, . . . ), the voltage signal CLKD is supplied to the first voltage-signal terminal T1, and the voltage signal /CLKD to the second voltage-signal terminal T2.

By so doing, for a forward shift, each unit shift register SR operates such that the first voltage-signal terminal T1 becomes HIGH at the time when the output signal of the preceding stage is inputted to the first input terminal IN1, and the second voltage-signal terminal T2 becomes LOW at the time when the output signal of the subsequent stage is inputted to the second input terminal IN2.

For a backward shift, each unit shift register SR operates such that the second voltage-signal terminal T2 becomes HIGH at the time when the output signal of the subsequent stage is inputted to the second input terminal IN2, and the first voltage-signal terminal T1 becomes LOW at the time when the output signal of the preceding stage is inputted to the first input terminal IN1.

Accordingly, for both forward and backward shifts, the transistors Q3 and Q4 in each unit shift register SR can charge and discharge the node N1 (the gate of the transistor Q1) in the same way as in the first preferred embodiment. Therefore, this preferred embodiment also allows forward and backward shift operations as shown in FIGS. 32 and 33.

According to this preferred embodiment, since the first and second voltage-signal terminals T1 and T2, i.e., the drains of the transistors Q3 and Q4, are not dc-biased, the stress of those transistors Q3 and Q4 can be reduced.

As previously described, the voltage signal CLKD is a signal whose level changes in a similar way to a change in the level of the clock signal CLK for a forward shift and whose level changes in a similar way to a change in the level of the clock signal /CLK for a backward shift. Also, the voltage signal /CLKD is a signal whose level changes in a similar way to a change in the level of the clock signal /CLK for a forward shift and whose level changes in a similar way to a change in the level of the clock signal CLK for a backward shift. However, for practical application of this preferred embodiment to the gate line driving circuit 30, it is desirable, as shown in FIGS. 34 and 35, to delay the timing of the fall of the voltage signals CLKD and /CLKD behind the timing of the fall of the clock signals CLK and /CLK.

Figure 34:
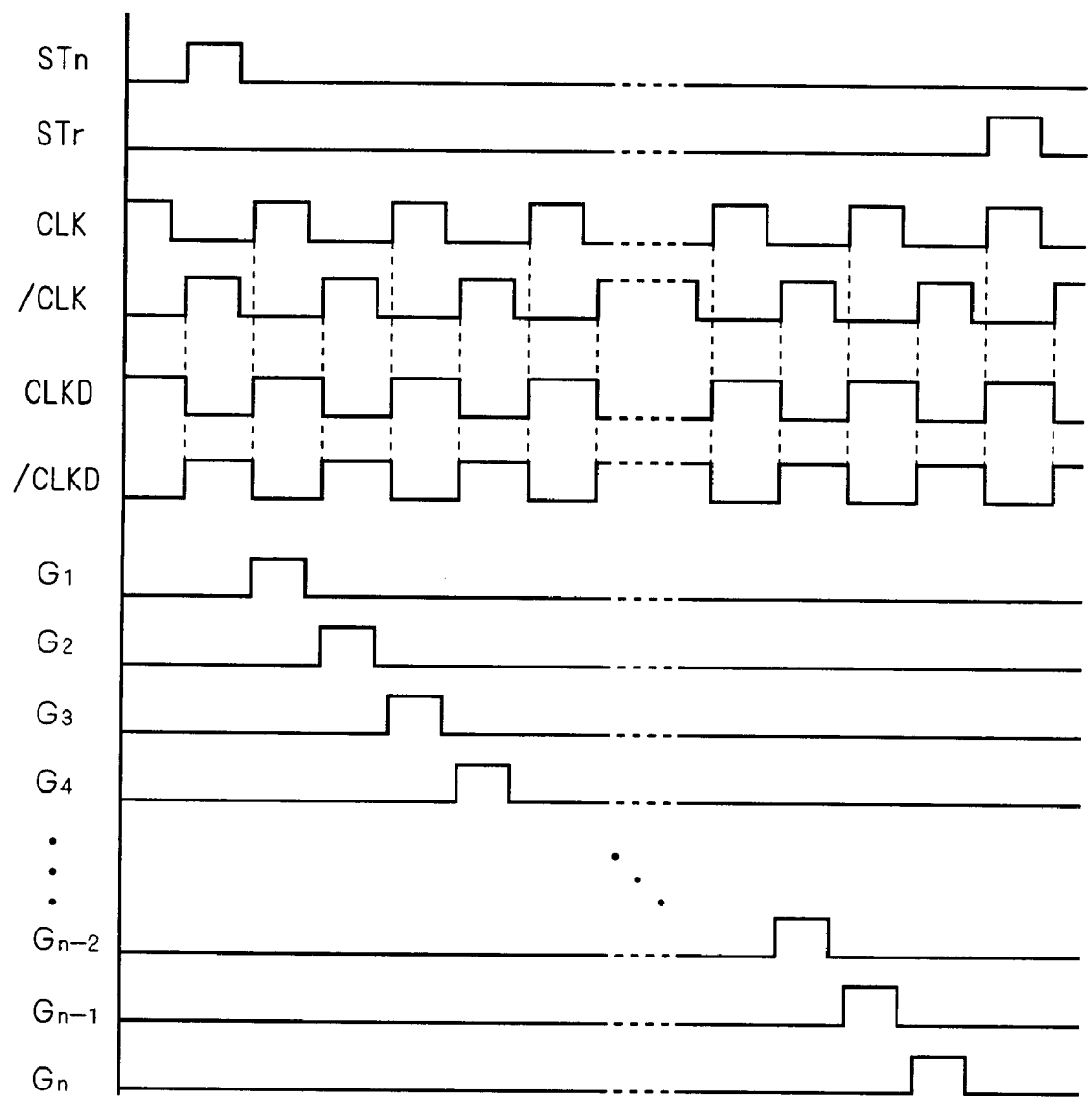
FIGS. 34 and 35 are timing charts for explaining variations of the fifteenth preferred embodiment.

FIG. 34 shows the case of a forward shift operation, in which, while the timing of the rise of the voltage signal CLKD is simultaneous with that of the clock signal CLK, the timing of the fall of the voltage signal CLKD is delayed behind that of the clock signal CLK (it is simultaneous with the timing of the rise of the clock signal /CLK). Similarly, while the timing of the rise of the voltage signal /CLKD is simultaneous with that of the clock signal /CLK, the timing of the fall of the voltage signal /CLKD is delayed behind that of the clock signal /CLK (it is simultaneous with the timing of the rise of the clock signal CLK).

Figure 35:
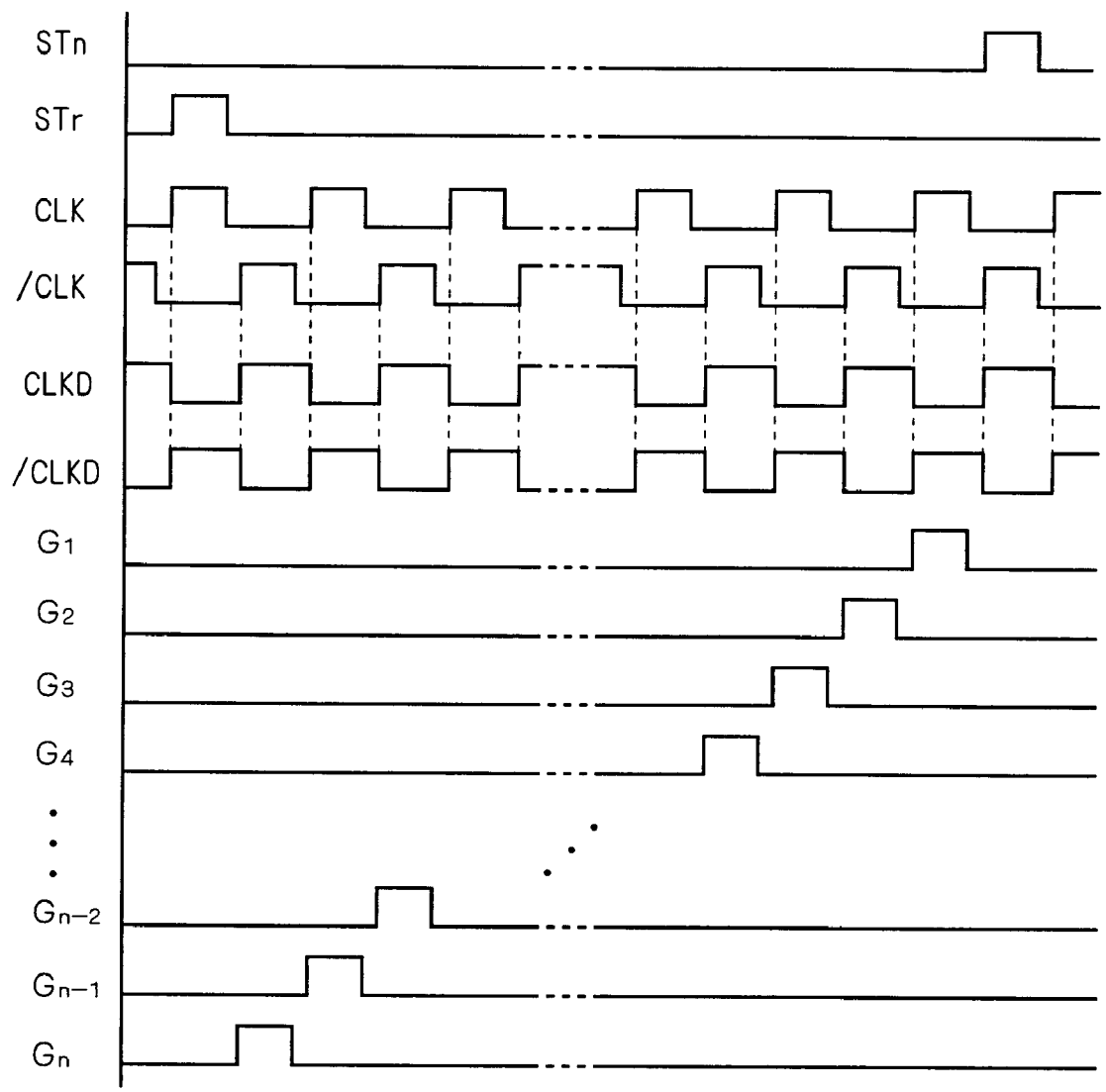

On the other hand, FIG. 35 shows the case of a backward shift operation, in which, while the timing of the rise of the voltage signal CLKD is simultaneous with that of the clock signal /CLK, the timing of the fall of the voltage signal CLKD is delayed behind that of the clock signal /CLK (it is simultaneous with the timing of the rise of the clock signal CLK). Similarly, while the timing of the rise of the voltage signal /CLKD is simultaneous with that of the clock signal CLK, the timing of the fall of the voltage signal /CLKD is delayed behind that of the clock signal CLK (it is simultaneous with the timing of the rise of the clock signal /CLK).

Since, as described above, the gate lines can be large load capacitances, the fall of the output signal from each unit shift register SR tends to be delayed. For example if, for a forward shift, the fall of the output signal of the preceding stage inputted to the first input terminal IN1 is delayed, the level at the drain of the transistor Q3 (the first voltage-signal terminal T1) will fall after the transistor Q3 charges the node N1 but earlier than the fall of the level at the gate of the transistor Q3 (the first input terminal IN1). If that is the case, charges at the node N1 flow backward and are discharged through the transistor Q3, which causes the fall of the level at the node N1 during the period when the unit shift register SR is selected and thereby results in deterioration in the drive capability of the transistor Q1. A similar problem also arises for a backward shift. This problem can be avoided by delaying the timing of the fall of the voltage signals CLKD and /CLKD behind that of the clock signals CLK and /CLK as shown in FIGS. 34 and 35.

Sixteenth Preferred Embodiment

This preferred embodiment describes another driving method that allows a further reduction in the stress of the transistors Q3 and Q4 in a unit shift register SR.

Figure 36:
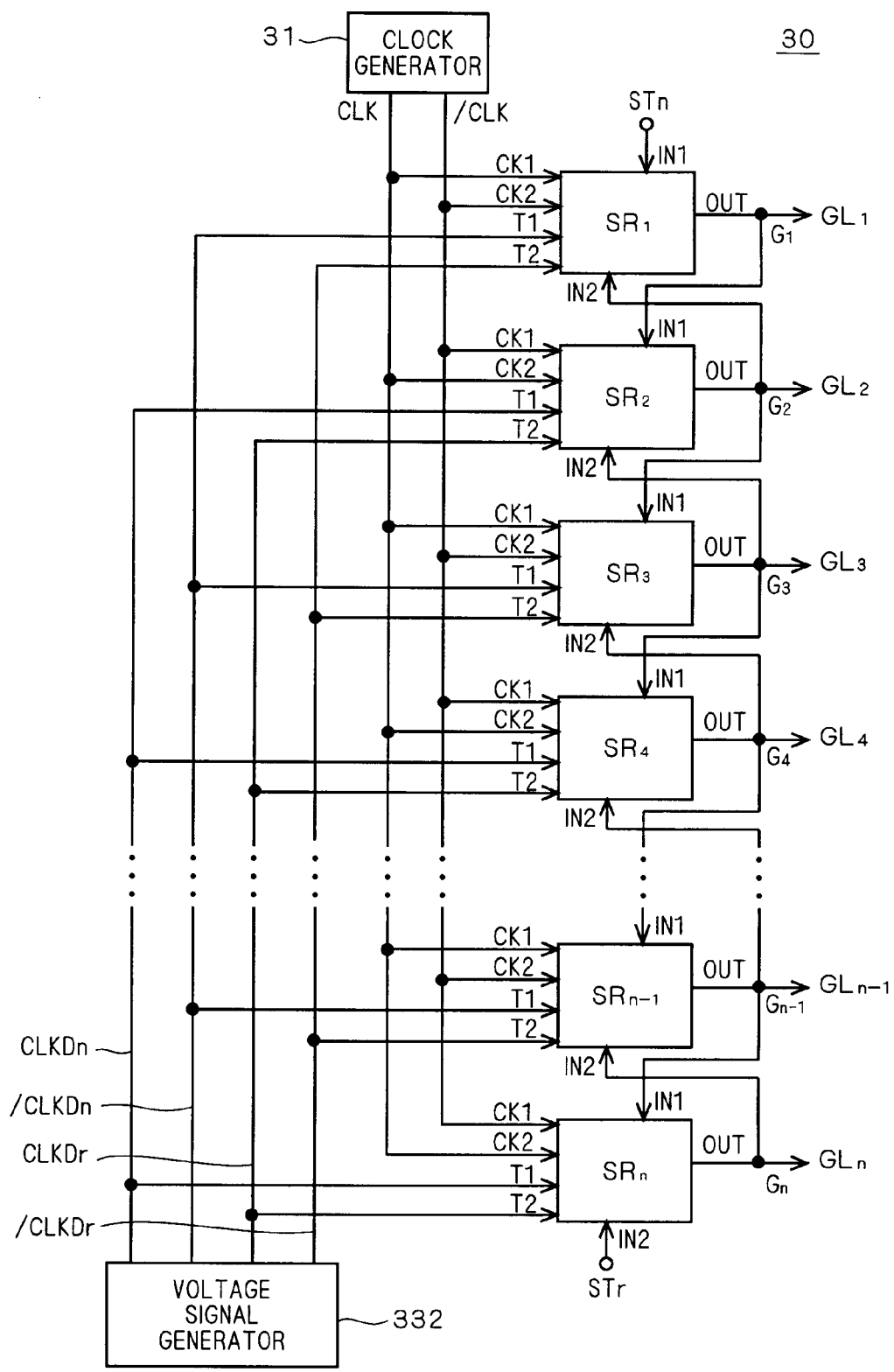
FIG. 36 is a block diagram showing a configuration of a gate line driving circuit using bidirectional unit shift registers according to a sixteenth preferred embodiment.

FIG. 36 is a block diagram showing a configuration of a gate line driving circuit 30 according to a sixteenth preferred embodiment. This preferred embodiment is such that four voltage signals CLKDn, /CLKDn, CLKDr, and /CLKDr generated by a voltage-signal generator 332 are supplied to the first and second voltage-signal terminals T1 and T2 in each unit shift register SR. Each unit shift register SR may be any one of those described in the aforementioned preferred embodiments.

Figure 37:
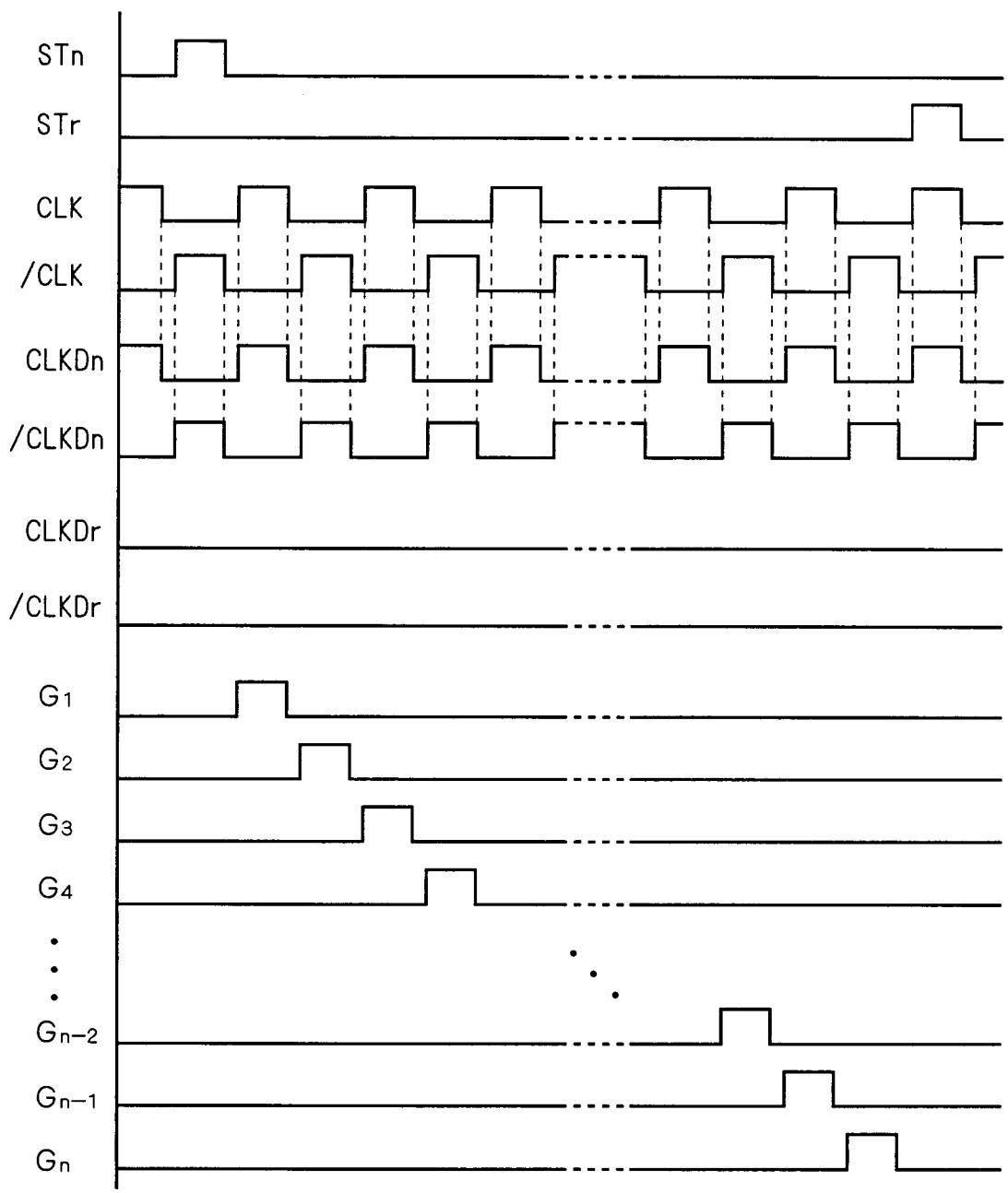
FIGS. 37 and 38 are timing charts illustrating the operations of the bidirectional unit shift registers according to the sixteenth preferred embodiment.
Figure 38:
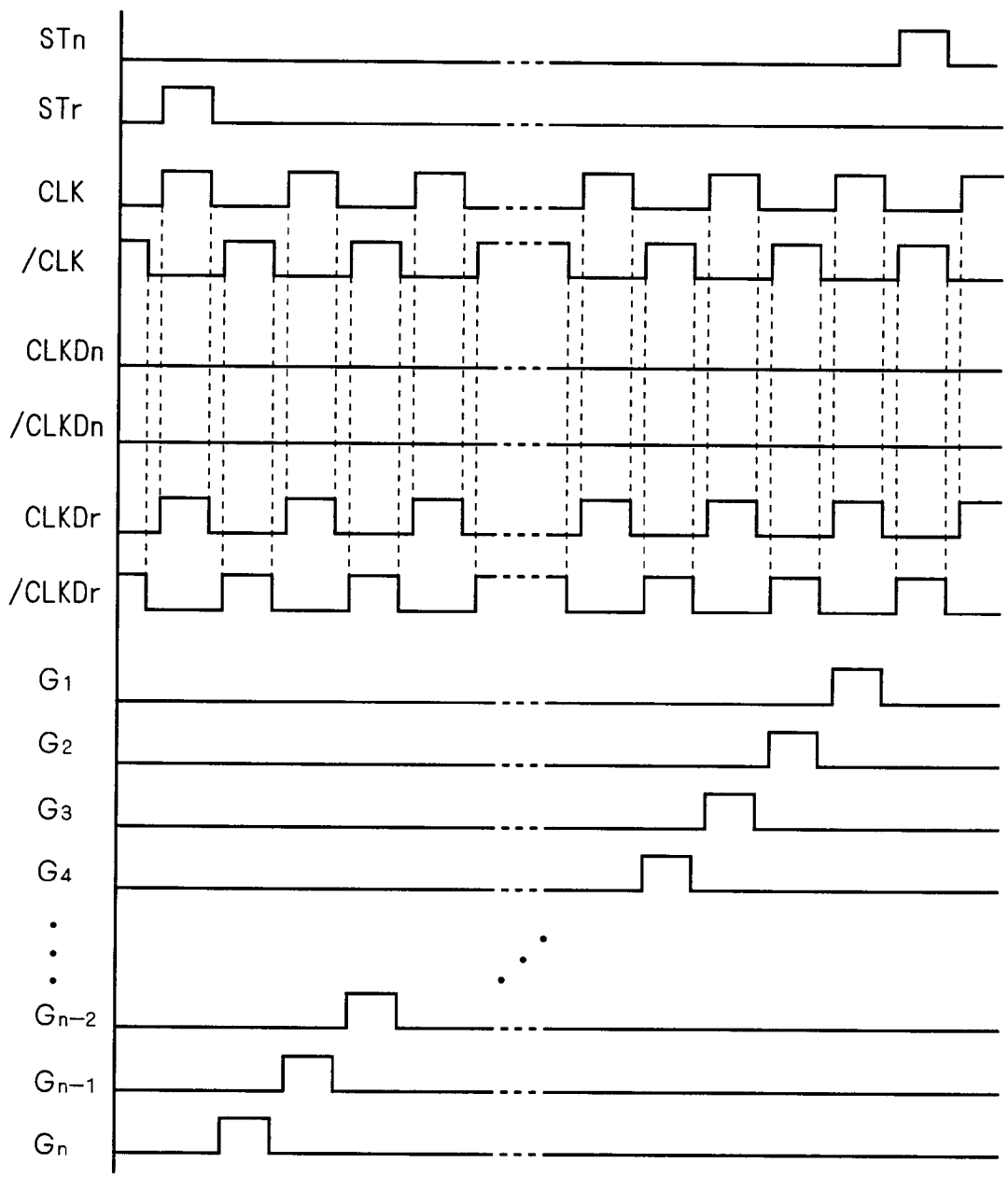

Now, the voltage signals CLKDn, /CLKDn, CLKDr, and /CLKDr will be described. FIGS. 37 and 38 are timing charts for explaining the operation of the gate line driving circuit 30 according to this preferred embodiment. FIG. 37 is for the case of a forward shift, and FIG. 38 is for the case of a backward shift.

As shown in FIGS. 37 and 38, the voltage signal CLKDn is a signal whose level changes in a similar way to a change in the level of the clock signal CLK for a forward shift and whose level is fixed at VSS for a backward shift. The voltage signal /CLKDn is a signal whose level changes in a similar way to a change in the level of the clock signal /CLK for a forward shift and whose level is fixed at VSS for a backward shift. The voltage signal CLKDr is a signal whose level is fixed at VSS for a forward shift and whose level changes in a similar way to a change in the level of the clock signal CLK for a backward shift. The voltage signal /CLKDr is a signal whose level is fixed at VSS for a forward shift and whose level changes in a similar way to a change in the level of the clock signal /CLK for a backward shift.

In this preferred embodiment, as shown in FIG. 36, at the stages where the clock signal CLK is inputted to the first clock terminal CK1 (i.e., in the unit shift registers SR$_1$, SR$_3$, . . . ), the voltage signal /CLKDn is supplied to the first voltage-signal terminal T1 and the voltage signal /CLKDr to the second voltage-signal terminal T2. At the stages where the clock signal /CLK is inputted to the first clock terminal CK1 (i.e., in the unit shift registers SR$_2$, SR$_4$, . . . ), the voltage signal CLKDn is supplied to the first voltage-signal terminal T1 and the voltage signal CLKDr to the second voltage-signal terminal T2.

By so doing, for a forward shift, each unit shift register SR operates such that the first voltage-signal terminal T1 becomes HIGH at the time when the output signal of the preceding stage is inputted to the first input terminal IN1, and the second voltage-signal terminal T2 is fixed at the LOW level.

For a backward shift, each unit shift register SR operates such that the second voltage-signal terminal T2 becomes HIGH at the time when the output signal of the subsequent stage is inputted to the second input terminal IN2, and the first voltage-signal terminal T1 is fixed at the LOW level.

Accordingly, for both forward and backward shifts, the transistors Q3 and Q4 in each unit shift register SR can charge and discharge the node N1 (the gate of the transistor Q1) in the same way as in the first preferred embodiment. Therefore, this preferred embodiment also allows forward and backward shift operations as shown in FIGS. 37 and 38.

Thus, for a forward shift, the potential at the first voltage-signal terminal T1, i.e., at the drain of the transistor Q3, is swung as in the fifteenth preferred embodiment, and the second voltage-signal terminal T2, i.e., the source of the transistor Q4, is fixed at the LOW level. For a backward shift, the potential at the second voltage-signal terminal T2, i.e., at the drain of the transistor Q4, is swung as in the fifteenth preferred embodiment, and the first voltage-signal terminal T1, i.e., the source of the transistor Q3, is fixed at the LOW level. That is, the stress of the transistors Q3 and Q4 can further be reduced than in the fifteenth preferred embodiment.

Figure 39:
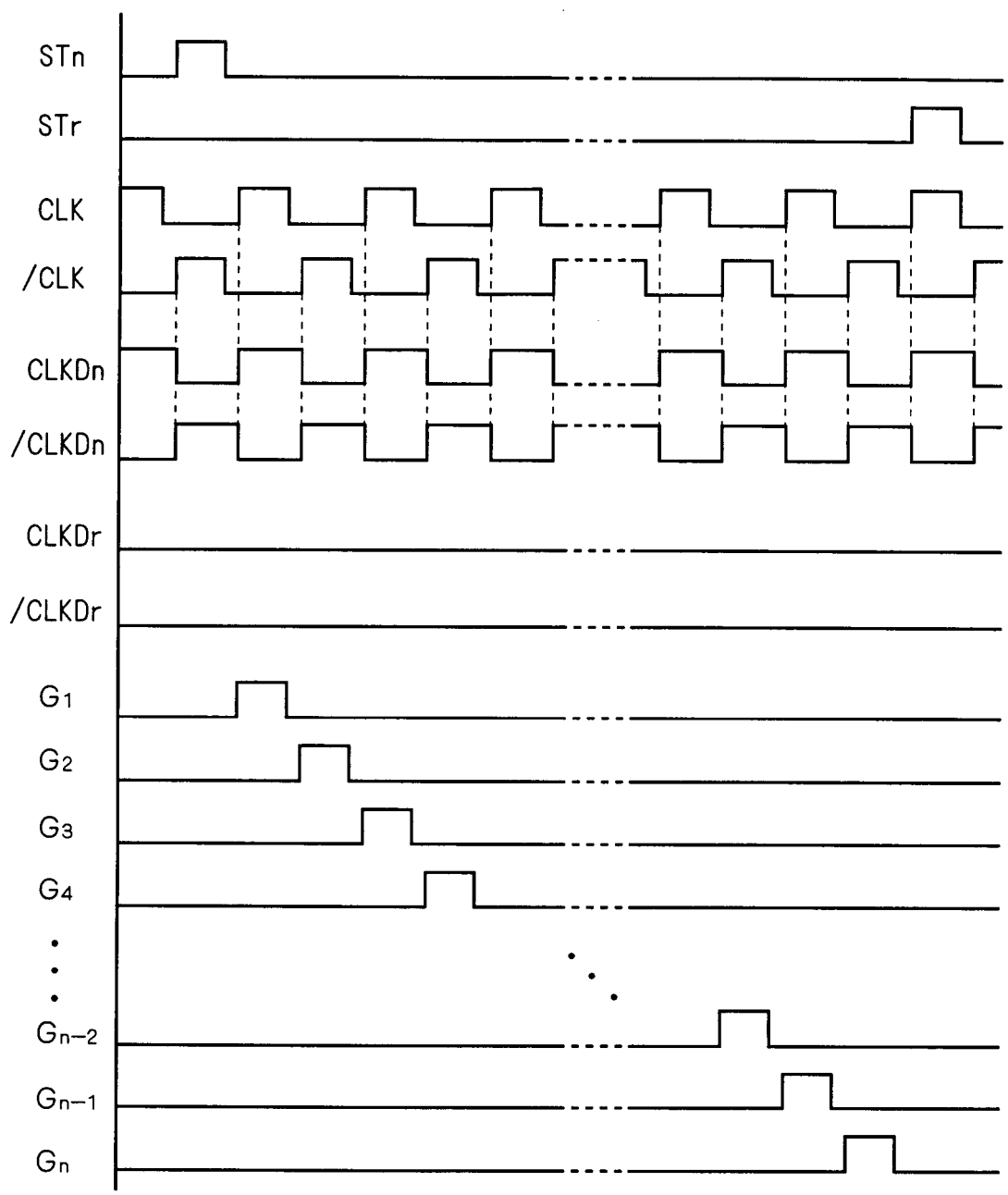
FIGS. 39 and 40 are timing charts for explaining variations of the sixteenth preferred embodiment.
Figure 40:
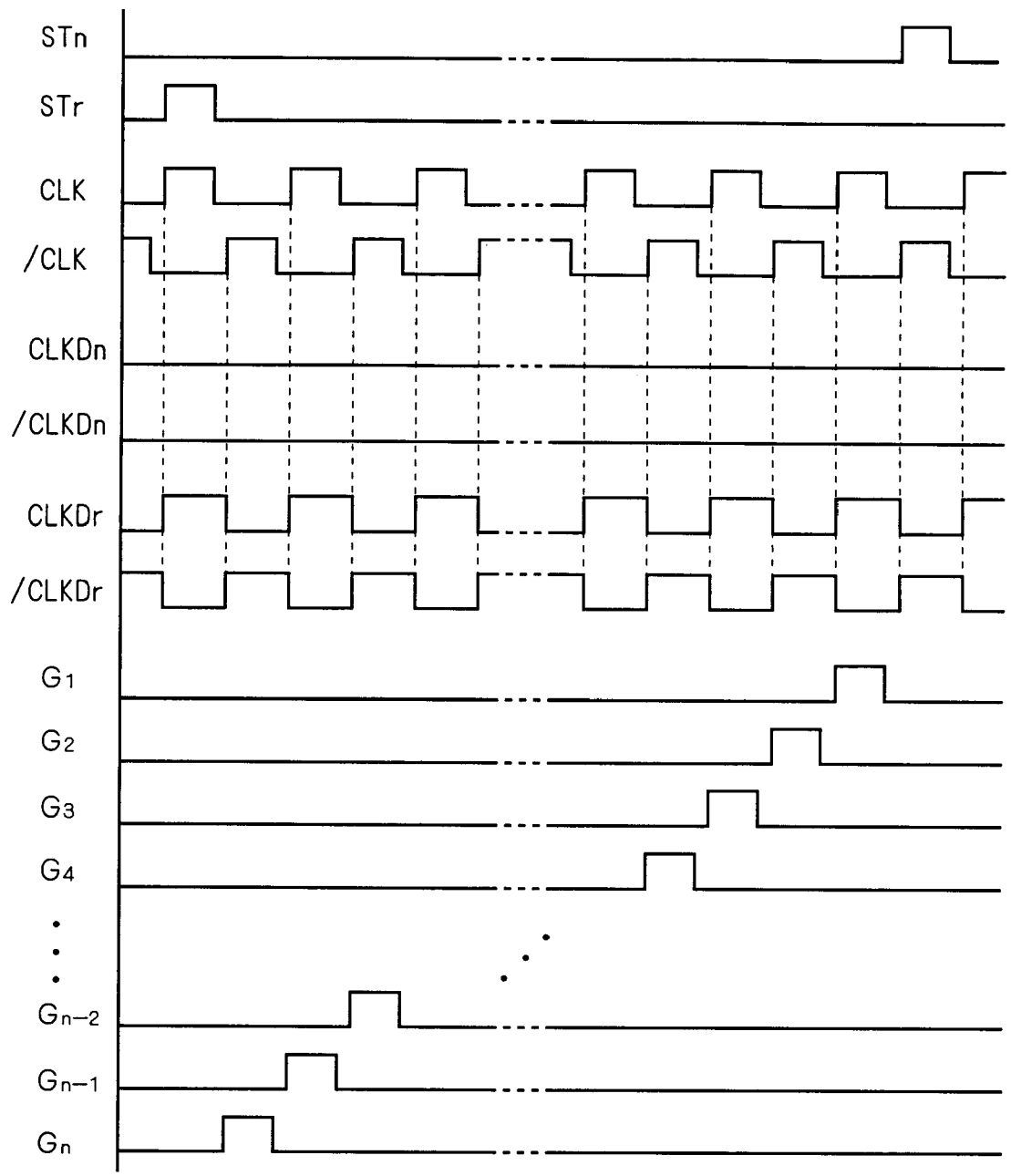

For practical application of this preferred embodiment to the gate line driving circuit 30, for a similar reason as described in the fifteenth preferred embodiment, it is desirable, as shown in FIGS. 39 and 40, to delay the timing of the fall of the voltage signals CLKDn, /CLKDn, CLKDr, and /CLKDr behind the timing of the fall of the clock signals CLK and /CLK.

FIG. 39 shows the case of a forward shift operation, in which, while the timing of the rise of the voltage signal CLKDn is simultaneous with that of the clock signal CLK, the timing of the fall of the voltage signal CLKDn is delayed behind that of the clock signal CLK (it is simultaneous with the timing of the rise of the clock signal /CLK). Similarly, while the timing of the rise of the voltage signal /CLKDn is simultaneous with that of the clock signal /CLK, the timing of the fall of the voltage signal /CLKDn is delayed behind that of the clock signal /CLK (it is simultaneous with the timing of the rise of the clock signal CLK).

On the other hand, FIG. 40 shows the case of a backward shift operation, in which, while the timing of the rise of the voltage signal CLKDr is simultaneous with that of the clock signal CLK, the timing of the fall of the voltage signal CLKDr is delayed behind that of the clock signal CLK (it is simultaneous with the timing of the rise of the clock signal /CLK). Similarly, while the timing of the rise of the voltage signal /CLKDr is simultaneous with that of the clock signal /CLK, the timing of the fall of the voltage signal /CLKDr is delayed behind that of the clock signal /CLK (it is simultaneous with the timing of the rise of the clock signal CLK).

Therefore, even if the fall of the output signal G from each unit shift register SR is delayed, the node N1 in each unit shift register SR can be charged with reliability.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
   first and second input terminals and an output terminal;
   first and second voltage-signal terminals each receiving a predetermined voltage signal;
   first and second clock terminals each receiving a clock signal with a different phase from the one inputted to the other;
   a first transistor supplying a first clock signal inputted to said first clock terminal, to said output terminal;
   a second transistor discharging said output terminal;
   a third transistor having a control electrode connected to said first input terminal and supplying a first voltage signal inputted to said first voltage-signal terminal, to a first node connected to a control electrode of said first transistor;
   a fourth transistor having a control electrode connected to said second input terminal and supplying a second voltage signal inputted to said second voltage-signal terminal, to said first node;
   a first pull-down circuit discharging said first node in response to activation of said first clock signal; and
   a second pull-down circuit discharging said first node in response to activation of a second clock signal inputted to said second clock terminal,
   discharge of said first node by said first and second pull-down circuits is performed during a period when said first node is not charged, and it is not performed during a period when said first node is charged.

2. The shift register circuit according to claim 1, wherein said first pull-down circuit includes:
   a first inverter using said first node as an input node and being activated by said first clock signal; and
   a fifth transistor discharging said first node according to the level of a second node that is an output end of said first inverter.

3. The shift register circuit according to claim 2, wherein said fifth transistor is connected between said first node and said second clock terminal.

4. The shift register circuit according to claim 2, wherein said first inverter includes:
   a first capacitive element connected between said second node and said first clock terminal; and
   a sixth transistor having a control electrode connected to said first node and discharging said second node.

5. The shift register circuit according to claim 4, wherein said first capacitive element is a MOS capacitive element formed by a transistor.

6. The shift register circuit according to claim 1, wherein said second pull-down circuit includes:
   a second inverter using said first node as an input node and being activated by said second clock signal; and
   a seventh transistor discharging said first node according to the level of a third node that is an output node of said second inverter.

7. The shift register circuit according to claim 6, wherein said seventh transistor is connected between said first node and said first clock terminal.

8. The shift register circuit according to claim 6, wherein said second inverter includes:
   a second capacitive element connected between said third node and said second clock terminal; and
   an eighth transistor having a control electrode connected to said first node and discharging said third node.

9. The shift register circuit according to claim 8, wherein said second capacitive element is a MOS capacitive element formed by a transistor.

10. The shift register circuit according to claim 6, wherein said second inverter includes:
    an eighth transistor having a control electrode connected to said second clock terminal and charging said third node;
    a ninth transistor having a control electrode connected to said first node and discharging said third node; and
    a tenth transistor having a control electrode connected to said first clock terminal and discharging said third node.

11. The shift register circuit according to claim 10, wherein said eighth transistor is connected between said second clock terminal and said third node.

12. The shift register circuit according to claim 10, wherein said eighth transistor is connected between a predetermined fourth node and said third node, and
    said second inverter further includes:
    an eleventh transistor diode-connected between said first voltage-signal terminal and said fourth node; and
    a twelfth transistor diode-connected between said second voltage-signal terminal and said fourth node.

13. The shift register circuit according to claim 10, wherein said eighth transistor is connected between a predetermined power supply terminal supplied with a predetermined potential, and said third node.

14. The shift register circuit according to claim 6, wherein said second inverter includes:
    an eighth transistor having a control electrode connected to said second clock terminal and charging said third node;
    a ninth transistor having a control electrode connected to said first node and discharging said third node; and
    a tenth transistor having a control electrode connected to said third node and being connected between said third node and said second clock terminal.

15. The shift register circuit according to claim 6, wherein said second inverter includes:
    an eighth transistor charging said third node;
    a ninth transistor having a control electrode connected to said first node and discharging said third node;
    a tenth transistor having a control electrode connected to said first clock terminal and discharging said third node;
    a second capacitive element connected between a fourth node connected to a control electrode of said eighth transistor, and said second clock terminal; and
    an eleventh transistor having a control electrode connected to said first node and discharging said fourth node.

16. The shift register circuit according to claim 15, wherein said second capacitive element is a MOS capacitive element formed by a transistor.

17. The shift register circuit according to claim 6, wherein said second inverter is a Schmitt trigger type of inverter.

18. The shift register circuit according to claim 1, wherein said second pull-down circuit includes:
    a NOR circuit using said first and second input terminals as input nodes and being activated by said second clock signal; and
    a seventh transistor discharging said first node according to the level of a third node that is an output node of said NOR circuit.

19. The shift register circuit according to claim 18, wherein said seventh transistor is connected between said first node and said first clock terminal.

20. The shift register circuit according to claim 18, wherein said NOR circuit includes:

an eighth transistor having a control electrode connected to said second clock terminal and charging said third node;
a ninth transistor having a control electrode connected to said first input terminal and discharging said third node;
a tenth transistor having a control electrode connected to said second input terminal and discharging said third node; and
an eleventh transistor having a control electrode connected to said first clock terminal and discharging said third node.

21. The shift register circuit according to claim 20, wherein said eighth transistor is connected between said second clock terminal and said third node.

22. The shift register circuit according to claim 20, wherein said eighth transistor is connected between a predetermined fourth node and said third node, and
said NOR circuit further includes:
a twelfth transistor diode-connected between said first voltage-signal terminal and said fourth node; and
a thirteenth transistor diode-connected between said second voltage-signal terminal and said fourth node.

23. The shift register circuit according to claim 20, wherein said eighth transistor is connected between a predetermined power supply terminal supplied with a predetermined potential, and said third node.

24. The shift register circuit according to claim 18, wherein said NOR circuit includes:
an eighth transistor having a control electrode connected to said second clock terminal and charging said third node;
a ninth transistor having a control electrode connected to said first input terminal and discharging said third node;
a tenth transistor having a control electrode connected to said second input terminal and discharging said third node; and
an eleventh transistor having a control electrode connected to said third node and being connected between said third node and said second clock terminal.

25. The shift register circuit according to claim 18, wherein said NOR circuit includes:
an eighth transistor charging said third node;
a ninth transistor having a control electrode connected to said first input terminal and discharging said third node;
a tenth transistor having a control electrode connected to said second input terminal and discharging said third node;
an eleventh transistor having a control electrode connected to said first clock terminal and discharging said third node;
a second capacitive element connected between a fourth node connected to a control electrode of said eighth transistor, and said second clock terminal;
a twelfth transistor having a control electrode connected to said first input terminal and discharging said fourth node; and
a thirteenth transistor having a control electrode connected to said second input terminal and discharging said fourth node.

26. The shift register circuit according to claim 25, wherein said second capacitive element is a MOS capacitive element formed by a transistor.

27. The shift register circuit according to claim 18, wherein said NOR circuit is a Schmitt trigger type of inverter.

28. The shift register circuit according to claim 1, wherein said second transistor has a control electrode connected to said second node.

29. The shift register circuit according to claim 28, wherein said second transistor is connected between said output terminal and said second clock terminal.

30. The shift register circuit according to claim 1, wherein said second transistor has a control electrode connected to said second clock terminal.

31. The shift register circuit according to claim 30, wherein said second transistor is connected between said output terminal and said first clock terminal.

32. The shift register circuit according to claim 1, further comprising:
a third capacitive element connected between said first node and said output terminal.

33. The shift register circuit according to claim 32, wherein said third capacitive element is a MOS capacitive element formed by a transistor.

34. The shift register circuit according to claim 1, wherein said first and second voltage signals are complementary to each other.

35. The shift register circuit according to claim 1, wherein the level of one of said first and second voltage signals changes in a similar way to a change in the level of said first clock signal, and
the level of the other of said first and second voltage signals changes in a similar way to a change in the level of said second clock signal.

36. The shift register circuit according to claim 35, wherein said one of said first and second voltage signals is controlled so that the timing of its fall is delayed behind that of said first clock terminal, and
said the other of said first and second voltage signals is controlled so that the timing of its fall is delayed behind that of said second clock terminal.

37. The shift register circuit according to claim 1, wherein the level of one of said first and second voltage signals changes in a similar way to a change in the level of said second clock signal, and
the level of the other of said first and second voltage signals is maintained inactive.

38. The shift register circuit according to claim 37, wherein said one of said first and second voltage signals is controlled so that the timing of its fall is delayed behind that of said second clock terminal.

39. A shift register circuit which is a multi-stage shift register circuit including
a plurality of shift register circuits connected in cascade,
each stage of said multi-stage shift register circuit is the shift register circuit according to claim 1, wherein in said each stage,
said output terminal is connected to a first input terminal of its subsequent stage and a second input terminal of its previous stage.

40. The shift register circuit according to claim 1, further comprising:
a carry-signal output terminal provided separately from said output terminal;
a fourteenth transistor having a control electrode connected to said first node and supplying said first clock signal to said carry-signal output terminal; and
a fifteenth transistor having a control electrode connected to a control electrode of said second transistor and discharging said carry-signal output terminal.

41. An image display apparatus comprising, as a gate line driving circuit, a multi-stage shift register circuit including a plurality of shift register circuits connected in cascade,
each stage of said multi-stage shift register circuit including:

first and second input terminals and an output terminal;

first and second voltage-signal terminals each receiving a predetermined voltage signal;

first and second clock terminals each receiving a clock signal having a different phase from the one inputted to the other;

a first transistor supplying a first clock signal inputted to said first clock terminal, to said output terminal;

a second transistor discharging said output terminal;

a third transistor having a control electrode connected to said first input terminal and supplying a first voltage signal inputted to said first voltage-signal terminal to a first node connected to a control electrode of said first transistor;

a fourth transistor having a control electrode connected to said second input terminal and supplying a second voltage signal inputted to said second voltage-signal terminal to said first node;

a first pull-down circuit discharging said first node in response to activation of said first clock signal; and a second pull-down circuit discharging said first node in response to activation of a second clock signal inputted to said second clock terminal, wherein discharge of said first node by said first and second pull-down circuits is performed during a period when said first node is not charged, and it is not performed during a period when said first node is charged, and wherein, in said each stage, said output terminal is connected to a first terminal of its subsequent stage and a second input terminal of its previous stage.

42. An image display apparatus comprising, as a gate line driving circuit, a multi-stage shift register circuit including a plurality of shift register circuits connected in cascade, each stage of said multi-stage shift register circuit including:

first and second input terminals and an output terminal;

first and second voltage-signal terminals each receiving a predetermined voltage signal;

first and second clock terminals each receiving a clock signal having a different phase from the one inputted to the other;

a first transistor supplying a first clock signal inputted to said first clock terminal to said output terminal;

a second transistor discharging said output terminal;

a third transistor having a control electrode connected to said first input terminal and supplying a first voltage signal inputted to said first voltage-signal terminal to a first node connected to a control electrode of said first transistor;

a fourth transistor having a control electrode connected to said second input terminal and supplying a second voltage signal inputted to said second voltage-signal terminal to said first node;

a first pull-down circuit discharging said first node in response to activation of said first clock signal;

a second pull-down circuit discharging said first node in response to activation of a second clock signal inputted to said second clock terminal;

a carry-signal output terminal provided separately from said output terminal;

a fifth transistor having a control electrode connected to said first node and supplying said first clock signal to said carry-signal output terminal; and a sixth transistor having a control electrode connected to a control electrode of said second transistor and discharging said carry-signal output terminal, wherein discharge of said first node by said first and second pull-down circuits is performed during a period when said first node is not charged, and it is not performed during a period when said first node is charged, and wherein, in said each stage, said output terminal is connected to a gate line of a display panel, and said carry-signal output terminal is connected to a first input terminal of its subsequent stage and a second input terminal of its previous stage.

* * * * *